(12) United States Patent
Yabuta et al.

(10) Patent No.: US 10,727,395 B2
(45) Date of Patent: Jul. 28, 2020

(54) PIEZOELETRIC MATERIAL, PIEZOELECTRIC ELEMENT, LIQUID DISCHARGE HEAD, LIQUID DISCHARGE APPARATUS, VIBRATION WAVE MOTOR, OPTICAL INSTRUMENT, VIBRATION APPARATUS, DUST REMOVING APPARATUS, IMAGING APPARATUS AND ELECTRONIC DEVICE

(71) Applicant: CANON KABUSHIKI KAISHA, Tokyo (JP)

(72) Inventors: Hisato Yabuta, Machida (JP); Toshihiro Ifuku, Yokohama (JP); Takanori Matsuda, Chofu (JP); Takayuki Watanabe, Yokohama (JP); Makoto Kubota, Yokohama (JP); Tatsuo Furuta, Machida (JP); Hidenori Tanaka, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 274 days.

(21) Appl. No.: 15/625,209

(22) Filed: Jun. 16, 2017

(65) Prior Publication Data

US 2017/0373244 A1 Dec. 28, 2017

(30) Foreign Application Priority Data

Jun. 28, 2016 (JP) .................................. 2016-127872
Jun. 9, 2017 (JP) .................................. 2017-114336

(51) Int. Cl.
| | | |
|---|---|---|
| *H01L 41/187* | (2006.01) | |
| *H01L 41/047* | (2006.01) | |
| *H02N 2/10* | (2006.01) | |
| *C04B 35/475* | (2006.01) | |
| *C04B 35/626* | (2006.01) | |
| *C04B 35/634* | (2006.01) | |
| *C04B 35/64* | (2006.01) | |
| *B41J 2/14* | (2006.01) | |
| *G02B 7/14* | (2006.01) | |
| *G02B 7/09* | (2006.01) | |
| *G02B 27/00* | (2006.01) | |
| *H04R 17/00* | (2006.01) | |
| *H04N 5/225* | (2006.01) | |
| *B08B 7/02* | (2006.01) | |
| *H04N 5/217* | (2011.01) | |
| *C04B 35/468* | (2006.01) | |
| *B32B 18/00* | (2006.01) | |

(Continued)

(52) U.S. Cl.
CPC .............. *H01L 41/187* (2013.01); *B08B 7/02* (2013.01); *B32B 18/00* (2013.01); *B41J 2/14233* (2013.01); *C04B 35/4682* (2013.01); *C04B 35/475* (2013.01); *C04B 35/6261* (2013.01); *C04B 35/6264* (2013.01); *C04B 35/62655* (2013.01); *C04B 35/6342* (2013.01); *C04B 35/63416* (2013.01); *C04B 35/64* (2013.01); *G02B 7/09* (2013.01); *G02B 7/14* (2013.01); *G02B 27/0006* (2013.01); *H01L 41/047* (2013.01); *H01L 41/1871* (2013.01); *H02N 2/10* (2013.01); *H04N 5/2171* (2013.01); *H04N 5/2254* (2013.01); *H04R 17/00* (2013.01); *C04B 2235/3208* (2013.01); *C04B 2235/3213* (2013.01); *C04B 2235/3215* (2013.01); *C04B 2235/3227* (2013.01); *C04B 2235/3236* (2013.01); *C04B 2235/3249* (2013.01); *C04B 2235/3267* (2013.01); *C04B 2235/3268* (2013.01); *C04B 2235/3293* (2013.01); *C04B 2235/3298* (2013.01); *C04B 2235/604* (2013.01); *C04B 2235/6567* (2013.01); *C04B 2235/72* (2013.01); *C04B 2235/761* (2013.01); *C04B 2235/96* (2013.01); *C04B 2237/346* (2013.01); *C04B 2237/68* (2013.01); *G02B 7/08* (2013.01); *H01L 41/09* (2013.01)

(58) Field of Classification Search
CPC .............. H01L 41/1871; C04B 35/4682; B41J 2/14233
See application file for complete search history.

(56) References Cited

U.S. PATENT DOCUMENTS

| | | |
|---|---|---|
| 7,944,126 B2 | 5/2011 | Tanaka et al. |
| 8,034,250 B2 | 10/2011 | Hayashi et al. |
| 8,518,290 B2 | 8/2013 | Watanabe et al. |

(Continued)

FOREIGN PATENT DOCUMENTS

JP 5217997 B2 6/2013

*Primary Examiner* — C Melissa Koslow
(74) *Attorney, Agent, or Firm* — Venable LLP

(57) ABSTRACT

A piezoelectric material including a perovskite-type metal oxide represented by the following general formula (1); Bi; and Mn, wherein the content of Bi is 0.1-0.5 mol % with respect to 1 mol of the metal oxide, the content of Mn is 0.3-1.5 mol % with respect to 1 mol of the metal oxide, and the piezoelectric material satisfies $(L_4-L_5)/L_5 \geq 0.05$ and $(L_8-L_9)/L_9 \geq 0.05$ when the lengths of twelve Bi—O bonds with Bi that is located at a 12-fold site with respect to O in a perovskite-type unit cell as a starting point are taken to be $L_1$ to $L_{12}$ in length order:

$$(Ba_{1-x}M1_x)(Ti_{1-y}M2_y)O_3 \quad (1)$$

wherein $0 \leq x \leq 0.2$, $0 \leq y \leq 0.1$, and M1 and M2 are mutually different metal elements which have a total valence of +6 and are selected from other elements than Ba, Ti, Bi and Mn.

16 Claims, 18 Drawing Sheets

(51) Int. Cl.
*H01L 41/09* (2006.01)
*G02B 7/08* (2006.01)

(56) References Cited

U.S. PATENT DOCUMENTS

| | | |
|---|---|---|
| 8,547,001 B2 | 10/2013 | Saito et al. |
| 8,632,723 B2 | 1/2014 | Watanabe et al. |
| 8,698,380 B2 | 4/2014 | Watanabe et al. |
| 8,955,947 B2 | 2/2015 | Watanabe et al. |
| 8,980,117 B2 | 3/2015 | Kubota et al. |
| 9,022,531 B2 | 5/2015 | Kubota et al. |
| 9,082,975 B2 | 7/2015 | Kubota et al. |
| 9,306,149 B2 | 4/2016 | Hayashi et al. |
| 10,424,722 B2 * | 9/2019 | Matsuda ............... H04N 5/2328 |
| 2017/0155034 A1 | 6/2017 | Matsuda et al. |
| 2017/0155035 A1 * | 6/2017 | Matsuda ................. B06B 1/06 |
| 2017/0155036 A1 | 6/2017 | Kubota et al. |
| 2017/0155037 A1 | 6/2017 | Kubota et al. |
| 2017/0373244 A1 * | 12/2017 | Yabuta .................. H01L 41/187 |

\* cited by examiner

PIEZOELECTRIC MATERIAL, PIEZOELECTRIC ELEMENT, LIQUID DISCHARGE HEAD, LIQUID DISCHARGE APPARATUS, VIBRATION WAVE MOTOR, OPTICAL INSTRUMENT, VIBRATION APPARATUS, DUST REMOVING APPARATUS, IMAGING APPARATUS AND ELECTRONIC DEVICE

BACKGROUND OF THE INVENTION

Field of the Invention

The present invention relates to a piezoelectric material, particularly, to a piezoelectric material containing no lead. In addition, the present invention relates to a piezoelectric element, a liquid discharge head, a liquid discharge apparatus, a vibration wave motor, an optical instrument, a vibration apparatus, a dust removing apparatus, an imaging apparatus and an electronic device using the above-described piezoelectric material.

Description of the Related Art

A perovskite-type metal oxide with a formula $ABO_3$ such as lead zirconate titanate containing lead (hereinafter referred to as "PZT") is a representative piezoelectric material and is used in various piezoelectric devices such as an actuator, an oscillator, a sensor and a filter. However, since PZT contains lead as the A-site element, an influence on environment, such as a possibility that a lead component in a waste piezoelectric material may be dissolved out into the soil to cause damage to the ecosystem, becomes a problem.

Therefore, a piezoelectric material using a perovskite-type metal oxide containing no lead is variously investigated.

For example, barium titanate is known as a piezoelectric material of the perovskite-type metal oxide containing no lead. However, the piezoelectric properties of the piezoelectric material using barium titanate, particularly, the piezoelectric constant and the mechanical quality factor are insufficient compared with those of PZT, which has been a problem.

Japanese Patent No. 5217997 discloses a piezoelectric material in which Mn, Fe or Cu is added into a material obtaining by replacing a part of the A site of barium titanate by Ca, thereby forming an oxygen vacancy, and the mechanical quality factor thereof is improved by pinning a ferroelectric domain.

However, if the addition amount of an additive such as Mn is increased, the piezoelectric constant is lowered, or the dielectric loss is increased, so that there have been limits on improvements in piezoelectric properties by this method, particularly, on attainments of both high piezoelectric constant and high mechanical quality factor. For example, it has been difficult to attain both piezoelectric constant $d_{31} \geq 100$ pm/V and mechanical quality factor $Q_m \geq 2{,}000$ in a room temperature environment.

The present invention has been made for solving such problems, and an object thereof is to provide a piezoelectric material which has a small environmental burden and attains both high piezoelectric constant and high mechanical quality factor.

In addition, another object of the present invention is to provide a piezoelectric element, a liquid discharge head, a liquid discharge apparatus, a vibration wave motor, an optical instrument, a vibration apparatus, a dust removing apparatus, an imaging apparatus and an electronic device using the above-described piezoelectric material.

SUMMARY OF THE INVENTION

The piezoelectric material according to the present invention for solving the above problems is a piezoelectric material including:
a perovskite-type metal oxide represented by the following general formula (1);
Bi; and
Mn,
wherein a content of the Bi is 0.1 mol % or more to 0.5 mol % or less with respect to 1 mol of the metal oxide,
wherein a content of the Mn is 0.3 mol % or more to 1.5 mol % or less with respect to 1 mol of the metal oxide, and
wherein the piezoelectric material satisfies $(L_4-L_5)/L_5 \geq 0.05$ and $(L_8-L_9)/L_9 \geq 0.05$ when the lengths of twelve Bi—O bonds with Bi that is located at a 12-fold site with respect to O in a perovskite-type unit cell as a starting point are taken to be $L_1$ to $L_{12}$ in length order:

$$(Ba_{1-x}M1_x)(Ti_{1-y}M2_y)O_3 \tag{1}$$

wherein $0 \leq x \leq 0.2$, $0 \leq y \leq 0.1$, and M1 and M2 are mutually different metal elements which have a total valence of +6 and are selected from other elements than Ba, Ti, Bi and Mn.

Further features of the present invention will become apparent from the following description of exemplary embodiments with reference to the attached drawings.

DESCRIPTION OF THE EMBODIMENTS

Figure 1:
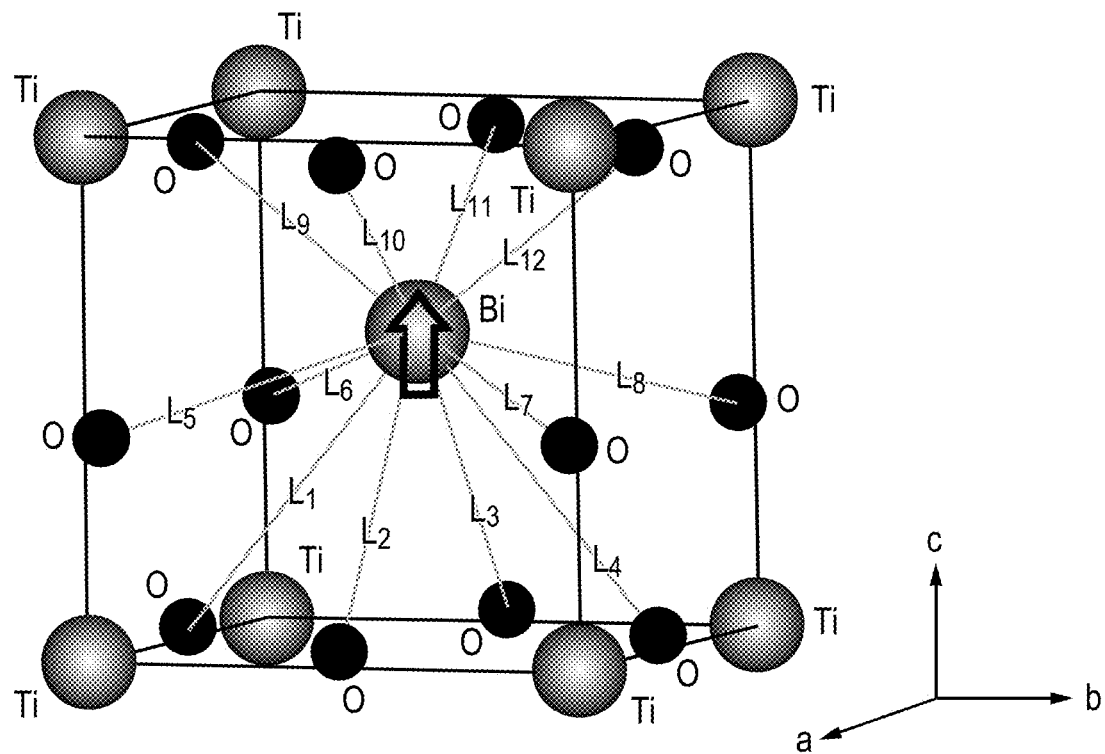
FIG. 1 is a schematic view illustrating the positional relation between a Bi atom introduced into a crystal lattice constituting a piezoelectric material according to the present invention and a series of atoms coordinated around it.

Preferred embodiments of the present invention will now be described in detail in accordance with the accompanying drawings.

The piezoelectric material according to the present invention is a piezoelectric material including:
a perovskite-type metal oxide represented by the following general formula (1);
Bi; and
Mn,
wherein a content of the Bi is 0.1 mol % or more to 0.5 mol % or less with respect to 1 mol of the metal oxide,
wherein a content of the Mn is 0.3 mol % or more to 1.5 mol % or less with respect to 1 mol of the metal oxide, and
wherein the piezoelectric material satisfies $(L_4-L_5)/L_5 \geq 0.05$ and $(L_8-L_9)/L_9 \geq 0.05$ when the lengths of twelve Bi—O bonds with Bi that is located at a 12-fold site with respect to O in a perovskite-type unit cell as a starting point are taken to be $L_1$ to $L_{12}$ in length order:

$$(Ba_{1-x}M1_x)(Ti_{1-y}M2_y)O_3 \qquad (1)$$

wherein $0 \leq x \leq 0.2$, $0 \leq y \leq 0.1$, and M1 and M2 are mutually different metal elements which have a total valence of +6 and are selected from other elements than Ba, Ti, Bi and Mn.

Perovskite-Type Structure:

A metal oxide having a perovskite-type structure is generally represented by a chemical formula of $ABO_3$. In the perovskite-type metal oxide, the elements A and B (referred to as A element and B element, respectively) respectively occupy specific positions of a unit cell, which are referred to as an A site and a B site, in the form of their respective ions. In the case of, for example, a unit cell of a cubic crystal structure, when taking the A element to be vertex of a cube, the B element is located in a body center, and the O element occupies a face center position of the cube as a negative oxygen ion. The unit cell is distorted in the [001], [011] or [111] direction of the cubic unit cell, whereby the lattice becomes a crystal lattice of a tetragonal, orthorhombic or rhombohedral perovskite-type structure. In these crystal lattices of the perovskite-type structure represented by the chemical formula $ABO_3$, a first nearest neighbor element around the A element is the O element, and twelve O elements are coordinated around the A element. In addition, a second nearest neighbor element around the A element is the B element, and eight B elements are coordinated around the A element. On the other hand, a first nearest neighbor element around the B element is the O element likewise, and six O elements are coordinated around the B element. A second nearest neighbor element around the B element is the A element, and eight A elements are coordinated around the B element.

The above general formula (1) is a chemical formula of a metal oxide having a perovskite-type structure, $(Ba_{1-x}M1_x)$ corresponds to the A element, and $(Ti_{1-y}M2_y)$ corresponds to the B element. When x is zero and y is zero, the general formula (1) is $BaTiO_3$ and represents barium titanate. It is known that barium titanate has a tetragonal perovskite-type structure, Ba occupies an A site which is a 12-fold oxygen coordination site, and Ti occupies a B site which is a 6-fold oxygen coordination site. In other words, the Ba atom forms Ba—O bonds with twelve O atoms which are located around the Ba, and the Ti atom forms Ti—O bonds with six O atoms which are located around the Ti. The metal element M1 may replace a part of Ba to be located at the A site. However, the allowable proportion of the replacement is 20% or less of the whole A-site element. In other words, the range of x is 0 or more to 0.2 or less with respect to the A element $(Ba_{1-x}M1_x)$. Similarly, M2 may replace a part of Ti to be located at the B site, and the proportion of the replacement is 10% or less of the whole B-site element. In other words, the range of y is 0 or more to 0.1 or less with respect to the B element ($Ti_{1-y}M2_y$). If M1 and M2 replace over 20% of the A-site element and 10% of the B-site element, respectively, such an oxide greatly deviates from the nature of $BaTiO_3$, and so desired piezoelectric properties cannot be attained. For example, deterioration of the properties caused by lowering of the piezoelectric constant, lowering of the Curie temperature, or the like owing to the large amount replacement may occur.

The metal elements M1 and M2 are selected from other elements than Ba and Ti. In addition, Bi and Mn which are first and second subcomponents described later are not included in selections for M1 and M2, either. M1 and M2 are selected from such combinations that the sum total of the valence of M1 and the valence of M2 is positive hexavalent like the combination of Ba and Ti. Regarding the combination, M1 may be positive monovalent and M2 may be positive pentavalent, or M1 may be positive trivalent, and M2 may be positive trivalent. However, such a combination that M1 is positive divalent and M2 is positive tetravalent is particularly desirable like the combination of Ba and Ti. Among others, such a combination that M1 is at least one of positive divalent Sr and Ca and M2 is at least one of positive tetravalent Hf, Sn and Zr is particularly desirable.

However, parts of Ba and M1 may be located at the B site. Similarly, parts of Ti and M2 may be located at the A site.

The molar ratio of the B-site element to the O element in the general formula (1) is 1 to 3. However, even when the element amount ratio somewhat deviates, such a metal oxide is included in the scope of the present invention so long as the metal oxide has a perovskite-type structure as a main phase.

A piezoelectric material composed of the perovskite-type metal oxide represented by the general formula (1) generally exhibits a high piezoelectric constant (for example, $d_{31}$ piezoelectric constant). However, its mechanical quality factor $Q_m$ does not reach a desired value, and so the piezoelectric property of such a piezoelectric material has been insufficient. Thus, it has been led to devise a new piezoelectric material which has both high piezoelectric constant and high mechanical quality factor $Q_m$ in combination by adding a first subcomponent composed of Bi and a second subcomponent composed of Mn into the piezoelectric material represented by the general formula (1).

Piezoelectric Constant and Mechanical Quality Factor:

The piezoelectric constant referred to here is a quality indicating the degree of displacement (extension, contraction, shearing) of a piezoelectric material when a voltage is applied to the piezoelectric material. For example, the $d_{31}$ piezoelectric constant is a proportional coefficient of voltage to contraction (extension) displacement in a direction perpendicular to a polarization direction when voltage is applied to a macroscopic polarization direction (ordinarily, direction to which voltage is applied when conducting a polarization processing) of a piezoelectric material, that is, displacement per unit voltage. Conversely, it may also be defined as a charge quantity induced when applying stress to the material. In addition, the mechanical quality factor referred to here is a factor indicating an elastic loss due to vibration when evaluating the piezoelectric material as a vibrator. Energy lost upon vibration is smaller as the mechanical quality factor is higher. The piezoelectric constant and mechanical quality factor of the piezoelectric material can be found by calculation based on Standard of Japan Electronics and Information Technology Industries Association (JEITA EM-4501) from measured results of a resonance frequency and an antiresonant frequency which are obtained by using a commercially available impedance analyzer. Hereinafter, this method is referred to as a resonance-antiresonance method. The piezoelectric constant can also be found by directly measuring a displacement upon application of a voltage or a charge quantity induced upon application of a stress.

Effect of Lone Electron Pair of Bi:

The valence of Bi may take a positive trivalence or a positive pentavalence in an oxide thereof, and the positive trivalent Bi has such a feature that a 6 s lone electron pair is present. It is known that the presence of this lone electron pair may cause steric hindrance in a coordination environment between Bi and atoms surrounding it. In other words, in such circumstances that Bi is surrounded by elements of the same kind, Bi is not present at a centrosymmetric position, but is often present at a biased position. Therefore, a compound containing positive trivalent Bi as a main component (particular, metal oxide) does not take a crystal structure having high symmetry, such as a cubic, but often takes a distorted crystal structure. A typical example thereof is $BiFeO_3$, and it is known that although its structure is originally a perovskite-type structure which is easy to take a cubic crystal structure or a crystal structure close thereto, it takes a rhombohedral perovskite-type structure greatly distorted in the [111] direction of the cubic lattice in a wide temperature range. When Bi is slightly added into a compound which does not contain Bi as a main component (particularly, metal oxide) to replace a part of a main component element, Bi may be present at a position shifted from an original atom position while replacing the original main component element owing to this nature of the lone electron pair of Bi. This causes bias of the coordination environment with respect to the atoms surrounding Bi to generate a local electric polarization around Bi. When the compound of the main component is a ferroelectric material having a spontaneous polarization, this local electric polarization around Bi and the spontaneous polarization of the ferroelectric material interact. In particular, the local electric polarization acts so as to reinforce the macroscopic spontaneous polarization, whereby the polarization state of the ferroelectric material is stabilized.

Barium titanate $BaTiO_3$ is a ferroelectric material having a tetragonal perovskite-type structure slightly distorted in the c-axis direction and is a piezoelectric material exhibiting piezoelectricity originating in the spontaneous polarization thereof. The piezoelectric material which is such a ferroelectric material is utilized as a piezoelectric material after the piezoelectricity thereof is developed by conducting a processing of uniformizing the polarization direction by application of a high voltage (polarization processing) to improve the piezoelectric constant. When the piezoelectric material subjected to the polarization processing is used as a piezoelectric element, a voltage for driving the piezoelectric element is adequately low compared with the voltage applied upon the polarization processing, so that the magnitude of the macroscopic polarization of the piezoelectric material is scarcely changed by the driving of the piezoelectric element. When the polarization state of the piezoelectric element is microscopically observed, the interior of the piezoelectric material is composed of domains of different polarization directions, the domains being partitioned by a domain wall and present adjacently to each other. In the case of tetragonal $BaTiO_3$, a domain in which polarization directions perpendicularly intersect (90° domain) and a domain in which polarization directions are antiparallel (180° domain) are present adjacently to each other. The magnitude of the macroscopic polarization is a spatial average of polarizations of the respective domains, and such a feature that the magnitude of the macroscopic polarization is not changed by the driving of the piezoelectric element means that the distribution of the domains and the magnitude of the polarization within each domain are not changed. However, the domain wall can be slightly moved by applying a drive voltage. When the drive voltage is an alternating current voltage, the domain wall comes to vibrate. This vibration of the domain wall causes an elastic loss to incur lowering of the mechanical quality factor of the piezoelectric material. As a method for obtaining a high mechanical quality factor, there is mentioned a method of providing a mechanism of suppressing the movement (vibration) of the domain wall through voltage application by making the domain wall hard to move. Since the movement of the domain wall is based on inversion (or rotation) of a microscopic spontaneous polarization of a lattice located in the vicinity of the domain wall, a method of suppressing the movement of the domain wall is to provide a stable polarization which can prevent inversion of the microscopic spontaneous polarization in the vicinity of the domain wall. Since the above-described local electric polarization around Bi is attributable to the bias of the position of the Bi atom from the centrosymmetric position caused by the lone electron pair, this local electric polarization cannot be easily inverted or rotated by voltage application. Accordingly, if this can be introduced into the vicinity of the domain wall of the piezoelectric material containing $BaTiO_3$ as a main component, the movement of the domain wall due to the application of the drive voltage can be suppressed. In addition, this local electric polarization interacts with the original spontaneous polarization of the piezoelectric material containing $BaTiO_3$ as a main component, which is present in a neighboring lattice, to stabilize a surrounding polarization state, that is, to make the domain wall hard to move, so that it is expected to more suppress the movement of the domain wall. As a result of these technical features, the improvement in mechanical quality factor can be realized. It has been led to provide the piezoelectric material according to the present invention on the basis of this mechanism.

When Bi is slightly added into a metal oxide containing $BaTiO_3$ as a main component, most of Bi replaces a Ba site (A site) as positive trivalent Bi, as can be seen from comparison of ionic radii of the respective elements. The valence and site of Bi can be identified by measurement of an X-ray absorption fine structure (XAFS). In particular, an X-ray absorption near edge structure (XANES) spectrum among XAFS spectra is compared with the measurement data of a reference material whose valence and structure are already known, whereby the valence can be estimated. A site in which Bi is present can also be inferred by a comparative analysis of the XANES spectrum with the reference material. However, an extended X-ray absorption fine structure (EXAFS) located in a higher energy side than the XANES region of the XAFS spectra is analyzed, whereby the site in which Bi is present can be identified, and information of a coordination environment around Bi, particularly, of bond lengths between Bi and coordinating atoms and the number thereof (coordination number) can be further obtained. The XAFS measurement is desirably conducted by using high-brightness X-rays and in the synchrotron radiation facility such as SPring-8. In addition, powder X-ray diffraction measurement is desirably performed in parallel even for confirming change in average structure of the crystal lattice (for example, lattice constant) by the addition to compare with change in local structure obtained by the XAFS. At this time, the measurement is desirably conducted by using short-wavelength X-rays and in the synchrotron radiation facility such as SPring-8 similarly to the above.

Since Ba of $BaTiO_3$ is located in the A site of the perovskite-type structure, twelve O atoms which are first nearest neighbor elements are coordinated around the Ba atom. The Ba atom surrounded by the twelve 0 atoms is located in almost the center thereof. However, since $BaTiO_3$ is a tetragonal ferroelectric material which is slightly distorted in the c-axis direction and whose centrosymmetry is broken, the position of the Ba atom slightly deviates from the center of the twelve 0 atoms. When expressed by, for example, Ba—O bond lengths, the deviation from the center is so slight that the difference between the longest Ba—O bond length and the shortest Ba—O bond length is less than 5% of the shortest Ba—O bond length.

Shift of Bi:

When the Ba site (A site) of $BaTiO_3$ is replaced by Bi, as illustrated in FIG. 1, Bi comes to be present at a position greatly deviated from a centrosymmetric position surrounded by the surrounding twelve O atoms due to the above-described steric hindrance by the lone electron pair. A local electric polarization is generated around Bi by this bias of the Bi position from the centrosymmetric position. In order for this local electric polarization to interact with the macroscopic spontaneous polarization to more stabilize the polarization state of the whole piezoelectric material, it is necessary that the local electric polarization around Bi has a certain degree of magnitude or more almost in the c-axis direction. Therefore, it is necessary that Bi is present at a position relatively greatly biased almost in the c-axis direction from the centrosymmetric position surrounded by the twelve O atoms, that is, from a symmetric position of a unit cell. Since $BaTiO_3$ is a tetragon slightly distorted in the c-axis direction, and the direction of the spontaneous polarization is also in the c-axis direction, the bias of the Bi position from the centrosymmetric position is presumed to be toward the c-axis direction or a direction close thereto.

Bi—O Bond Length:

When the twelve Bi—O bond lengths are expressed as $L_1$ to $L_{12}$ in length order, the bond lengths may be divided into three groups: $L_1$ to $L_4$ of long bond lengths, $L_9$ to $L_{12}$ of short bond lengths, and $L_5$ to $L_8$ of intermediate bond lengths as illustrated in FIG. 1, and there is a relatively great difference between $L_4$ and $L_5$ and between $L_8$ and $L_9$. At this time, a local electric polarization that can stabilize a macroscopic electric polarization is generated around Bi under such conditions that the group of $L_1$ to $L_4$ is longer by 5% or more than the length of the group of $L_5$ to $L_8$, and similarly the group of $L_5$ to $L_8$ is longer by 5% or more than the length of the group of $L_9$ to $L_{12}$. Favorable conditions are conditions where the group of $L_1$ to $L_4$ is longer by 10% or more than the length of the group of $L_5$ to $L_8$, and similarly the group of $L_5$ to $L_8$ is longer by 10% or more than the length of the group of $L_9$ to $L_{12}$. More favorable conditions are conditions where the group of $L_5$ to $L_8$ is longer by 20% or more than the length of the group of $L_9$ to $L_{12}$. On the contrary, if the difference in length between the group of $L_1$ to $L_4$ and the group of $L_5$ to $L_8$ is less than 5%, and the difference in length between the group of $L_5$ to $L_8$ and the group of $L_9$ to $L_{12}$ is less than 5%, the local electric polarization that can stabilize the macroscopic electric polarization cannot be generated around Bi, and the effect to suppress the movement of the domain wall cannot be attained. As a result, a sufficient mechanical quality factor cannot be obtained at room temperature. These conditions are expressed by the following expressions:

$$(L_4-L_5)/L_5 \geq 0.05 \text{ and } (L_8-L_9)/L_9 \geq 0.05 \quad (2),$$

favorably $$(L_4-L_5)/L_5 \geq 0.10, \text{ and } (L_8-L_9)/L_9 \geq 0.10 \quad (2'),$$

more favorably $$(L_4-L_5)/L_5 \geq 0.10, \text{ and } (L_8-L_9)/L_9 \geq 0.20 \quad (2'').$$

However, if the length of the group of $L_1$ to $L_4$ is longer by more than 50% than the length of the group of $L_5$ to $L_8$, and the length of the group of $L_5$ to $L_8$ is longer by more than 100% than the length of the group of $L_9$ to $L_{12}$, it is considered that the perovskite-type structure can no longer be retained. This condition is expressed by the following expressions:

$$(L_4-L_5)/L_5 \leq 0.50, \text{ and } (L_8-L_9)/L_9 \leq 1.00 \quad (2''').$$

In addition, such a condition that the longest Bi—O bond length $L_1$ is longer by 25% or more than the shortest bond length $L_{12}$ is also a condition for generating the local electric polarization that can stabilize the macroscopic electric polarization around Bi. A condition where $L_1$ is longer by 35% or more than $L_{12}$ is favorable. On the contrary, when the difference in length between $L_1$ and $L_{12}$ is less than 25%, the local electric polarization that can stabilize the macroscopic electric polarization cannot be generated around Bi, and the effect to suppress the movement of the domain wall cannot be attained. As a result, a sufficient mechanical quality factor cannot be obtained at room temperature. This condition is expressed by the following expressions:

$$(L_1-L_{12})/L_{12} \geq 0.25 \quad (3),$$

favorably $$(L_1-L_{12})/L_{12} \geq 0.35 \quad (3').$$

However, if the difference between $L_1$ and $L_{12}$ exceeds 200%, it is considered that the perovskite-type structure can no longer be retained. This condition is expressed by the following expression:

$$(L_1-L_{12})/L_{12} \leq 2.00 \quad (3'').$$

The twelve Bi—O bond lengths $L_1$ to $L_{12}$ can be obtained by acquiring XAFS spectra of Bi and subjecting a radial structure function obtained by an EXAFS analysis to a fitting process. The fitting process may be conducted with twelve parameters of $L_1$ to $L_{12}$ taken as unknown parameters. However, when Bi is present biasedly in the c-axis direction, three bond lengths of long bond length ($L_1$ to $L_4$), short bond length ($L_9$ to $L_{12}$) and intermediate bond length ($L_5$ to $L_8$) are assumed to conduct the fitting, whereby a result is obtained with sufficiently high reliability.

Bi—Ti Bond Length:

As illustrated in FIG. 1, it is understood that Bi relatively greatly deviates even from a central position surrounded by eight Ti atoms which are second nearest neighbor elements owing to the bias of the Bi atom position. In other words, a condition for specifying the generation of the local electric polarization around Bi may also be defined by Bi—Ti bond lengths. When the eight Bi—Ti bond lengths with Bi which is located at an 8-fold site with respect to Ti as a starting point are expressed as $D_1$ to $D_8$ in length order, the bond lengths may be divided into two groups: $D_1$ to $D_4$ of long bond length and $D_5$ to $D_8$ of short bond length, and there is a relatively great difference between $D_4$ and $D_5$. At this time, a local electric polarization that can stabilize a macroscopic electric polarization is generated around Bi under such a condition that the group of $D_1$ to $D_4$ is longer by 5% or more than the length of the group of $D_5$ to $D_8$. A favorable condition is a condition where the group of $D_1$ to $D_4$ is longer by 10% or more than the length of the group of $D_5$ to $D_8$. On the contrary, if the difference in length between the group of $D_1$ to $D_4$ and the group of $D_5$ to $D_8$ is less than 5%, the local electric polarization that can stabilize the macroscopic electric polarization cannot be generated around Bi, and the effect to suppress the movement of the domain wall cannot be attained. As a result, a sufficient mechanical quality factor cannot be obtained at room temperature. These conditions are expressed by the following expressions:

$$(D_4-D_5)/D_5 \geq 0.05 \quad (4),$$

favorably $$(D_4-D_5)/D_5 \geq 0.10 \quad (4').$$

However, if the length of the group of $D_1$ to $D_4$ is longer by over 40% than the length of the group of $D_5$ to $D_8$, it is considered that the perovskite-type structure can no longer be retained. This condition is expressed by the following expression:

$$(D_4-D_5)/D_5 \leq 0.40 \quad (4'').$$

Ba—O Bond Length:

As described above, a locally distorted structure is realized around the Bi atom which is slightly added to replace the Ba atom position. However, the circumference of Ba which is an originally present main component element is scarcely affected by the addition of Bi, and local distortion is scarcely generated around Ba. In other words, when the distortion around Ba is expressed by Ba—O bond lengths, the distortion is still so slight that the difference between the longest Ba—O bond length and the shortest Ba—O bond length is less than 5% of the shortest Ba—O bond length like the case where Bi is not added as described above. In other words, a distribution of the Ba—O bond lengths is within the range of less than ±5%. In the case of $BaTiO_3$, a difference between the longest Ba—O bond length and the shortest Ba—O bond length is still so slight that it is less than 3% of the shortest Ba—O bond length, so that the distribution of the Ba—O bond lengths is more favorably within the range of less than ±3%.

Bi Content:

The piezoelectric material containing $BaTiO_3$ as a main component is often used in the form of a sintered body (ceramic). The grain size of the piezoelectric ceramic at that time desirably falls within the range of 500 nm to 10 μm from the viewpoints of piezoelectric properties and mechanical strength. When the domain structure of such a piezoelectric ceramic is observed by an optical microscope or an electron microscope, a domain wall of a grain having a grain size less than 1 μm crosses from end to end within the grain; some of domain walls of a grain having a grain size more than 1 μm cross from end to end within the grain, while some of them are divided into two or more parts within the grain. Thus, it is known that the length of each domain wall is generally about 500 nm or more. When Bi is slightly added into the metal oxide piezoelectric material that contains $BaTiO_3$ as a main component and is represented by the general formula (1) to introduce a local electric polarization around Bi, at least one local electric polarization can be arranged in one lattice row along a domain wall within a grain so long as Bi can be introduced into one lattice among 1,000 lattices of the metal oxide crystal of the general formula (1), because the lattice constant of the metal oxide of the general formula (1) containing $BaTiO_3$ as the main component is about 0.4 nm. In other words, at least one Bi can be introduced into each crystal lattice row along the domain wall so long as the content of Bi which is a first subcomponent contained in the metal oxide of the general formula (1) is 0.1 mol % or more with respect to 1 mol of the metal oxide of the general formula (1), and at the same time the local electric polarization around Bi can be introduced. The polarization state in the vicinity of the domain wall is thereby stabilized. In other words, the domain wall is in a state of being hard to be able to move (vibrate), and the mechanical quality factor is improved. However, when Bi is introduced into the metal oxide containing $BaTiO_3$ as a main component, it is difficult to evenly distribute Bi in the metal oxide. Bi is unevenly distributed in the metal oxide due to addition of a certain amount or more of Bi or due to insufficient mixing of raw material powder to which Bi has been added to cause such problems that the metal oxide exhibits such properties as to be a disordered dielectric material called "relaxor", the Bi atom position does not show bias in a specific direction, but is scatteredly biased in unspecified directions, whereby generation of the local electric polarization around Bi is insufficient, and deterioration of insulation properties by grain boundary precipitation of Bi or the like is caused to fail to exhibit the properties inherent in the material. In the case of the metal oxide represented by the general formula (1), the upper limit of the Bi content for evenly distributing Bi is 0.5 mol % with respect to 1 mol of the metal oxide of the general formula (1). Even if the Bi content is 0.5 mol % or less with respect to 1 mol of the metal oxide of the general formula (1), it should be noticed that there is need to conduct sintering after Bi raw material powder and the raw material powder of the metal oxide of the general formula (1) are sufficiently mixed with each other. Otherwise, a resulting piezoelectric material becomes a metal oxide in which Bi is unevenly distributed or intergranularly precipitated, and so desired material properties are not obtained.

Confirmation of Even Distribution of Bi:

The following methods may be used as methods for confirming that Bi added is evenly distributed.

A first method is to confirm that a heterogeneous phase or precipitate different in Bi content is not present by an electron microscope having an analytical function.

A second method is to confirm, by X-ray diffraction, that a specific diffraction peak depending on whether or not Bi is added or on an addition amount thereof is not present.

A third method is to confirm that a radial structure function obtained from an EXAFS analysis can be subjected to a fitting process with a structure model which supposes that Bi is evenly present upon the EXAFS analysis, for example, a single coordinating structure model.

A fourth method is to confirm, by measurement of temperature dependence of permittivity, that a Curie temperatures $T_c$ and a phase transition temperature $T_{ot}$ systematically vary depending on the amount of Bi added, and the steepness of change of permittivity upon the phase transition is not influenced by the addition of Bi.

A fifth method is to confirm evenness by acquiring a frequency dependent spectrum of impedance and analyzing the spectrum by using models in which series connection and parallel connection of a capacitance components and resistance components are supposed.

At that time, even an aggregate of uniform grains may exhibit different resistance components between the interior of a grain and a grain boundary in some cases. This is attributable to change of a potential barrier of the grain boundary depending on a connection condition between grains and is distinguished from that attributable to Bi precipitation on the grain boundary. The capacitance components dos not greatly differ between the interior of the grain and the grain boundary so long as it is not attributable to the Bi precipitation on the grain boundary.

The even distribution of Bi can be confirmed by using these methods. In addition, another proper method than these methods may also be used.

Mn Content:

As described above, a material in which the domain wall is hard to move can be realized by causing Bi to be contained in an amount of 0.1 mol % or more to 0.5 mol % or less with respect to 1 mol of the metal oxide of the general formula (1). However, such a material does not function as a piezoelectric material as it is because supposing that Bi is introduced into the A site of the metal oxide of the general formula (1), positive trivalent Bi comes to enter the ordinarily positive divalent A site, which is equivalent to doping of a donor, that is, a conduction electron is generated by the introduction of Bi, resulting in deterioration of the insulation property. In a piezoelectric material having poor insulation property, it is difficult to apply a high voltage in polarization processing, and so the macroscopic polarization cannot be sufficiently uniformized to cause a problem of failing to attain desired piezoelectric properties. In addition, since the dielectric loss tangent is increased by the deterioration of the insulation property, a problem that an electrical loss upon application of a drive voltage, that is, generation of Joule heat, is large is also caused. In order to solve that problem, it is necessary to introduce an acceptor compensating the Bi donor, and Mn is desirable as the acceptor for achieving such a purpose. When a very small amount of Mn is added into $BaTiO_3$ in the sintering process, Mn usually replaces a part of Ti and is present in the B site. Since the valence of Mn at that time is usually positive tetravalent, electrical neutrality is retained even when replacing Ti which is positive tetravalent. When a donor is introduced into $BaTiO_3$ to which this Mn has been added, for example, when positive trivalent Bi is introduced into the A site, a part of Mn becomes a positive trivalent or positive divalent acceptor according to the amount of the donor introduced so as to satisfy the electrical neutrality condition because Mn can stably take positive trivalent and positive divalent states in addition to a positive tetravalent state. Therefore, the generation of the conduction electron like the case where Bi is introduced alone does not occur, and so the insulation property remains good. Therefore, the insulation property is not deteriorated, the expected piezoelectric properties can be attained, and the electrical loss upon operation can also remain small even when Bi is introduced. The addition amount of Mn may be the same as that of Bi for compensating the Bi donor. However, Mn is desirably introduced in an amount larger than the amount of Bi added because the properties are not deteriorated, and an effect to improve insulation property and piezoelectric property (particularly, mechanical quality factor) is rather recognized even when Mn is added alone so long as the amount is small. However, if Mn is introduced in excess, the insulation property is deteriorated due to generation of a conductance hole owing to the Mn acceptor or due to precipitation of a conductive by-product containing Mn as a main component. Therefore, when Bi is added in the range of from 0.1 mol % or more to 0.5 mol % or less with respect to 1 mol of the metal oxide of the general formula (1), Mn is desirably added in the range of from 0.3 mol % or more to 1.5 mol % or less with respect to 1 mol of the metal oxide of the general formula (1).

The valence and site of Mn can be identified by the XAFS measurement similarly to Bi. In particular, the valence can be estimated by comparing the XANES spectrum with the measurement data of a reference material whose valence and structure are already known. In addition, the site in which Mn is present can be identified by analyzing EXAFS, and information of a coordination environment around Mn, particularly, of bond lengths with coordinating atoms and the number thereof (coordination number) can be further obtained. In addition, the valence of a small amount of the Mn atom which is evenly present in a nonmagnetic (diamagnetic) material such as $BaTiO_3$ can be more precisely estimated by measurement of the temperature dependence of magnetic susceptibility.

Confirmation of Even Distribution of Mn:

The above-described methods for confirming the even distribution of Bi may be used likewise as methods for confirming that Mn added is evenly distributed. In addition to these methods, a method of confirming that the temperature dependence of the magnetic susceptibility conforms to the Curie-Weiss law may also be used in the case of Mn. When Mn is present partially at a high concentration due to precipitation or the like, an anomaly of the magnetic susceptibility attributable to magnetic ordering phase transition of Mn may be recognized in some cases at a low temperature. In addition, even when a clear anomaly is not recognized, the temperature dependence of the magnetic susceptibility deviates from the Curie-Weiss law. Since the temperature dependence of the magnetic susceptibility behaves conformably to the Curie-Weiss law only when Mn is evenly and thinly present, the even distribution of Mn can be confirmed by investigating change in the behavior of the temperature dependence of the magnetic susceptibility due to the addition amount of Mn.

ICP (inductively coupled plasma) atomic emission spectral analysis, ICP mass spectrometry, X-ray fluorescence (XRF) analysis, atomic absorption spectrometry or the like may be used in the measurement of contents of Bi which is a first subcomponent and Mn which is a second subcomponent. Incidentally, "subcomponent" in the present invention corresponds to a component contained in the piezoelectric material for adjusting various properties of the piezoelectric material, such as a mechanical quality factor. A very small amount of an element component which does substantially not affect the properties of the piezoelectric material corresponds to impurity and does not correspond to the subcomponent.

The present invention assumes that Bi which is the first subcomponent and Mn which is the second subcomponent are respectively located in the A site and the B site of the perovskite-type structure. However, it is acceptable that a part of Bi and a part of Mn are respectively located in the B site and the A site.

The piezoelectric material according to the present invention contains a perovskite-type metal oxide as a main phase from the viewpoint of insulation property. The term "main phase" means the case where a peak with stronger diffraction intensity is attributable to the perovskite-type metal oxide structure when powder of the piezoelectric material is subjected to X-ray diffraction. Whether or not the perovskite-type metal oxide is the main phase can be judged by whether or not the maximum diffraction intensity derived from the perovskite-type metal oxide is one hundred times or more as much as the maximum diffraction intensity derived from an impurity phase in, for example, X-ray diffraction. The piezoelectric material is favorably composed of only the perovskite-type metal oxide because the insulation property is highest. The piezoelectric material is more favorably "single phase" in which a crystal of the perovskite-type metal oxide occupies almost the whole.

The form of the piezoelectric material according to the present invention is not limited, and any form of ceramic, powder, single crystal, film and slurry may be taken. However, the form is favorably ceramic or film. The term "ceramic" in the present invention means an aggregate (also referred to as a bulk body) of crystal grains which is baked and hardened by a heat treatment, the basic component of which is a metal oxide, what is called a polycrystal. In addition, that subjected to machining after sintering is also included in "ceramic".

The term "film" in the present invention means an aggregated texture closely provided so as to cover a certain surface of a base material (substrate) on a flat plate. The thickness of the film as measured in a direction perpendicular to an installation surface thereof is 10 μm or less, and when the stacking number of crystal grains in the perpendicular direction is within twenty, such a form is referred to as the film in the present invention.

No particular limitation is imposed on a method for determining the composition of the piezoelectric material according to the present invention. As such methods, there are mentioned X-ray fluorescence analysis, ICP atomic emission spectral analysis and atomic absorption spectrometry. In any method, the weight ratio and the compositional ratio of respective elements contained in the piezoelectric material can be calculated.

Measurement of Phase Transition Temperature $T_{ot}$ and Curie Temperatures $T_c$:

$T_{ot}$ and $T_c$ can be found by measuring a capacitance by an impedance analyzer (for example, 4194A manufactured by Keysight Technologies Co. (formerly Agilent Technologies Co.)) while changing the temperature of a sample (piezoelectric material). The measured capacitance can be transformed into the permittivity. At the same time, the temperature dependence of the dielectric loss tangent can also be measured and found by the impedance analyzer. $T_{ot}$ is a temperature at which the crystal structure changes from tetragonal to orthorhombic.

$T_{ot}$ can be determined by measuring the permittivity while cooling the sample to −60° C. from 25° C. and finding a temperature at which a value obtained by differentiating the permittivity with the sample temperature is maximum.

$T_c$ is a Curie temperature and a temperature at which the permittivity is maximum in the vicinity of a phase transition temperature from a ferroelectric phase (tetragonal phase) to a paraelectric phase (cubic phase). $T_c$ can be determined by measuring the permittivity while heating the sample and finding a temperature at which the value of the permittivity is maximum.

In addition, the crystal structure can be estimated by X-ray diffraction, electron diffraction or Raman scattering.

Production Method for Piezoelectric Material:

No particular limitation is imposed on a production method for the piezoelectric material according to the present invention. However, a typical production method will hereinafter be described.

Raw Material of Piezoelectric Material:

When a ceramic-form piezoelectric material (piezoelectric ceramic) is produced, a general method of sintering solid powder containing constituent elements, such as oxide, carbonate, nitrate or oxalate, under ordinary pressure may be adopted.

The raw material is composed of a metal compound such as a Ba compound, a Ti compound, an Mn compound, a Bi compound, a Ca compound, a Sr compound, a Zr compound, an Hf compound or a Sn compound. For all of the Ba compound, the Ti compound, the Ca compound, the Sr compound, the Zr compound, the Hf compound and the Sn compound among these, perovskite-type metal oxides are used and mixed, and then an effect to fine crystal grains after sintering is obtained, which is preferable because the occurrence of cracking and chipping upon machining of the piezoelectric material and piezoelectric element can be further inhibited.

As examples of a usable Ba compound, there are mentioned barium oxide, barium carbonate, barium oxalate, barium acetate, barium nitrate, perovskite-type barium titanate, perovskite-type barium zirconate and perovskite-type barium zirconate titanate.

As examples of a usable Ti compound, there are mentioned titanium oxide, perovskite-type barium titanate, perovskite-type barium zirconate titanate and perovskite-type calcium titanate.

As examples of a usable Mn compound, there are mentioned manganese carbonate, manganese monoxide, manganese dioxide, trimanganese tetraoxide and manganese acetate.

As examples of a usable Bi compound, there are mentioned bismuth oxide and perovskite-type bismuth ferrate.

As examples of a usable Ca compound, there are mentioned calcium oxide, calcium carbonate, calcium oxalate, calcium acetate, perovskite-type calcium titanate and perovskite-type calcium zirconate.

As examples of a usable Sr compound, there are mentioned strontium oxide, strontium carbonate, strontium oxalate, strontium acetate, perovskite-type strontium titanate and perovskite-type strontium zirconate.

As examples of a usable Zr compound, there are mentioned zirconium oxide, perovskite-type barium zirconate, perovskite-type barium zirconate titanate and perovskite-type calcium zirconate.

As examples of a usable Hf compound, there are mentioned hafnium oxide, perovskite-type barium hafnate and perovskite-type calcium hafnate.

As examples of a usable Sn compound, there are mentioned tin oxide, perovskite-type barium stannate, perovskite-type barium stannate titanate and perovskite-type calcium stannate.

Mixing of Raw Material Powder:

No particular limitation is imposed on a method for mixing raw material powders of the piezoelectric material according to the present invention. However, it is desirable to sufficiently mix the raw material powders with greater force than that of a mixing method used upon production of ordinary $BaTiO_3$-based ceramic, particularly, by a method of applying shearing stress. The most desirable method is a mixing method using a planetary ball mill. Both the raw material powders weighed so as to give a desired composition and zirconia-made or aluminum-made balls having a diameter of from 0.5 mm to 10 mm are put into a zirconia-made, aluminum-made or iron-made pot, and rotation and revolution are conducted at a rate of about 100 to 900 revolutions per minute to mix the raw material powders. At this time, the mixing method may be either dry mixing in which only the raw material powders and the balls are fed into the pot to conduct mixing or wet mixing in which a liquid such as ethanol or water is also fed at the same time to conduct mixing. The raw material powders are mixed by such a method, whereby the Bi raw material can be well mixed with other raw materials to obtain a metal oxide in which Bi is evenly distributed by subsequent sintering. If insufficient mixing of the raw material powders to which Bi has been added occurs, there is a possibility of causing such inconveniences that Bi is unevenly distributed in a resulting metal oxide, the metal oxide exhibits such properties as to be a disordered dielectric material called "relaxor", and the Bi atom position does not show bias in a specific direction, but is scatteredly biased in unspecified directions, thereby insufficiently generating a local electric polarization around Bi.

Granulated Powder and Molded Article:

No particular limitation is imposed on a method for granulating the raw material powders of the piezoelectric ceramic according to the present invention. As examples of a binder usable upon the granulation, there are mentioned PVA (polyvinyl alcohol), PVB (polyvinyl butyral) and acrylic resin. The amount of the binder added is favorably from 1 part by weight to 10 parts by weight with respect to the total weight, 100 parts by weight, of the powder of the raw materials such as the Ba compound, Ti compound, Mn compound, Bi compound, Ca compound, Sr compound, Zr compound, Hf compound and Sn compound, more favorably from 2 parts by weight to 5 parts by weight, from the viewpoint of increasing the density of a resulting molded article.

As a granulation method, mixed powder obtained by mechanically mixing the raw materials such as the Ba compound, Ti compound, Mn compound, Bi compound, Ca compound, Sr compound, Zr compound, Hf compound and Sn compound may be granulated, or the granulation may be conducted after these compounds are calcined at about 800 to 1,300° C. The most favorable granulation method is a spray drying method from the viewpoint of enabling the grain size of the granulated powder to uniformize.

No particular limitation is imposed on a production method for a molded article of the piezoelectric ceramic according to the present invention. The molded article is a solid body produced from the raw material powders, granulated powder or slurry. As a method for producing the molded article, uniaxial pressing, cold hydrostatic pressing, warm hydrostatic pressing, cast molding or extrusion forming may be used.

Sintered Body:

No particular limitation is imposed on a method for sintering the piezoelectric ceramic according to the present invention. As examples of the sintering method, there are mentioned sintering using an electric furnace, sintering using a gas furnace, electric heating method, microwave sintering method, millimeter wave sintering method and HIP (hot isostatic pressing). The sintering using the electric furnace or the gas furnace may be conducted using a continuous furnace or a batch furnace.

No particular limitation is imposed on the sintering temperature of the piezoelectric ceramic in the above-described sintering method. The sintering temperature is favorably a temperature at which the compounds each react to sufficiently generate crystals. A favorable sintering temperature is 1,100° C. or more to 1,400° C. or less from the viewpoint of controlling the grain size of the piezoelectric ceramic within the range of from 500 nm to 10 µm. A more favorable temperature is 1,100° C. or more to 1,380° C. or less. The piezoelectric ceramic obtained by sintering within the above temperature range exhibits good piezoelectric properties.

In order to reproducibly stabilize the properties of the piezoelectric ceramic obtained by the sintering treatment, it is only necessary to conduct the sintering treatment for 2 hours or more to 24 hours or less while keeping the sintering temperature constant within the above range.

A sintering method such as a two-step sintering method may also be used. However, a method without rapid temperature change is favorable when taking productivity into consideration.

After the piezoelectric ceramic is polished, it is favorably subjected to a heat treatment at a temperature of 1,000° C. or more. When the piezoelectric ceramic is mechanically polished, residual stress is generated in the interior of the piezoelectric ceramic. However, the residual stress is relaxed by conducting the heat treatment at 1,000° C. or more, and the piezoelectric properties of the piezoelectric ceramic are more improved. In addition, the heat treatment is conducted at the temperature of 1,000° C. or more, whereby an effect to remove raw material powder such as barium carbonate which is precipitated on a grain boundary portion is brought about. No particular limitation is imposed on the time for which the heat treatment is conducted at the temperature of 1,000° C. or more. However, one hour or more is favorable.

When the piezoelectric material according to the present invention is obtained as a film formed on a substrate, the thickness of the piezoelectric material is desirably 200 nm or more to 10 μm or less, more favorably 300 nm or more to 3 μm or less. The film thickness of the piezoelectric material is controlled to 200 nm or more to 10 μm or less, whereby a sufficient electromechanical conversion function as a piezoelectric element is obtained.

No particular limitation is imposed on a method for forming the film. As examples thereof, there are mentioned a chemical solution deposition method (CSD method), a sol-gel method, a metal organic chemical vapor deposition method (MOCVD method), a sputtering method, a pulse laser deposition method (PLD method), a hydrothermal synthesis method and an aerosol deposition method (AD method). Among these, the chemical solution deposition method or the sputtering method is the most favorable lamination method. The chemical solution deposition method or the sputtering method can easily form a large film formation area.

The substrate used in the piezoelectric material according to the present invention is favorably a single crystal substrate cut and polished at the (001) surface or the (110) surface. The single crystal substrate cut and polished at the specific crystal surface is used, whereby the piezoelectric material film provided on that substrate surface can also be strongly oriented in the same direction.

Piezoelectric Element:

A piezoelectric element using the piezoelectric material according to the present invention will hereinafter be described.

Figure 2:
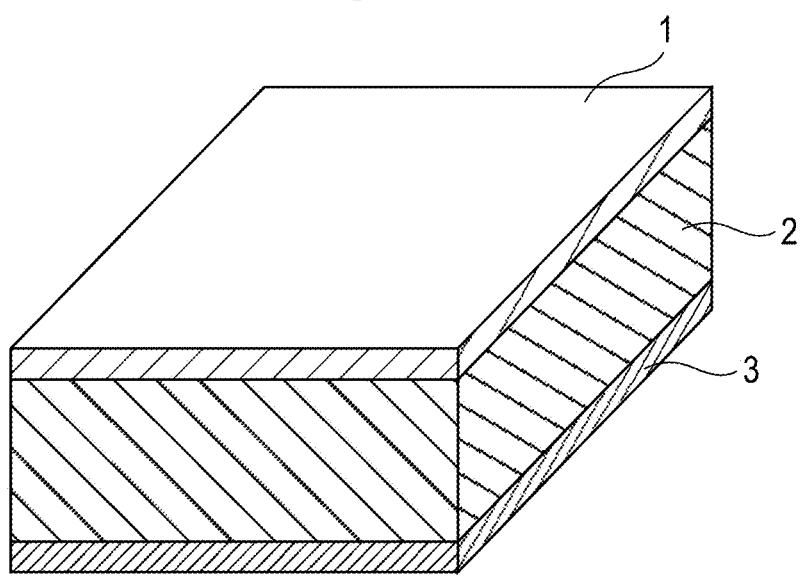
FIG. 2 is a schematic view illustrating the structure of a piezoelectric element according to an embodiment of the present invention.

FIG. 2 is a schematic view illustrating the structure of a piezoelectric element according to an embodiment of the present invention. The piezoelectric element according to the present invention is a piezoelectric element having at least a first electrode 1, a piezoelectric material portion 2 being provided on the first electrode and containing a piezoelectric material, and a second electrode 3 provided on the piezoelectric material portion 2, wherein the piezoelectric material portion is composed of the piezoelectric material according to the present invention.

The piezoelectric properties of the piezoelectric material according to the present invention can be evaluated by providing a piezoelectric element having at least a first electrode and a second electrode.

The first electrode and the second electrode are each formed of a conductive layer having a thickness of about 5 nm to 10 μm. No particular limitation is imposed on the material thereof, and any material may be used so long as it is usually used in a piezoelectric element. As examples thereof, there may be mentioned metals such as Ti, Pt, Ta, Ir, Sr, In, Sn, Au, Al, Fe, Cr, Ni, Pd, Ag and Cu, and compounds thereof. The first electrode and the second electrode may be each formed of one of these metals, or a mixture or an alloy of two or more metals thereof. Alternatively, the first electrode and the second electrode may be formed by laminating two or more metals thereof. The first electrode and the second electrode may be formed of materials different from each other.

The production method for the first electrode and the second electrode is not limited, and they may be formed by baking of metallic paste or may be formed by a sputtering or vapor deposition method. In addition, both first electrode and second electrode may be patterned into desired shapes.

Polarization Processing:

It is more favorable that the polarization axis of the piezoelectric element is uniformized in a certain direction. The polarization axis is uniformized in the certain direction, whereby the piezoelectric constant of the piezoelectric element becomes large.

No particular limitation is imposed on a polarization method of the piezoelectric element. The polarization processing may be conducted in the air or in silicone oil.

The temperature upon the polarization is favorably a temperature of from 60° C. to 150° C. However, the optimum condition somewhat varies according to the composition of the piezoelectric material constituting the piezoelectric element.

The electric field applied for conducting the polarization processing is favorably from 600 V/mm to 2.0 kV/mm.

Measurement of Piezoelectric Constant and Mechanical Quality Factor:

The piezoelectric constant and mechanical quality factor of the piezoelectric element can be found by calculation based on Standard of Japan Electronics and Information Technology Industries Association (JEITA EM-4501) from measured results of a resonance frequency and an antiresonant frequency which are obtained by using a commercially available impedance analyzer. Hereinafter, this method is referred to as a resonance-antiresonance method.

Laminated Piezoelectric Element:

A laminated piezoelectric element using the piezoelectric material according to the present invention will now be described.

The laminated piezoelectric element according to the present invention is a piezoelectric element having a structure in which at least one internal electrode is provided within a piezoelectric material portion and having a layered structure in which a piezoelectric material layer is formed of a piezoelectric material constituting the piezoelectric material portion and at least one layered internal electrode are alternately laminated, wherein the piezoelectric material layer is formed of the piezoelectric material according to the present invention.

Figure 3A:
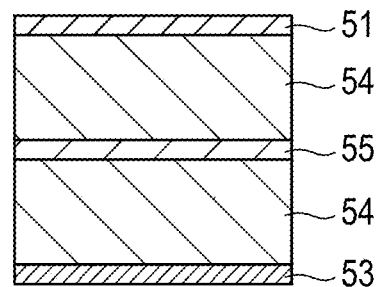
FIGS. 3A and 3B are a schematic sectional view illustrating the structure of a laminated piezoelectric element (two-layer layered structure) according to an embodiment of the present invention (FIG. 3A) and a schematic sectional view illustrating the structure of a laminated piezoelectric element (nine-layer layered structure) according to another embodiment of the present invention (FIG. 3B).
Figure 3B:
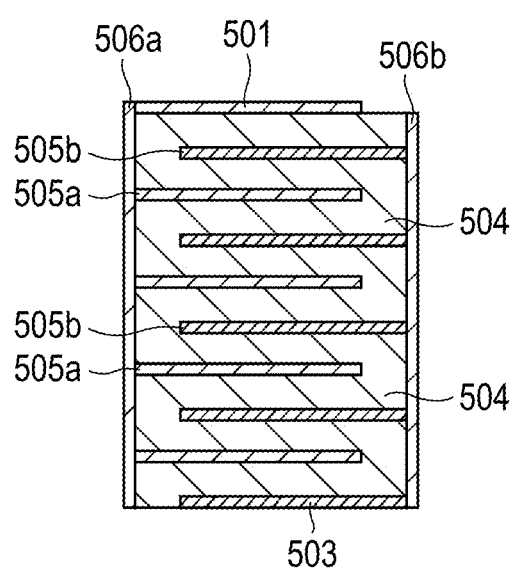

FIGS. 3A and 3B are schematic sectional views illustrating the structures of laminated piezoelectric elements according to embodiments of the present invention. The laminated piezoelectric element illustrated in FIG. 3A is a laminated piezoelectric element composed of a piezoelectric material layer 54 and electrodes including an internal electrode 55, wherein the piezoelectric material layer and a layered electrode are alternately laminated, and the piezoelectric material layer 54 is formed of the piezoelectric material according to the present invention. The electrodes may include external electrodes such as a first electrode 51 and a second electrode 53 in addition to the internal electrode 55.

FIG. 3A illustrates the structure of a laminated piezoelectric element according to the present invention in which two piezoelectric material layers 54 and one internal electrode 55 are alternately laminated, and that layered structure is held between the first electrode 51 and the second electrode 53. Incidentally, the laminated piezoelectric element according to the present invention is not limited to the structure illustrated in FIG. 3A, the numbers of the piezoelectric material layers and the internal electrode may be increased as illustrated in FIG. 3B described later, and the number of the layers is not limited.

The laminated piezoelectric element illustrated in FIG. 3B has a structure in which nine piezoelectric material layers 504 and eight internal electrode 505 (in the illustrated example, formed of four internal electrodes 505a and four internal electrode 505b) are alternately laminated, and that layered structure is held between a first electrode 501 and a second electrode 503. In addition, the layered piezoelectric element illustrated in FIG. 3B has an external electrode 506a and an external electrode 506b for short-circuiting the internal electrodes formed alternately. Specifically, in the embodiment illustrated in FIG. 3B, the four internal electrodes 505a are short-circuited by the external electrode 506a, and the four internal electrodes 505b are short-circuited by the external electrode 506b.

The sizes and shapes of the internal electrodes 55 and 505 and the external electrodes 506a and 506b do not necessarily need to be the same as those of the piezoelectric material layers 54 and 504, and the electrodes may be divided into plural portions.

The internal electrodes 55 and 505, the external electrodes 506a and 506b, the first electrodes 51 and 501, and the second electrodes 53 and 503 are each formed of a conductive layer having a thickness of about 5 nm to 10 μm.

No particular limitation is imposed on materials used in these electrodes, and any material may be used so long as it is usually used in a piezoelectric element. As examples thereof, there may be mentioned metals such as Ti, Pt, Ta, Ir, Sr, In, Sn, Au, Al, Fe, Cr, Ni, Pd, Ag and Cu, and compounds thereof. The internal electrodes 55 and 505, and the external electrodes 506a and 506b may be each formed of one of these materials, or a mixture or an alloy of two or more metals thereof. Alternatively, they may be formed by laminating two or more materials thereof. In addition, the plural electrodes may be formed of materials different from one another.

The internal electrodes 55 and 505 favorably contain at least one of Ni and Cu from the viewpoint of providing a cheap electrode material. When at least one of Ni and Cu is used in the internal electrodes 55 and 505, the layered piezoelectric element according to the present invention is favorably baked in a reducing atmosphere.

In addition, in the layered piezoelectric element according to the present invention, the internal electrode(s) contains Ag and Pd, when the weight ratio $m_1/m_2$ of the content $m_1$ of Ag and the content $m_2$ of Pd favorably satisfies $0.25 \leq m_1/m_2 \leq 4.0$. If the weight ratio $m_1/m_2$ is less than 0.25, there is anxiety that the sintering temperature of the internal electrode(s) is high. Therefore, such a weight ratio is not desirable. On the other hand, if the weight ratio $m_1/m_2$ exceeds 4.0, there is anxiety that the internal electrode(s) is islanded to cause in-plane nonuniformity. Therefore, such a weight ratio is not desirable. The weight ratio $m_1/m_2$ more favorably satisfies $0.3 \leq m_1/m_2 \leq 3.0$.

As illustrated in FIG. 3B, the plural electrodes including the internal electrodes 505 may be short-circuited to one another for the purpose of uniformizing the phase of a drive voltage. For example, the internal electrode 505a and the first electrode 501 may be short-circuited by the external electrode 506a. The internal electrode 505b and the second electrode 503 may be short-circuited by the external electrode 506b. In addition, the internal electrodes 505a and the internal electrodes 505b may be alternately arranged. Further, the mode of short-circuiting the electrodes to each other is not limited. An electrode and/or a wiring for short-circuiting may also be provided on a side surface of the laminated piezoelectric element. A through-hole passing through the piezoelectric material layer 504 may be provided to fill a conductive material into the interior thereof, thereby short-circuiting the electrodes to each other.

Liquid Discharge Head:

The liquid discharge head according to the present invention includes a liquid chamber including a vibrating portion in which the piezoelectric element according to the present invention is arranged and a discharge port communicating with the liquid chamber. A liquid discharged by the liquid discharge head according to the present invention is not particularly limited so long as it is a fluid, and an aqueous liquid such as water, ink or fuel, or a nonaqueous liquid can be discharged.

Figure 4:
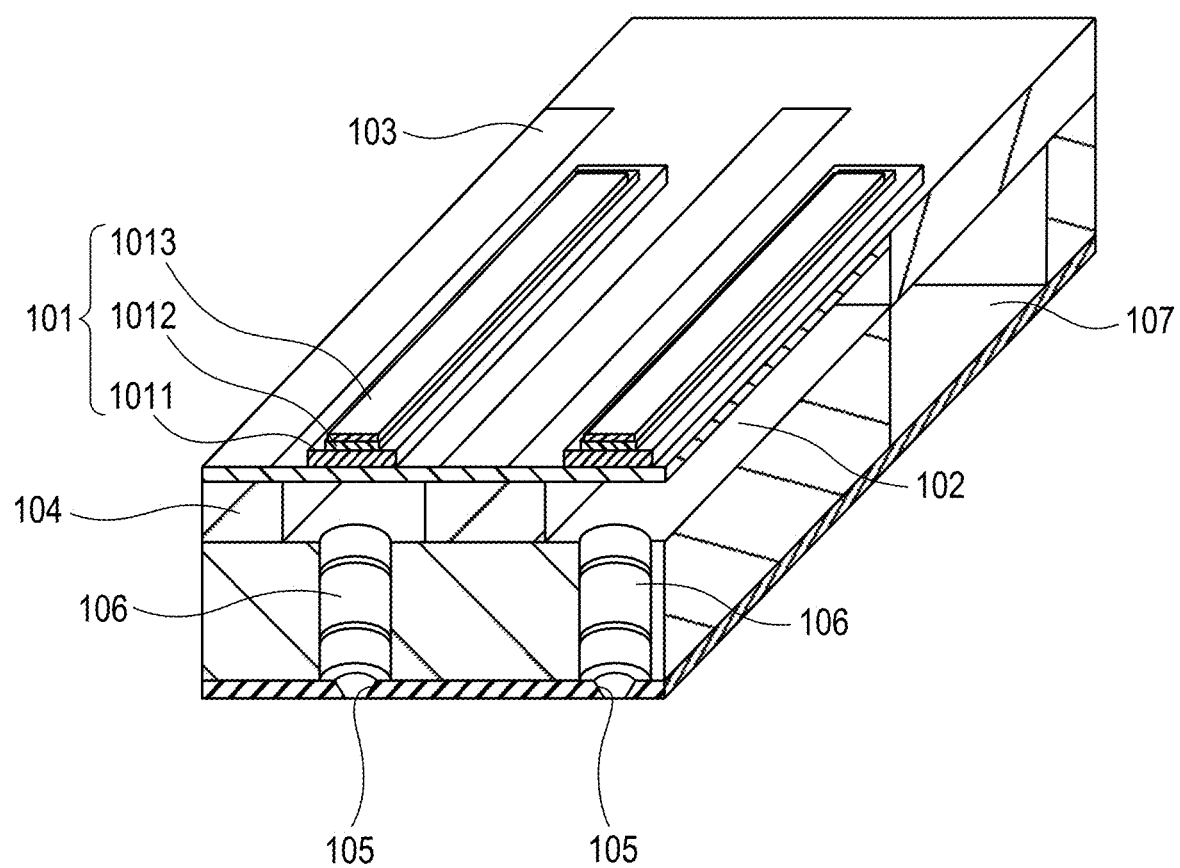
FIG. 4 is an entire schematic view illustrating the structure of a liquid discharge head according to an embodiment of the present invention.

FIG. 4 is a schematic view illustrating the structure of a liquid discharge head according to an embodiment of the present invention. The liquid discharge head according to the present invention is a liquid discharge head having a piezoelectric element 101 according to the present invention. The piezoelectric element 101 is a piezoelectric element having at least a first electrode 1011, a piezoelectric material 1012 and a second electrode 1013. The piezoelectric material 1012 is patterned as needed as illustrated in FIG. 4.

The liquid discharge head illustrated in FIG. 4 has a discharge port 105, an individual liquid chamber 102, a communication hole 106 connecting the individual liquid chamber 102 with the discharge port 105, a liquid chamber partition wall 104, a common liquid chamber 107, a vibrating plate 103 and a piezoelectric element 101. The piezoelectric element 101 in FIG. 4 is rectangular, but the shape thereof may be any other shape, such as an ellipse, a circle or a parallelogram, than the rectangular shape. In general, the piezoelectric material 1012 takes a shape in line with the shape of the individual liquid chamber 102.

Incidentally, the liquid chamber in this embodiment is composed of the vibrating plate 103 which is a vibrating portion in which the piezoelectric element 101 is arranged, the liquid chamber partition wall 104 and a bottom surface where the communication hole 106 is formed, and can store an ink which is a liquid in the individual liquid chamber 102. However, the present invention is not limited to such constitution.

In FIG. 4, the first electrode 1011 is used as a lower electrode, and the second electrode 1013 is used as an upper electrode. However, the arrangement of the first electrode 1011 and the second electrode 1013 is not limited to this. For example, the first electrode 1011 may also be used as either the lower electrode or the upper electrode. Similarly, the second electrode 1013 may also be used as either the upper electrode or the lower electrode. In addition, a buffer layer may also be present between the vibrating plate 103 and the lower electrode.

In the liquid discharge head, the vibrating plate 103 is vertically fluctuated by the expansion and contraction of the piezoelectric material 1012 to apply a pressure to the liquid in the individual liquid chamber 102. As a result, the liquid is discharged from the discharge port 105. The liquid discharge head according to the present invention can be used for printer use or in the production of an electron device.

The size of the discharge port 105 is favorably 5 μm or more to 40 μm or less in terms of equivalent circle diameter. The shape of the discharge port 105 may be circular, or may be astral, polygonal or trigonal.

Liquid Discharge Apparatus:

The liquid discharge apparatus according to the present invention will now be described. The liquid discharge apparatus according to the present invention includes a setting portion on which a transferring member is set and the above-described liquid discharge head from which a liquid is discharged on the transferring member.

Figure 5:
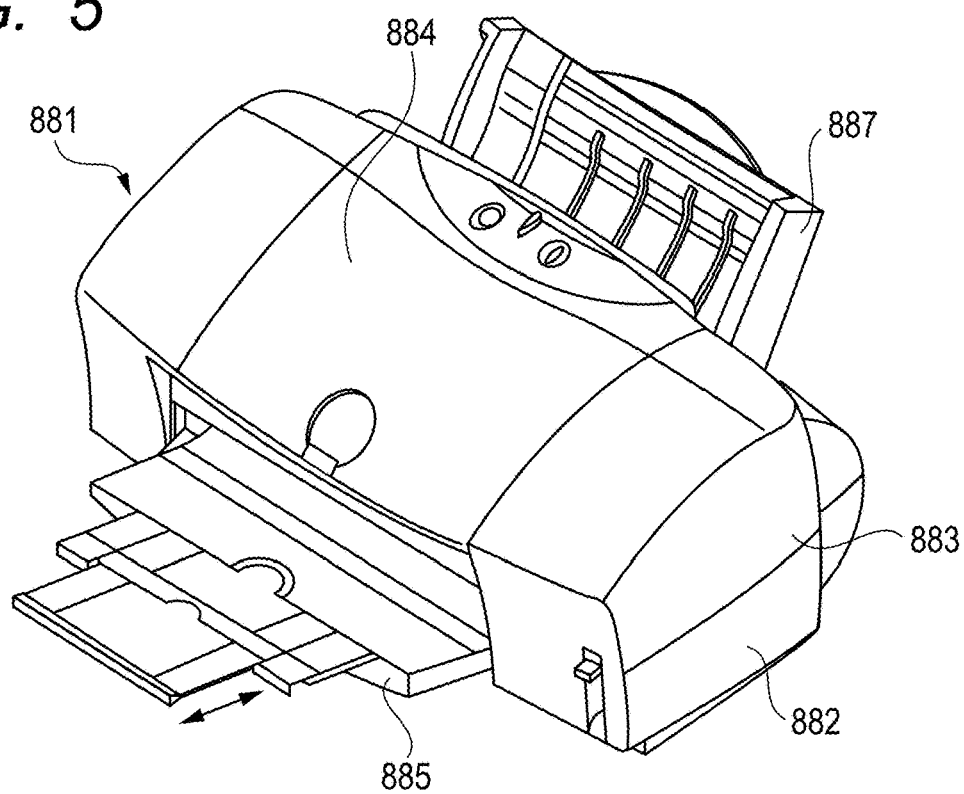
FIG. 5 is a schematic view illustrating the structure of a liquid discharge apparatus according to an embodiment of the present invention.
Figure 6:
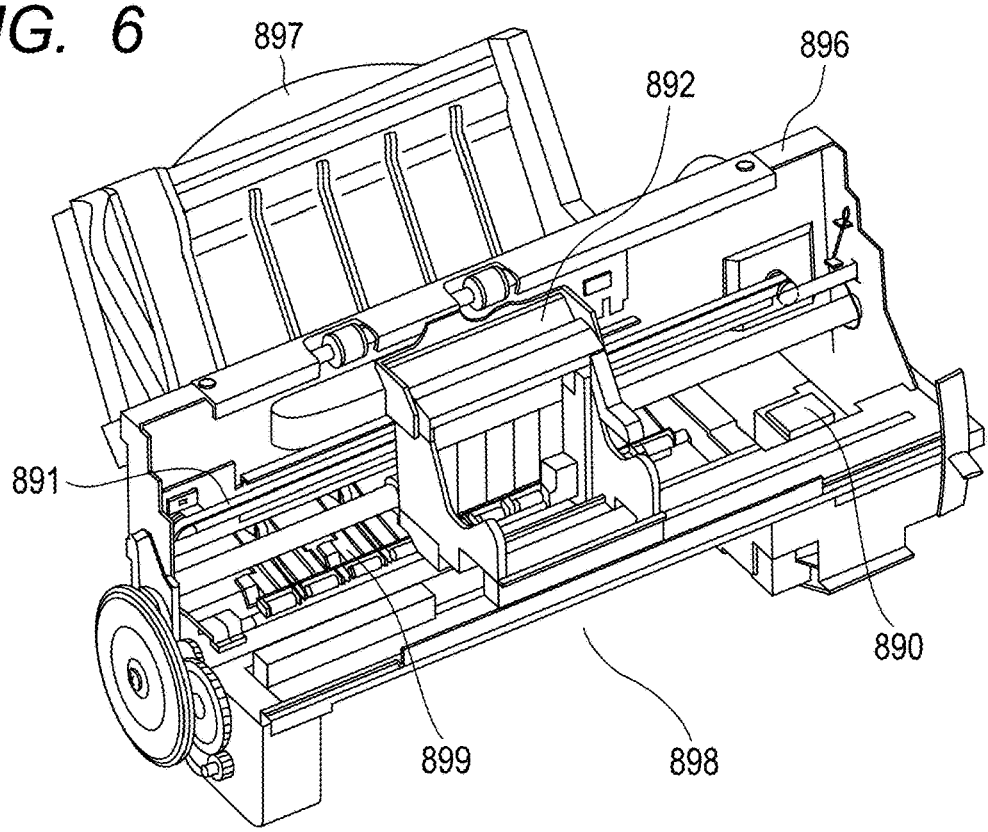
FIG. 6 is a schematic view illustrating the structure of the liquid discharge apparatus according to the embodiment of the present invention.

As an example of the liquid discharge apparatus according to the present invention, there may be mentioned an ink jet recording apparatus illustrated in FIGS. 5 and 6. The liquid discharge apparatus (ink jet recording apparatus) 881 illustrated in FIG. 5 is illustrated in FIG. 6 with exteriors 882 to 885 and 887 taken off. The ink jet recording apparatus 881 has an automatic feeding portion 897 for automatically feeding recording paper as a transferring member into an apparatus body 896. Further, the apparatus has a conveyance portion 899 for guiding the recording paper fed from the automatic feeding portion 897 to a predetermined recording position and to a discharge port 898 from the recording position, a recording portion 891 for conducting recording on the recording paper conveyed to the recording position and a recovery portion 890 for conducting a recovery process for the recording portion 891. The liquid discharge head according to the present invention is housed in the recording portion 891, and a carriage 892 bidirectionally moved on a rail is provided. Here, the conveyance portion 899 as the setting portion is a portion where the recording paper as the transferring member is placed to the predetermined recording position while conveying the recording paper, and recording is conducted on the recording paper by the recording portion 891 at that setting position.

In such an ink jet recording apparatus, the carriage 892 is transferred on the rail in response to an electric signal sent out of a computer, and the piezoelectric material is displaced when a drive voltage is applied to the electrodes between which the piezoelectric material is held. By this displacement of the piezoelectric material, the individual liquid chamber 102 is pressurized through such a vibrating plate 103 as illustrated in FIG. 4 to discharge an ink from the discharge port 105, thereby conducting printing. In the liquid discharge apparatus according to the present invention, the liquid can be evenly discharged at a high speed, and the miniaturization of the apparatus can be attempted.

The embodiment of the printer has been described above. However, the liquid discharge apparatus according to the present invention can be used as an industrial liquid discharge apparatus and a drawing apparatus for an object in addition to printing apparatus such as an ink jet recording apparatus for a facsimile, a multi-functional machine, a copying machine, etc. In addition, a user can select a desired transferring member according to uses. Incidentally, such a constitution that the liquid discharge head is relatively moved to the transferring member placed on a stage as the setting portion may also be taken.

Vibration Wave Motor:

The vibration wave motor according to the present invention includes a vibrating body in which the piezoelectric element is arranged and a moving body coming into contact with the vibrating body.

Figure 7A:
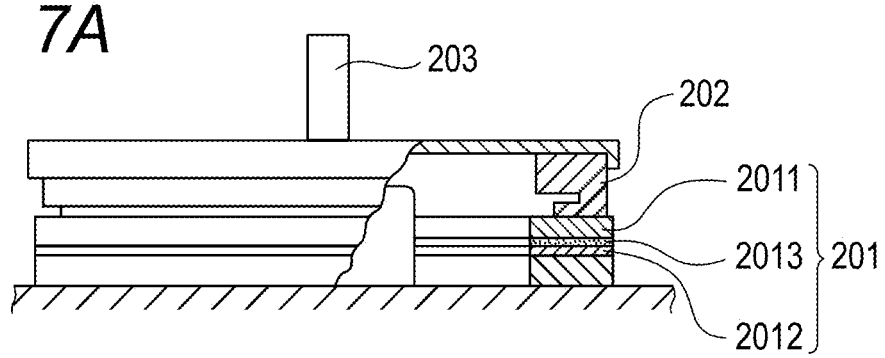
FIGS. 7A and 7B are a schematic view illustrating the structure of an ultrasonic wave motor (single plate structure) according to an embodiment of the present invention (FIG. 3A) and a schematic view illustrating the structure of an ultrasonic wave motor (layered structure) according to another embodiment of the present invention (FIG. 7B).
Figure 7B:
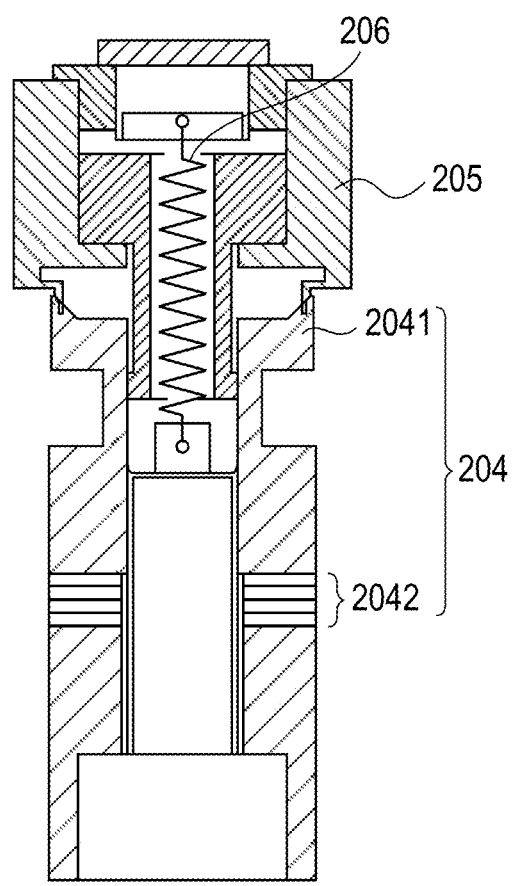

FIGS. 7A and 7B are schematic views illustrating the structures of ultrasonic wave motors which are embodiments of the vibration wave motor according to the present invention.

An ultrasonic wave motor in which the piezoelectric element according to the present invention is composed of a single plane is illustrated in FIG. 7A. Such an ultrasonic wave motor has a vibrator 201 (vibrating body), a rotor 202 (moving body) being in contact with a sliding surface of the vibrator 201 with pressing force of a pressing spring (not illustrated) and an output shaft 203 provided integrally with the rotor 202. The vibrator 201 is composed of a metallic elastic body ring 2011, a piezoelectric element 2012 according to the present invention and an organic adhesive 2013 (for example, epoxy-based or cyanoacrylate-based) for bonding the piezoelectric element 2012 to the elastic body ring 2011. The piezoelectric element 2012 according to the present invention is composed of the piezoelectric material held between a first electrode and a second electrode which are not illustrated.

When a two-phase alternating voltage whose phases differ by an odd multiple of $\pi/2$ are applied to the piezoelectric element according to the present invention, a flexural traveling wave is generated in the vibrator 201, and each point on the sliding surface of the vibrator 201 is elliptically moved. When the rotor 202 is brought into contact under pressure with the sliding surface of this vibrator 201, the rotor 202 receives friction force from the vibrator 201 and rotates in a reverse direction to the flexural traveling wave. A driven body (not illustrated) is joined to the output shaft 203 and driven by rotational force of the rotor 202.

When a voltage is applied to the piezoelectric material, the piezoelectric material is extended and contracted by a piezoelectric transverse effect. When an elastic body such as a metal is joined to the piezoelectric material, the elastic body is bent by the extension and contraction of the piezoelectric material. The ultrasonic wave motor of the kind described here utilizes this principle.

An ultrasonic wave motor including a piezoelectric element having a layered structure is then illustrated in FIG. 7B. A vibrator 204 is composed of a layered piezoelectric element 2042 held in a cylindrical metallic elastic body 2041. The layered piezoelectric element 2042 is an element composed of a plurality of layered piezoelectric materials (not illustrated) and has a first electrode and a second electrode on exterior surfaces of the layered structure and an internal electrode on an interior surface thereof. The metallic elastic body 2041 is fastened by a bolt, and holds and fixes the layered piezoelectric element 2042 to be the vibrator 204 together with this layered piezoelectric element 2042. Needless to say, the layered piezoelectric element 2042 is not limited to the layered piezoelectric element, and a single layer type piezoelectric element may also be used therefor.

When an alternating voltage different in phase is applied to the layered piezoelectric element 2042, the vibrator 204 excites two vibrations orthogonal to each other. These two vibrations are synthesized to form a circular vibration for driving a tip portion of the vibrator 204. Incidentally, a constricted circumferential groove is formed at an upper portion of the vibrator 204 to increase the vibration displacement for driving. The rotor 205 is brought into conduct under pressure with the vibrator 204 by a spring 206 for pressing to obtain friction force for the driving. The rotor 205 is rotatably supported by a bearing.

Optical Instrument:

The optical instrument according to the present invention will now be described. The optical instrument according to the present invention is an optical instrument including a driving portion, wherein the driving portion includes the above-described vibration wave motor.

Figure 8:
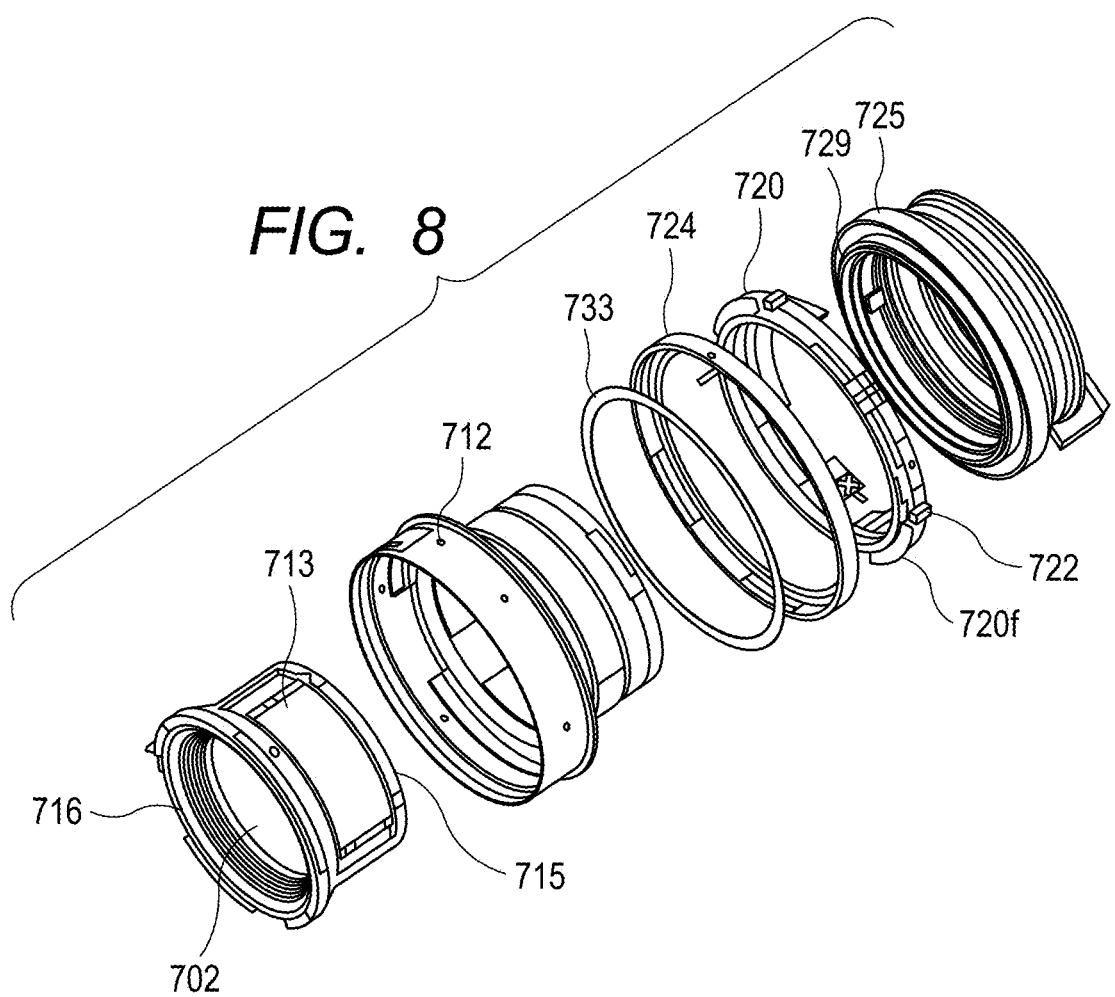
FIG. 8 is a schematic view illustrating the structure of an optical instrument according to an embodiment of the present invention.

FIG. 8 is an exploded perspective view illustrating an interchangeable lens barrel of a single lens reflex camera which is an example of preferred embodiments of the optical instrument according to the present invention. In the interchangeable lens barrel illustrated in FIG. 8, when an ultrasonic wave motor 725 is rotationally driven with respect to a fixed barrel 712 by a control portion (not illustrated), a roller 722 is rotated on the center of a shaft 720f radially extending from a rotation-transmitting ring 720 because a joint member 729 comes into frictional contact with the roller 722. When the roller 722 is rotated on the shaft 720f, the rotation-transmitting ring 720 is consequently rotated on an optical axis (autofocusing operation).

The rotational force thereof is transmitted to a cam ring 715 rotatably fitted on an inner periphery of a lectilinear guide barrel 713 through a focus key (not illustrated). When the cam ring 715 is rotated on the optical axis, a rear group lens barrel 716 rotation-restricted by a cam roller of the rear group lens barrel 716 fittedly provided in a cam groove of the cam ring 715 is advanced or retreated along the cam groove of the cam ring 715. A focus lens 702 held by the rear group lens barrel 716 is thereby driven to conduct a focusing operation.

Incidentally, a manual focusing ring 724 fitted on the fixed barrel 712 through a low friction sheet (washer member) 733 is provided in the interchangeable lens barrel illustrated in FIG. 8 for conducting a manual focusing operation.

As the optical instrument according to the present invention, the interchangeable lens barrel of the single lens reflex camera has been described here. However, the optical instrument according to the present invention can be those having an ultrasonic wave motor in the driving portion, such as a compact camera, an electronic still camera and a portable information terminal with a camera, regardless of the kind of camera.

Vibration apparatus and dust removing apparatus:

A vibration apparatus utilized in conveyance and removal of particles, powders and liquid droplets is widely used in electronic devices and the like. A vibration apparatus using the piezoelectric element according to the present invention will hereinafter be described.

The vibration apparatus according to the present invention includes a vibrating body having a vibrating plate in which the piezoelectric element according to the present invention is arranged. The vibration apparatus according to the present invention can be suitably used as a vibrating portion of, for example, a dust removing apparatus and can effectively remove dust adhering to a surface of the vibrating plate.

Figure 9:
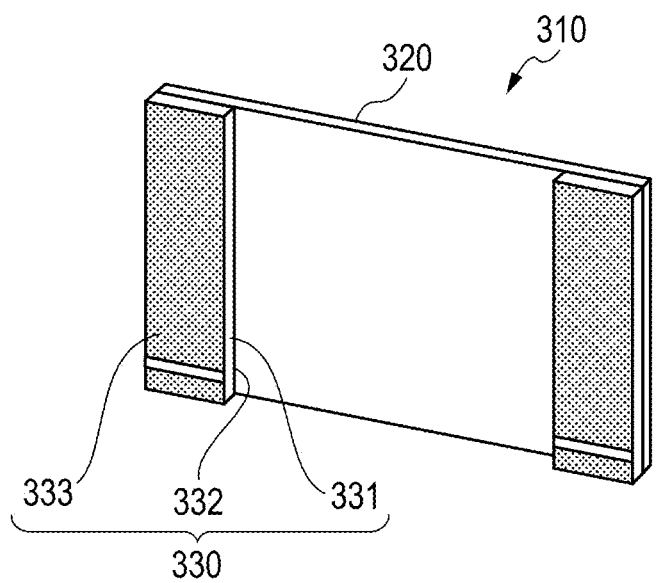
FIG. 9 is a schematic view illustrating the structure of a dust removing apparatus using a vibration apparatus according to an embodiment of the present invention.

FIG. 9 is a schematic view illustrating a vibrating body 310 of the vibration apparatus according to the present invention. The vibrating body 310 is composed of a plate-shaped piezoelectric element 330 and a vibrating plate 320. The piezoelectric element 330 may also be the above-described piezoelectric element according to the present invention.

The material of the vibrating plate 320 is not limited. However, a light transmitting material or a light reflecting material may be used as the vibrating plate 320 when the vibrating body 310 is used in an optical device. When the light transmitting material or the light reflecting material is used as the vibrating plate, a light transmitting portion or a light reflecting portion of the vibrating plate is an object for dust removal.

The piezoelectric element 330 is composed of a piezoelectric material 331, a first electrode 332 and a second electrode 333 as illustrated in FIG. 9, and the first electrode 332 and the second electrode 333 are arranged so as to respectively face both surfaces of the piezoelectric material 331. The piezoelectric element 330 may also be the above-described layered piezoelectric element according to the present invention. In that case, the piezoelectric material 331 takes an alternate structure of piezoelectric materials and internal electrodes, and the internal electrodes are alternately short-circuited to the first electrode 332 or the second electrode 333, whereby drive waveforms having different phases from each other can be given to the respective layers of the piezoelectric materials.

The piezoelectric element 330 and the vibrating plate 320 are fixed to each other in such a manner that a surface of the first electrode 332 of the piezoelectric element 330 comes into contact with a surface of the vibrating plate 320 as illustrated in FIG. 9. Stress is generated between the piezoelectric element 330 and the vibrating plate 320 by driving the piezoelectric element 330 to generate an out-of-plane vibration in the vibrating plate 320.

The vibration apparatus according to the present invention which has the vibrating body 310 is used as a vibrating portion of a dust removing apparatus, whereby foreign matter such as dust adhering to a surface of the vibrating plate 320 can be effectively removed by the out-of-plane vibration of this vibrating plate 320. The out-of-plane vibration means an elastic vibration by which the vibrating plate is displaced in a direction of an optical axis, that is, a thickness-wise direction of the vibrating plate.

Figure 10A:
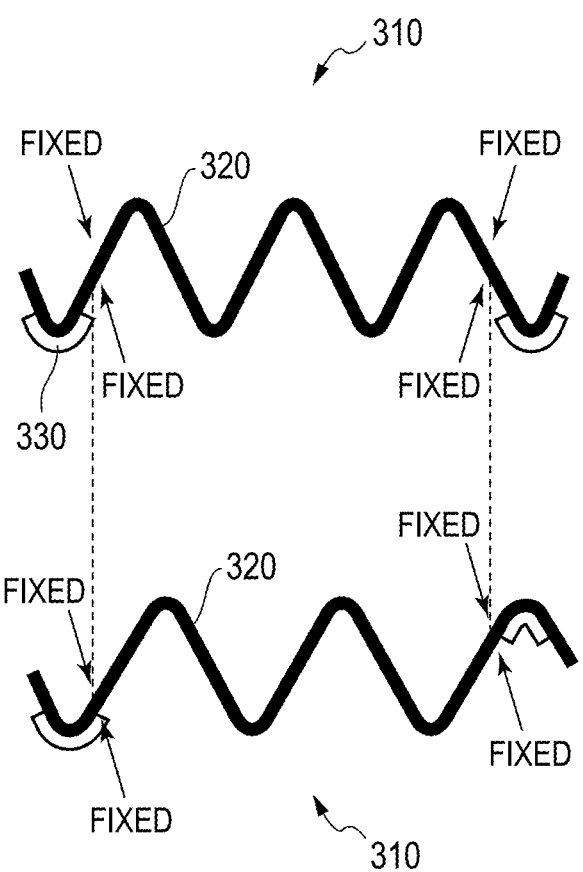
FIGS. 10A and 10B are a typical view illustrating an exemplary vibration principle (seventh-order vibration mode) of the dust removing apparatus according to the present invention (FIG. 10A) and a typical view illustrating another exemplary vibration principle (sixth-order vibration mode) of the dust removing apparatus according to the present invention (FIG. 10B).
Figure 10B:
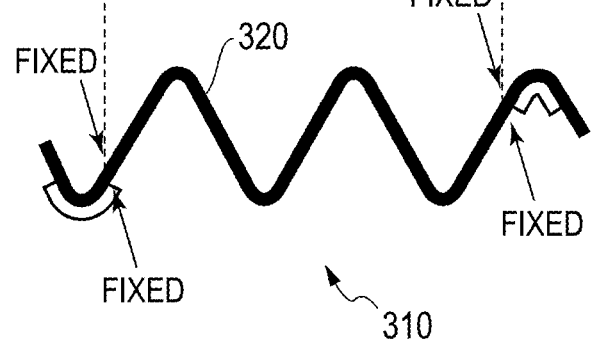

FIGS. 10A and 10B are typical views illustrating the vibration principles of the vibrating body 310. FIG. 10A illustrates a state of having caused the vibrating plate 320 to generate an out-of-plane vibration by applying an alternating voltage of the same phase to a pair of left and right piezoelectric elements 330. The polarization direction of the piezoelectric material constituting the pair of the left and right piezoelectric elements 330 is the same as a thickness-wise direction of the piezoelectric elements 330. The vibrating body 310 illustrated in FIG. 10A is driven by a seventh-order vibration mode. FIG. 10B illustrates a state of having caused the vibrating plate 320 to generate an out-of-plane vibration by applying an anti-phase alternating voltage whose phase is 180° inverted to the pair of the left and right piezoelectric elements 330. The vibrating body 310 illustrated in FIG. 10B is driven by a sixth-order vibration mode. In the dust removing apparatus using the vibration apparatus according to the present invention which has such a vibrating body 310 in the vibrating portion, at least two vibration modes are properly used, whereby the dust adhering to the surface of the vibrating plate can be effectively removed.

Imaging Apparatus:

The imaging apparatus according to the present invention will now be described. The imaging apparatus according to the present invention is an imaging apparatus including an imaging unit composed of the above-described dust removing apparatus and an imaging element unit for receiving light, wherein the vibrating plate provided in the dust removing apparatus is arranged on the side of a light receiving surface of the imaging element unit.

Figure 11:
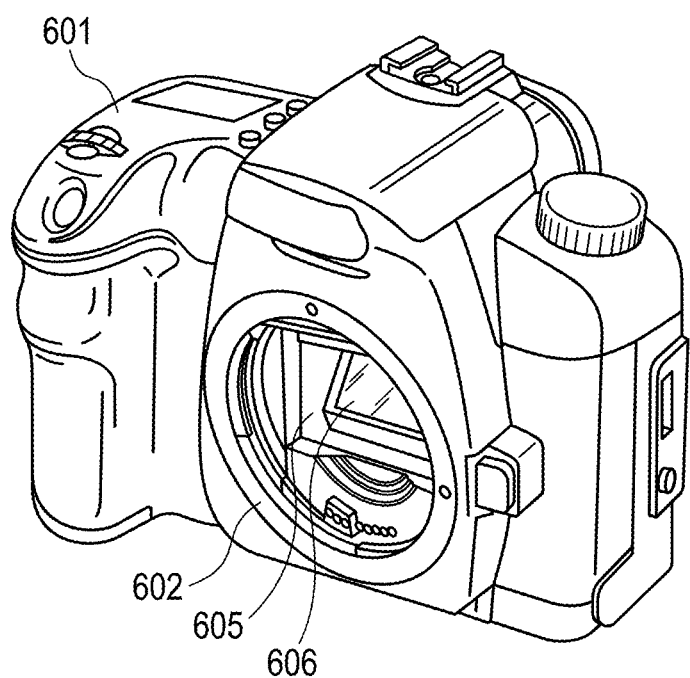
FIG. 11 is a schematic view illustrating the structure of an imaging apparatus according to an embodiment of the present invention.
Figure 12:
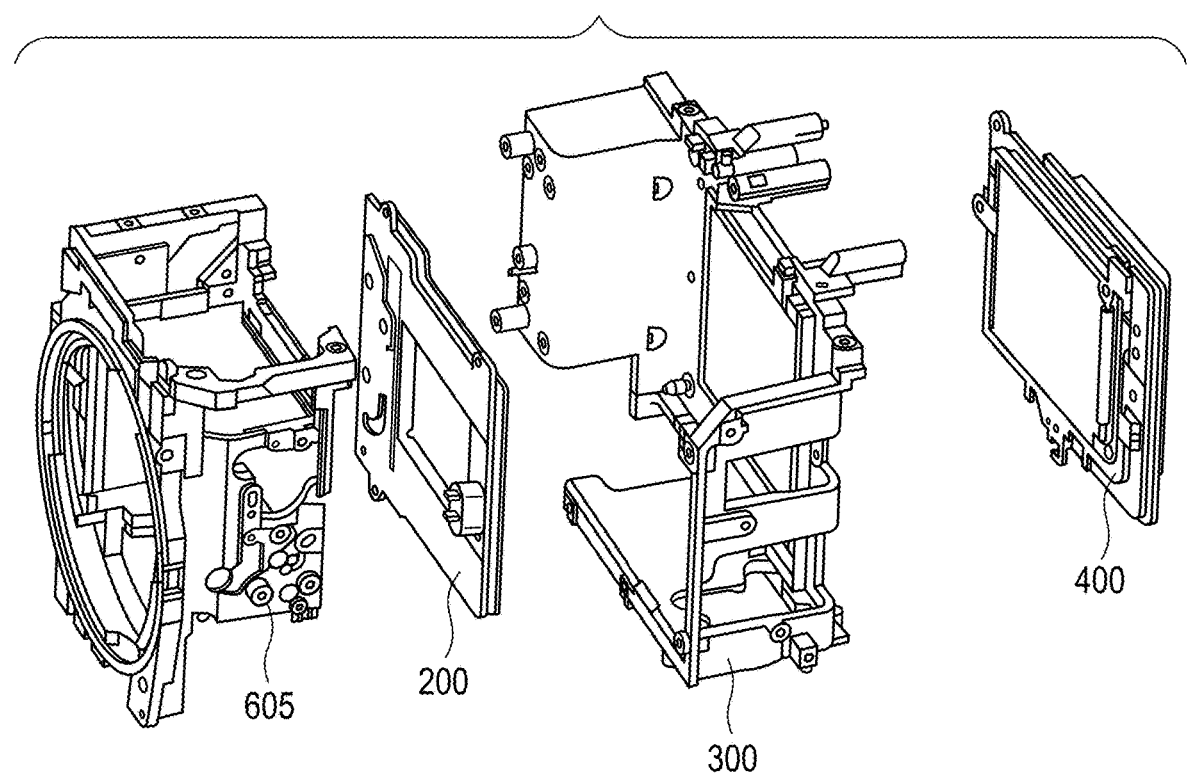
FIG. 12 is a schematic view illustrating the structure of an imaging apparatus according to another embodiment of the present invention.

FIGS. 11 and 12 illustrate a digital single lens reflex camera which is an example of preferred embodiments of the imaging apparatus according to the present invention. FIG. 11 is a front side perspective view when a camera body 601 is viewed from the side of an object with the photographic lens unit removed. FIG. 12 is an exploded perspective view illustrating a schematic structure of the interior of the camera for explaining a peripheral structure of an imaging unit 400 including the dust removing apparatus according to the present invention.

A mirror box 605 to which imaging luminous flux passed through a photographic lens is guided is provided in the camera body 601 illustrated in FIG. 11, and a main mirror (quick return mirror) 606 is arranged in the mirror box 605. The main mirror 606 may take a state of being held at an angle of 45° to an imaging optical axis for guiding the imaging luminous flux in a direction of a penta roof mirror (not illustrated) or a state of being held at a position retreated from the imaging luminous flux for guiding it in a direction of an imaging element (not illustrated).

In FIG. 12, the mirror box 605 and a shutter unit 200 are arranged in this order from the object side on the side of the object of a body chassis 300 which is a frame of the camera body. In addition, the imaging unit 400 is arranged on the side of a photographer of the body chassis 300. The imaging unit 400 is composed of the dust removing apparatus according to the present invention and the imaging element unit. The vibrating plate of the dust removing apparatus is arranged on the side of the light receiving surface on the same axis as that of the light receiving surface of the imaging element unit. The imaging unit 400 is arranged at a mounting surface of a mounting portion 602 (FIG. 11) which serves as a base for mounting the photographic lens unit and is adjusted in such a manner that an imaging surface of the imaging element unit is spaced by a predetermined distance from the photographic lens unit and runs parallel with the photographic lens unit.

As the imaging apparatus according to the present invention, the digital single lens reflex camera has been described here. However, the camera may also be, for example, a photographic lens unit interchangeable camera such as a mirrorless digital single lens camera having no mirror box 605. In addition, the imaging apparatus according to the present invention may also be applied particularly to instruments which need to remove dust adhering to a surface of an optical part among a variety of imaging apparatus or electronic devices including the imaging apparatus, such as an imaging lens unit interchangeable video camera, a copying machine, a facsimile and a scanner.

Electronic Device:

The electronic device according to the present invention will now be described. The electronic device according to the present invention includes a piezoelectric sound component having the piezoelectric element according to the present invention. The piezoelectric sound component includes a speaker, a buzzer, a microphone and a surface acoustic wavefilter (SAW) element.

Figure 13:
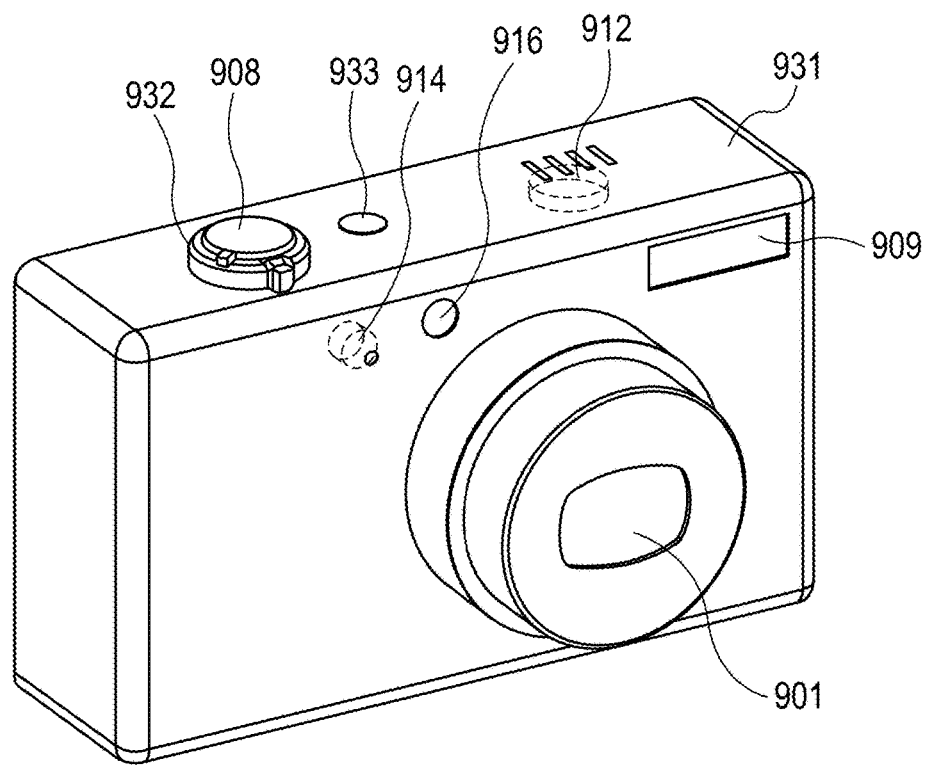
FIG. 13 is a schematic view illustrating the structure of an electronic device according to an embodiment of the present invention.

FIG. 13 is an entire perspective view of a body 931 of a digital camera which is an example of embodiments of the electronic device according to the present invention when viewed from the front.

An optical device 901, a microphone 914, a stroboscopic light emitting portion 909 and an auxiliary light portion 916 are arranged in the front of the body 931. Since the microphone 914 is illustrated with a broken line because it is built in the interior of the body. A hole for picking up a sound from the exterior is provided in the front of the microphone (front side of the body 931).

A power button 933, a speaker 912, a zoom lever 932 and a release button 908 for performing a focusing operation are arranged on an upper surface of the body 931. The speaker 912 is built in the interior of the body 931 and is thus illustrated with a broken line. A hole for transmitting voice to the exterior is provided in the front of the speaker 912 (upper side of the body 931).

The piezoelectric sound component including the piezoelectric element according to the present invention is used in at least one of the microphone 914 and the speaker 912.

As the electronic device according to the present invention, the digital camera has been described here. However, the electronic device according to the present invention may also be applied to a variety of electronic devices having the piezoelectric sound component, such as a voice reproduction instrument, a voice recording instrument, a mobile phone and an information terminal.

As described above, the piezoelectric element according to the present invention is suitably used in the liquid discharge head, the liquid discharge apparatus, the vibration wave motor, the optical instrument, the vibration apparatus, the dust removing apparatus, the imaging apparatus and the electronic device.

The piezoelectric element according to the present invention is used, whereby a liquid discharge head having a nozzle density and a discharge speed which are comparable to or higher than the case where a lead-containing piezoelectric element is used can be provided.

The liquid discharge head according to the present invention is used, whereby a liquid discharge apparatus having discharge speed and discharge accuracy which are comparable to or higher than the case where a lead-containing piezoelectric element is used can be provided in a good yield.

The piezoelectric element according to the present invention is used, whereby a vibration wave motor having driving force and durability which are comparable to or higher than the case where a lead-containing piezoelectric element is used can be provided.

The vibration wave motor according to the present invention is used, whereby an optical instrument having durability and operation accuracy which are comparable to or higher than the case where a lead-containing piezoelectric element is used can be provided.

The piezoelectric element according to the present invention is used, whereby a vibration apparatus having vibration power and durability which are comparable to or higher than the case where a lead-containing piezoelectric element is used can be provided.

The vibration apparatus according to the present invention is used, whereby a dust removing apparatus having dust removal efficiency and durability which are comparable to or higher than the case where a lead-containing piezoelectric element is used can be provided.

The dust removing apparatus according to the present invention is used, whereby an imaging apparatus having a dust removing function which is comparable to or higher than the case where a lead-containing piezoelectric element is used can be provided.

The piezoelectric sound component including with the piezoelectric element according to the present invention is used, whereby an electronic device having pronounceability which is comparable to or higher than the case where a lead-containing piezoelectric element is used can be provided.

The piezoelectric element according to the present invention can be used in piezoelectric apparatus such as an ultrasonic vibrator, a piezoelectric actuator, a piezoelectric sensor, a ferroelectric memory and a power generating unit in addition to the liquid discharge head and the motors.

EXAMPLES

The present invention will hereinafter be described more specifically by Examples. However, the present invention is not limited by the following Examples.

Examples 1 to 6 and Comparative Examples 1 to 5

Preparation Step:
Bi which was a first subcomponent and Mn which was a second subcomponent were added into a metal oxide represented by the general formula (1) $(Ba_{1-x}M1_x)(Ti_{1-y}M2_y)O_3$ of the composition of x=0 and y=0 in which the metal elements M1 and M2 were not added, that is, $BaTiO_3$ to prepare piezoelectric materials. First, metal oxide piezoelectric materials whose Mn content was 0.5 mol % with respect to $BaTiO_3$ and whose Bi contents were 0.1 mol %, 0.2 mol %, 0.3 mol %, 0.4 mol % and 0.5 mol %, respectively, were prepared as Examples 1 to 5. In order to make the amounts of the additives clearly understandable, the names of these materials in Examples 1 to 5 are referred to as "$BaTiO_3$: Mn:Bi (x %)". Here, "x %" indicates the Bi content (mol %). Similarly, a material $BaTiO_3$ as Comparative Example 1 in which neither Bi nor Mn was added, a material as Comparative Example 2 in which Mn was not added into $BaTiO_3$, and only Bi was added in an amount of 0.4 mol % (material name "$BaTiO_3$:Bi(0.4%)"), and materials as Comparative Examples 3 and 4 in which Bi was not added into $BaTiO_3$, and only Mn was added in amounts of 0.3 mol % and 0.5 mol %, respectively, (material names "$BaTiO_3$:Mn(0.3%)" and "$BaTiO_3$:Mn(0.5%)") were prepared. In addition, in order to confirm the effect of Bi, materials in which a half amount and the whole amount of Bi in $BaTiO_3$:Mn:Bi(0.5%) were replaced by La which was also positive trivalent and had almost the same ionic radius were prepared as Example 6 (material name "$BaTiO_3$: Mn: (Bi,La)") and Comparative Example 5 (material name "$BaTiO_3$:Mn:La"), respectively. The preparation procedure will hereinafter be described.

Barium titanate powder (average particle diameter: 100 nm, purity: 99.99% or more), bismuth oxide ($Bi_2O_3$) powder (average particle diameter: 1 μm, purity: 99.999% or more) and manganese dioxide ($MnO_2$) powder (average particle diameter: 1 μm, purity: 99.99% or more) were weighed in such a manner that the ratio of Ba, Ti, Mn and Bi was a desired value. These powders were put into a zirconia-made pot for a planetary ball mill, zirconia-made balls (almost equally mixed mixture of balls having a diameter of 1 mm and balls having a diameter of 3 mm) which had almost the same bulk (volume) as the weighed raw material powders and ethanol in such an amount that all the raw material powders and balls were immersed were further added into the pot, a resin-made packing was put between the pot and a lid, and the lid was closed. The pot was set in the planetary ball mill, the pot and the lid were tightly held down by a presser jig accompanying the mill so as to prevent the powders and ethanol from overflowing from a gap between the pot and the lid during operation, and rotation and revolution were conducted for 12 hours at a rate of 500 revolutions per minute to sufficiently mix the raw material powders while applying strong shearing stress thereto.

After the mixing by the planetary ball mill was completed, the contents in the pot were taken out, and the zirconia-made balls were removed therefrom, thereby obtaining mixed raw material powder dispersed in ethanol. PVB (polyvinyl butyral) as a binder was dissolved in ethanol and added into the mixed raw material powder dispersion in such a manner that the amount of PVB was 3 parts by weight with respect to the total weight, 100 parts by weight, of the mixed raw material powder. Ethanol was evaporated while stirring and mixing the resultant mixture, thereby causing the binder to adhere to the mixed raw material powder to prepare granulated powder. In this granulation step, even when PVA (polyvinyl alcohol) as a binder was caused to adhere to the surface of the mixed raw material powder by using a spray dryer in such a manner that the amount of PVA was 3 parts by weight with respect to the total weight, 100 parts by weight, of the mixed raw material powder, thereby granulating the powder, the results obtained were the same.

The thus-obtained granulated powder was then filled into a mold to prepare a disc-shaped molded article by applying a molding pressure of 200 MPa by means of a press molding machine. After the resultant molded article was put into an atmosphere-variable electric furnace and first heated and held at 600° C. under an air atmosphere, the temperature was further raised to 1,350° C. to hold the molded article for 4 hours. Cooling was conducted by radiational cooling. A disc-shaped sintered body (polycrystalline ceramic) was obtained by the above-described step. This sintered body was used as a piezoelectric material according to the present invention.

The Bi content and Mn content in the resultant material were estimated by an ICP atomic emission spectral analysis and an ICP mass spectrometry. The results thereof are as shown in Table 1, and a material having Bi and Mn contents almost as planed was obtained.

Figure 14A:
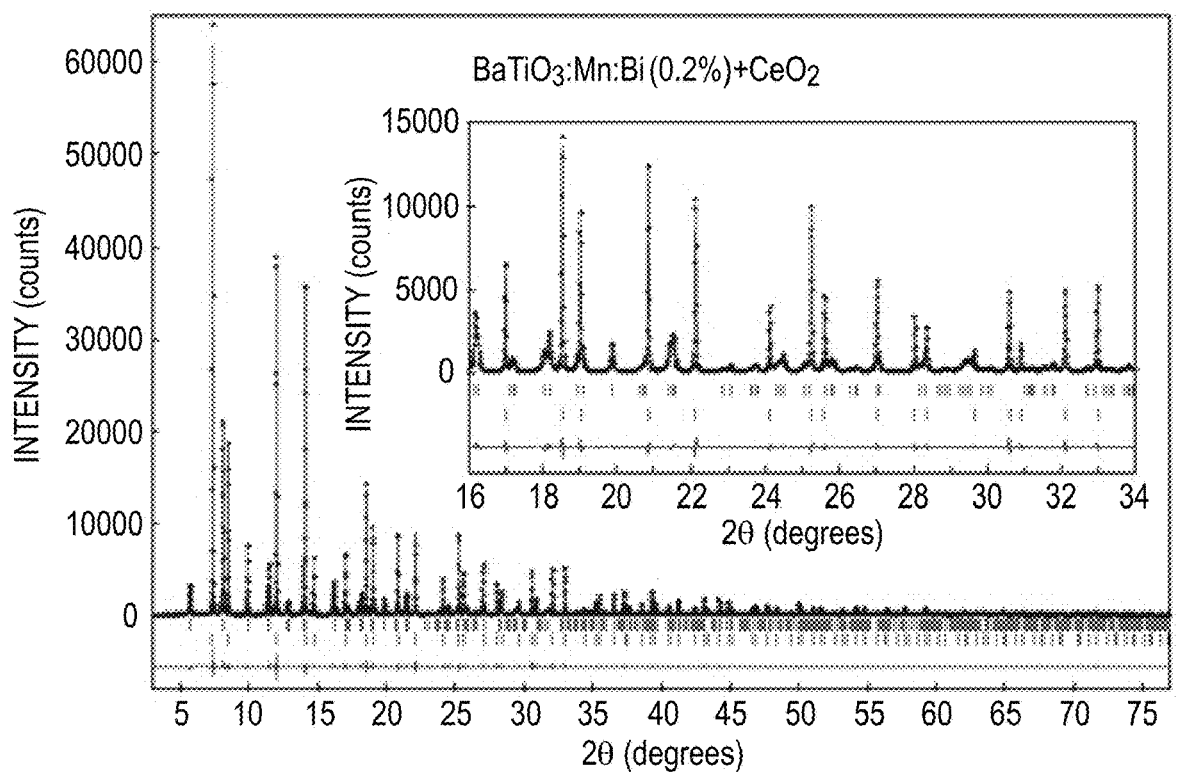
FIGS. 14A and 14B illustrate X-ray diffraction charts of a piezoelectric material in Example 2 of the present invention.
Figure 14B:
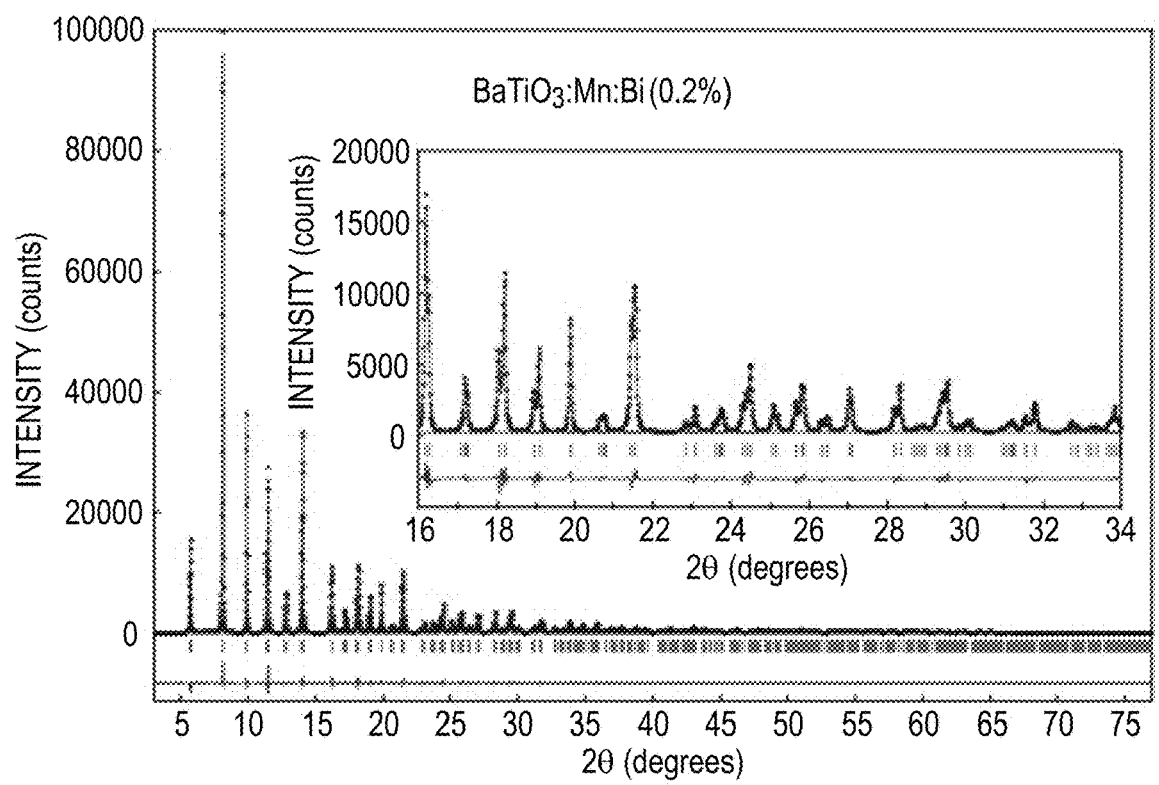

X-Ray Diffraction:
A part of the resultant material was ground into fine powder to subject the powder to an X-ray diffraction measurement. A bending magnet synchrotron radiation X-ray source was used to conduct the measurement at room temperature with an X-ray monochromatized to a wavelength of 0.39984 Å or 0.39987 Å at a 2θ angle step of 0.01° by the Debye-Scherrer method. The resultant X-ray diffraction chart was analyzed. As a result, regarding all the materials, highly reliable analyzed results were obtained by assuming a single tetragonal perovskite-type crystal structure. It was thus found that the main phase had a single tetragonal perovskite-type crystal structure. In addition, it was able to confirm that other phases than the main phase were present only in very small amounts. As a representative, an X-ray diffraction chart of $BaTiO_3$:Mn:Bi(0.2%) (Example 2) is illustrated in FIG. 14B. FIG. 14A illustrates a powder X-ray diffraction chart of a powder sample in which a $CeO_2$ standard sample whose crystal structure and lattice constant were already known was mixed for the purpose of precisely determining the lattice constant. The results of the lattice constants a and c, atomic displacement parameters B and coordinates z, reliability parameters ($R_{wp}$, S, $R_B$, $R_F$), and mixing ratios (fraction) which were obtained by subjecting the measurement data of the powder sample in which the $CeO_2$ standard sample was mixed to a Rietveld analysis are shown in Table 2. The lattice constants a and c of the respective materials were determined by this analysis. FIG. 14B illustrates a powder X-ray diffraction chart obtained by measurement without mixing the $CeO_2$ standard sample. This measurement data and the values of the lattice constants a and c precisely determined by the above-described analysis were used as fixed values to conduct the Rietveld analysis again, thereby determining atomic displacement parameters B and coordinates z of a Ba site, a Ti site and two oxygen sites (O1 and O2). The results thereof are shown in Table 3.

Figure 15A:
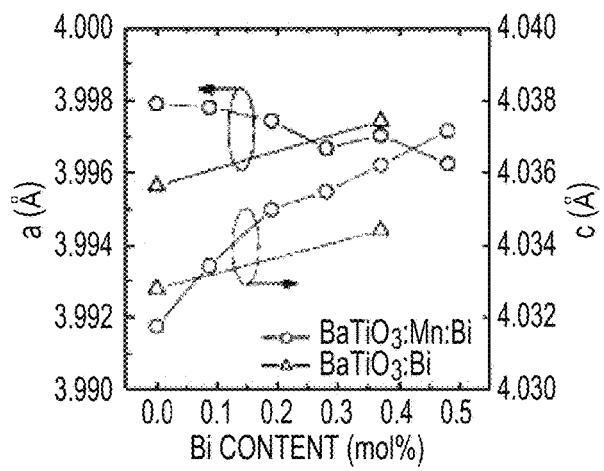
FIGS. 15A, 15B, 15C and 15D illustrate the lattice constants and lattice volumes of piezoelectric materials of Examples 1 to 6 and Comparative Examples 1 to 5 of the present invention.
Figure 15B:
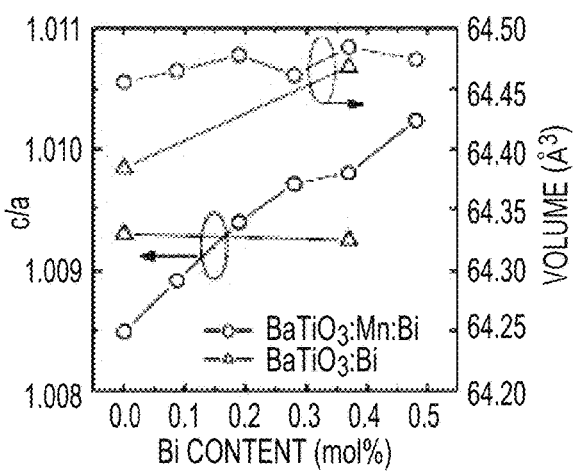
Figure 15C:
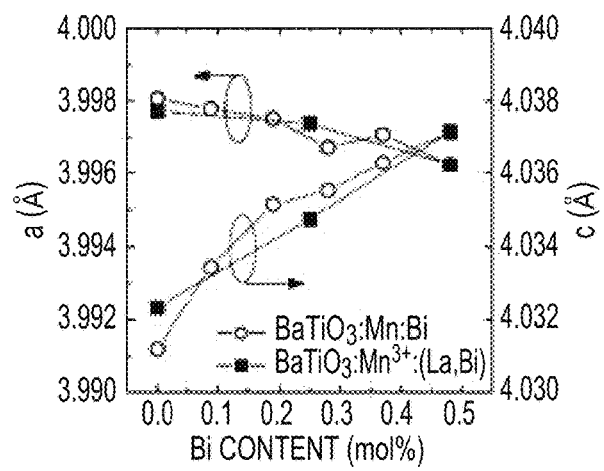
Figure 15D:
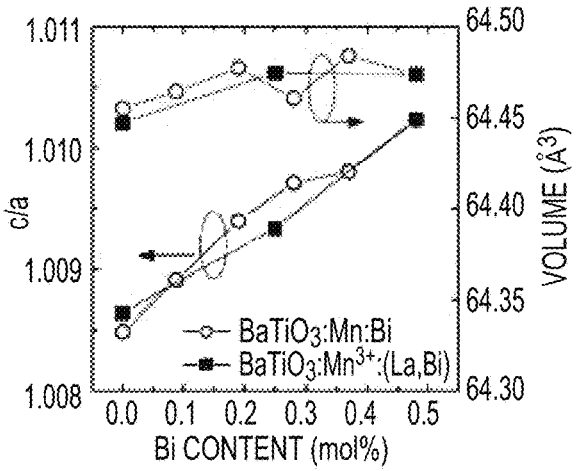

The evaluated results of the lattice constants a and c shown in Table 2 are illustrated in FIGS. 15A and 15C, and the Bi content dependence of the lattice constant ratio c/a obtained therefrom and the lattice volume is illustrated in FIGS. 15B and 15D. It was found from FIGS. 15A and 15B that with an increase of the Bi content in the material containing both Bi and Mn in $BaTiO_3$, the lattice constant a tends to decrease, while the lattice constant c increases and the lattice constant ratio c/a increases. This can be presumed to be attributable to generation of a local electric polarization in a c-axis direction which is a polarization axis of $BaTiO_3$ which is a ferroelectric material due to the presence of the Bi atom at a biased position, whereby the spontaneous polarization of $BaTiO_3$ is increased to increase tetragonal anisotropy. On the other hand, the results of the material obtained by replacing a part or the whole of Bi by La are illustrated in FIGS. 15C and 15D. It is found from these that changes in the lattice constants a and c and the lattice constant ratio c/a depend on the Bi content though the content of positive trivalent (La+Bi) is constant. In other words, it was confirmed that the increase in the tetragonal anisotropy is not caused by a certain effect due to doping of a positive trivalent donor (for example, a Jahn-Teller effect by change of the valence of Mn to positive trivalence), but Bi plays a role of exhibiting its effect. In other words, this is thought to be an effect to generate the local electric polarization by a lone electron pair of Bi.

Figure 16A:
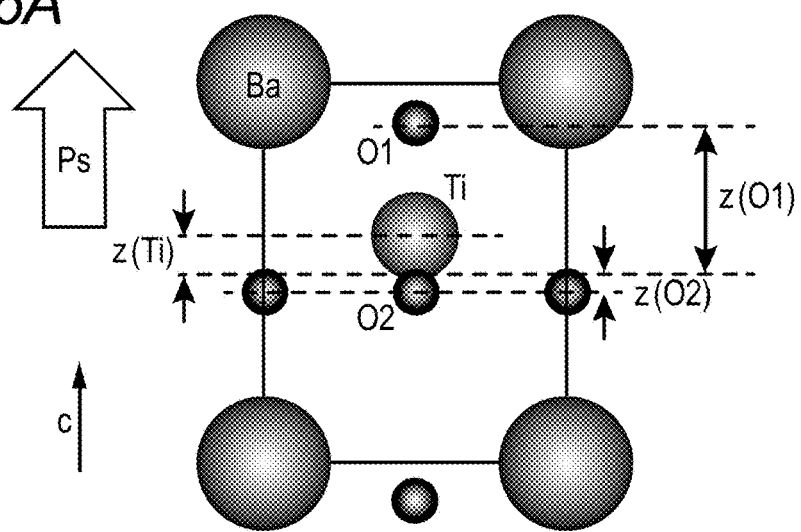
FIGS. 16A, 16B and 16C are a typical view illustrating the crystal lattices and atomic coordinates of piezoelectric materials of Examples 1 to 5 and Comparative Examples 1 and 2 of the present invention (FIG. 16A), a view illustrating spontaneous polarization values calculated from the atomic coordinates (FIG. 16B) and a view illustrating atomic displacement parameters (FIG. 16C).
Figure 16B:
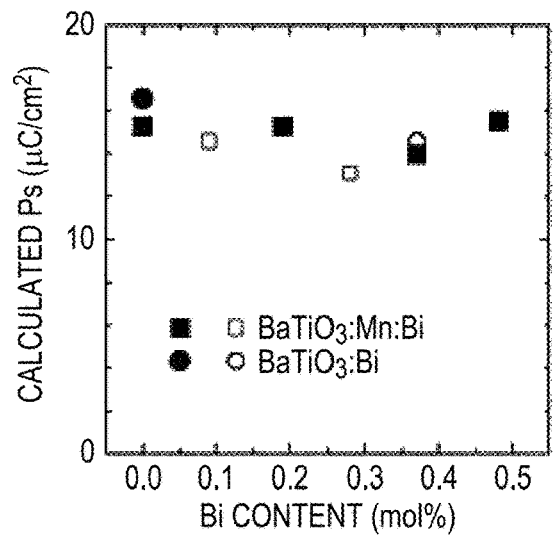
Figure 16C:
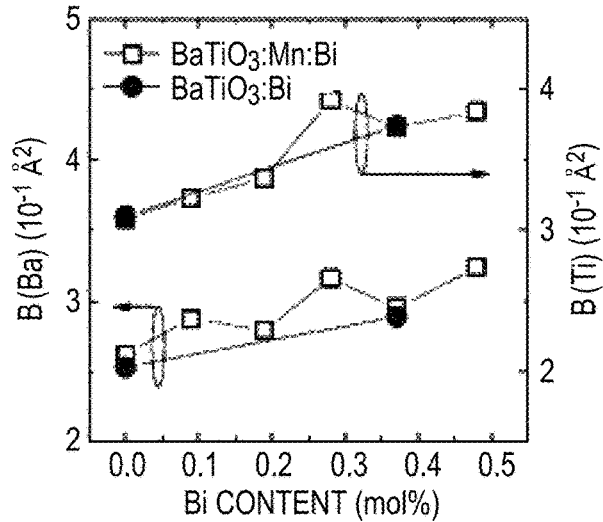

FIG. 16A is a schematic view for explaining the atomic coordinates z shown in Tables 2 and 3. In the Rietveld analysis of Tables 2 and 3, the Ba site was fixed to represent relative position displacements of the Ti site and the two O sites (O1 and O2) in terms of respective coordinates z. Assuming that charges which are present at the Ba site, the Ti site, the O1 site and the O2 site are point charges, the magnitude of the spontaneous polarization can be estimated from the value of the coordinate z. The Bi content dependence of the magnitude of the spontaneous polarization of the respective materials estimated by using the z values in Table 3 is illustrated in FIG. 16B. As illustrated in FIGS. 15A to 15B, the tetragonal anisotropy is markedly increased by the increase of Bi. However, the magnitude of the spontaneous polarization is not so changed by the increase of Bi, and an effect to markedly increase the spontaneous polarization due to Bi was unable to recognize as a numerical value. The Bi content dependence of the atomic displacement parameters B shown in Table 3 is illustrated in FIG. 16C. It can be easily understood that the value of the atomic displacement parameter B in the Ba site is raised by an increase of Bi which is present at a biased position, that is, the distribution of atom positions is large. On the other hand, it is interesting that the value of the atomic displacement parameter B in the Ti site is also raised with the increase of the Bi content. In other words, the atom positions in the Ti site are also disordered by Bi. This is also considered that the local electric polarization around Bi has a possibility of exerting some influence on Ti which is originally a main bearer of the generation of the spontaneous polarization of $BaTiO_3$, and this contributes to stabilization of the macroscopic polarization.

Figure 17A:
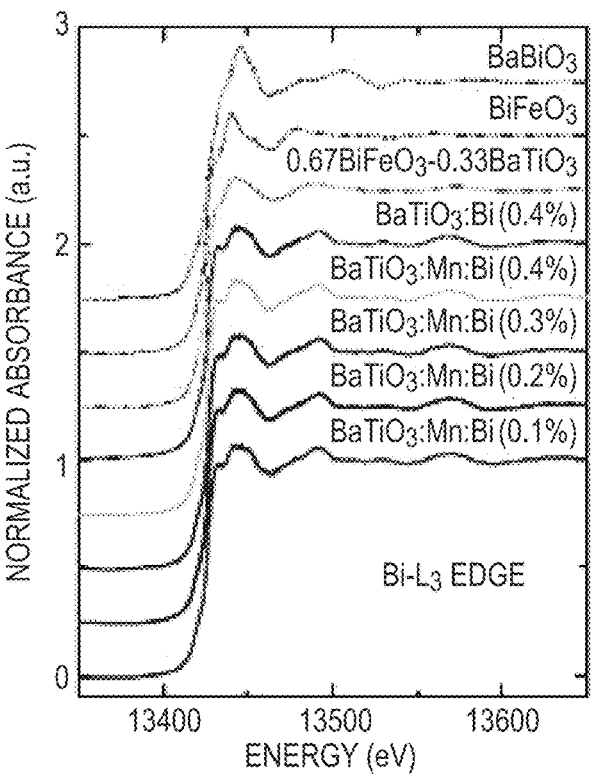
FIGS. 17A, 17B and 17C illustrate XANES spectra (FIG. 17A), EXAFS spectra (FIG. 17B) and radial structure functions (FIG. 17C) obtained by the Bi-$L_3$ XAFS measurement of piezoelectric materials of Examples 1 to 4 and Comparative Example 2 of the present invention as well as reference materials.

XAFS:

A surface of a part of the thus-obtained sintered body of the piezoelectric material was polished to use it for a fluorescence XAFS measurement. $L_3$ absorption XAFS of Bi contained in the piezoelectric material according to the present invention and K absorption XAFS of Mn are desirably measured by using high-luminance synchrotron radiation X-rays by a fluorescence method (fluorescence XAFS) which is a high-sensitivity measurement. Bi-$L_3$ XAFS of $BaTiO_3$:Mn:Bi(0.1 to 0.4%) materials which were Examples 1 to 4 and of $BaTiO_3$:Bi(0.4%) material which was Comparative Example 2 were measured by the fluorescence method. A bending magnet synchrotron radiation X-ray source was used to irradiate a sample surface with an X-ray monochromatized to 13.1 keV to 14.3 keV with a (311) plane of Si while sweeping X-ray energy at an angle of 45° from a sample surface, and Bi-$L_3$ fluorescence emitted from the sample was detected by using a 19-element Ge semiconductor detector arranged at an angle of 45° in a reverse direction from the sample surface, that is, at an angle of 90° to the incident X-ray through the sample surface, thereby conducting the fluorescence XAFS measurement. The intensity of the fluorescence X-ray measured by the semiconductor detector was subjected to a standardization processing with the intensity of the incident X-ray monitored at the same time to obtain a measured spectrum. In addition, as standard samples, $BaBiO_3$ in which Bi lies in the B site of the perovskite-type structure to be positive tetravalent on average, $BiFeO_3$ in which Bi lies in the A site of the perovskite-type structure to be positive trivalent and $0.67BiFeO_3$-$0.33BaTiO_3$ solid solution in which Bi similarly lies in the A site of the perovskite-type structure to be positive trivalent were also subjected to the Bi-$L_3$ XAFS measurement. An enlarged view in the vicinity of absorption edges of Bi-$L_3$ XAFS spectra of the above-described materials and the standard samples (XANES spectra) is illustrated in FIG. 17A. When the Bi-$L_3$ XANES spectra of the $BaTiO_3$:Mn:Bi(0.1 to 0.4%) materials are compared with the Bi-$L_3$ XANES spectrum of $BaBiO_3$, it is found that both absorption edge energy and spectral shape differ from each other. On the other hand, when compared with the Bi-$L_3$ XANES spectra of $BiFeO_3$ and the solid solution $0.67BiFeO_3$-$0.33BaTiO_3$, both absorption edge energy and spectral structures resemble closely one another. It is understood from this that Bi in the $BaTiO_3$:Mn:Bi(0.1 to 0.4%) materials lies in the A site to be positive trivalent.

Figure 17B:
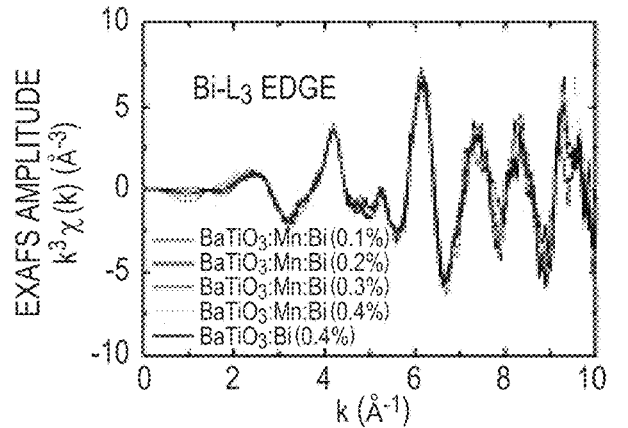

EXAFS spectra obtained by extracting the vibration structures of XAFS spectra above Bi-$L_3$ absorption edge energy of the $BaTiO_3$:Mn:Bi(0.1 to 0.4%) materials and the $BaTiO_3$:Bi(0.4%) material are illustrated in FIG. 17B. Those obtained by Fourier-transforming these spectra are radial structure functions illustrated in FIG. 17C. Here, a peak present at r=1.8 Å is a peak attributable to a Bi—O bond, and a peak present in the vicinity of r=3.0 Å is a peak attributable to a Bi—Ti bond. These peak structures are analyzed by fitting, whereby bond lengths of the Bi—O bond and the Bi—Ti bond and information of a coordination number can be obtained. A Bi radial structure function of the $BaTiO_3$:Mn:Bi(0.4%) material as a representative and a curve reproduced by fitting thereof are illustrated at a lower portion in the view of FIG. 17C. It is found that both agree very well with each other.

Figure 17C:
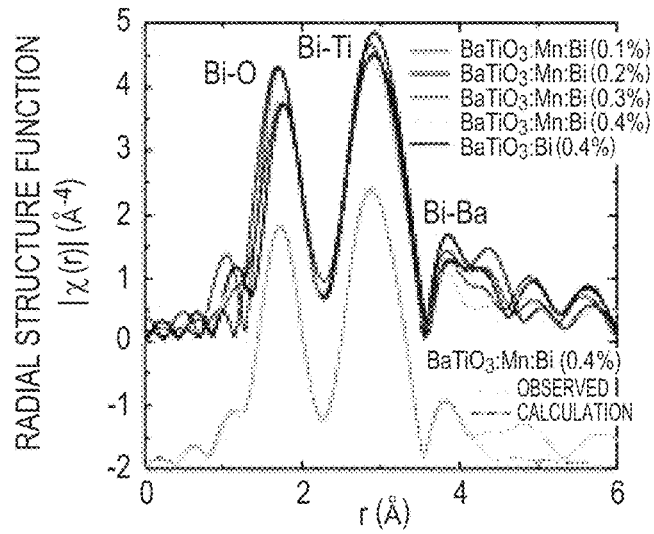

A coordination environment around Bi (Bi—O bond lengths, Bi—Ti bond lengths, Bi—Ba bond lengths and respective coordination numbers) of the $BaTiO_3$:Mn:Bi (0.4%) material obtained from the fitting curve illustrated at the lower portion in the view of FIG. 17C is shown in Table 4. In the Bi—O bond which has a coordination number of twelve, the fitting was able to be successfully conducted with a model of three bond lengths in which there are four bonds of each length. For example, when two bond lengths are assumed to conduct the fitting, such fitting results with a small reliability parameter R as shown in Table 4 were not obtained even if any lengths and respective coordination numbers are assumed (the reliability of the fitting is higher as the value of the reliability parameter R is smaller). In addition, also regarding the Bi—Ti bond, the fitting was able to be successfully conducted with a model of two bond lengths in which there are four bonds of each length. Regarding both Bi—O and Bi—Ti, the fitting can also be conducted by further dividing each group of the four bonds. However, the fitting results thereof are not specially improved compared with the results shown in Table 4. In addition, the bond lengths in each group of the four bonds were not so changed. The Bi coordination environments of the four Bi—O bonds in each of the three bond lengths and of the four Bi—Ti bond in each of the two bond lengths suggest that the Bi atom position is biased in the c-axis direction in the A site of the tetragonal perovskite-type structure. Assuming that the Bi—O bond lengths of the BaTiO$_3$:Mn:Bi(0.4%) material are $L_1$ to $L_{12}$ in length order, their lengths satisfy $L_1=L_2=L_3=L_4=3.045$ Å, $L_5=L_6=L_7=L_8=2.738$ Å, $L_9=L_{10}=L_{11}=L_{12}=2.254$ Å, and $(L_4-L_5)/L_5=0.11$, $(L_8-L_9)/L_9=0.21$ and $(L_1-L_{12})/L_{12}=0.35$. In addition, assuming that the Bi—Ti bond lengths thereof are $D_1$ to $D_8$ in length order, their lengths satisfy $D_1=D_2=D_3=D_4=3.698$ Å and $D_5=D_6=D_7=D_8=3.295$ Å, and $(D_4-D_5)/D_5=0.12$. This means that Bi is relatively greatly shifted in the c-axis direction from the A-site position of the perovskite-type structure. FIG. 1 is a view in which the Bi position of the perovskite-type structure is illustrated so as to meet this condition. Herein, Ti in the B site is placed in respective lattice points, and Bi is placed in the vicinity of a center of the lattice. However, when the Bi arrangement is adjusted so as to satisfy the bond lengths (coordination environment) shown in Table 4, it is found that the Bi position is relatively greatly biased in the c-axis direction from the central position of the lattice as illustrated in FIG. 1. A coordination environment around Bi obtained by the fitting of the Bi radius structure function of the BaTiO$_3$:Bi (0.4%) material is similarly shown in Table 4. It is understood from this that the coordinate environment is almost the same as the coordination environment of the BaTiO$_3$:Mn:Bi(0.4%) material. In addition, even in the BaTiO$_3$:Mn:Bi (0.1 to 0.3%) materials, almost the same results are obtained.

Figure 18:
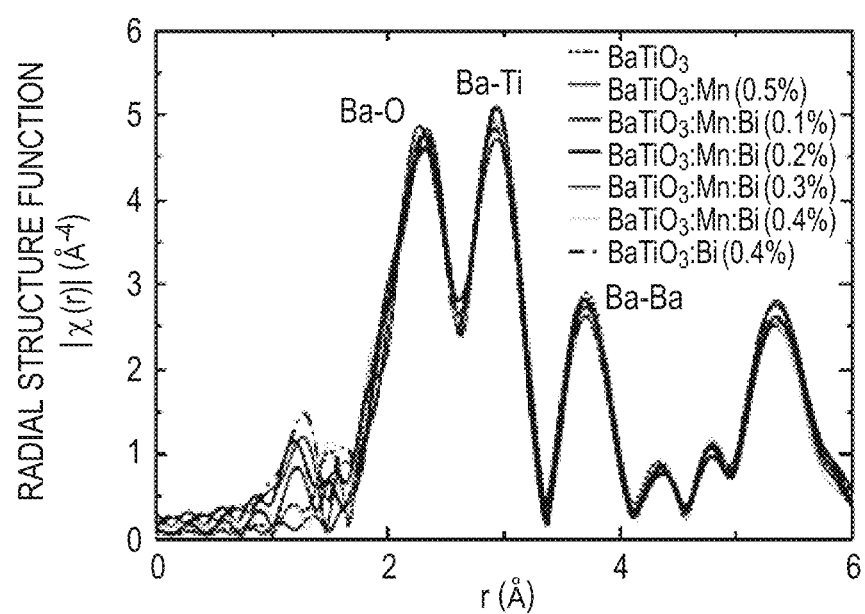
FIG. 18 illustrates radial structure functions of piezoelectric materials of Examples 1 to 4, and Comparative Examples 1, 2 and 4 of the present invention.

In order to investigate a coordination environment around Ba which was a main component element of the resultant piezoelectric material, a Ba—K XAFS measurement was also performed. Since Ba is a main component element and present at a high concentration in the material, an influence by self-absorption is great in the fluorescence method to deform the spectrum. Therefore, after a part of the material was ground into powder, the powder was mixed and diluted with boron nitride powder so as to give a concentration suitable for the measurement, and the diluted powder was molded into a tablet to prepare a sample, thereby conducting the XAFS measurement by a transmission method. A Ba radial structure function obtained by extracting an EXAFS vibration from a resultant spectrum and Fourier-transforming it was illustrated in FIG. 18. It is found that all the radial structure functions have almost the same peak shapes regardless of the contents of Bi and Mn added. When the Ba radial structure function of the BaTiO$_3$:Mn:Bi(0.4%) material was analyzed by the fitting, the Ba—O bond lengths thereof were 2.867 Å at the longest and 2.810 Å at the shortest. In other words, the distribution of twelve Ba—O bond lengths is included in the range of 2% at most. Also in other materials, almost the same results were obtained, and the distribution of the Ba—O bond lengths is included in the range of less than 5% at most. It is understood also from this that the above-described Bi—O coordination environment is greatly biased.

Figure 19A:
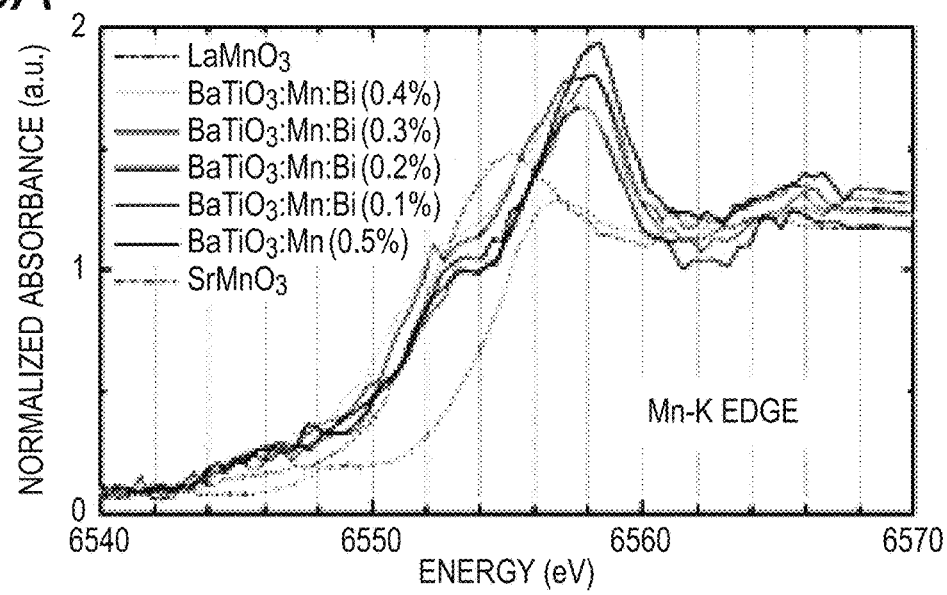
FIGS. 19A, 19B and 19C illustrate XANES spectra (FIG. 19A), EXAFS spectra (FIG. 19B) and radial structure functions (FIG. 19C) obtained by the Mn—K XAFS measurement of piezoelectric materials of Examples 1 to 4 and Comparative Example 4 of the present invention as well as reference materials.

Similarly to Bi, Mn—K XAFS measurement of Mn which is an additional element in the piezoelectric material was performed by the fluorescence method. At the same time, XAFS measurements of SrMnO$_3$ and LaMnO$_3$ as valence standards for positive tetravalent and positive trivalent Mn located in the B site of the perovskite-type structure were also performed. Mn—K XAFS spectra of BaTiO$_3$ into which only Mn was added into which Mn and Bi were added at the same time were illustrated in FIG. 19A together with XAFS spectra of SrMnO$_3$ and LaMnO$_3$ which were valence standards for Mn. When comparing the XAFS spectra of SrMnO$_3$ and LaMnO$_3$, it is understood that Mn is changed from being positive tetravalent to being positive trivalent, whereby an Mn—K absorption edge is shifted to the side of low energy. Similarly, it is understood that in the BaTiO$_3$: Mn:Bi materials, an Mn absorption edge is slightly shifted to the side of low energy as Bi is increased from 0% to 0.4%. In other words, it can be understood that the valence of Mn in the BaTiO$_3$:Mn:Bi materials is changed from being almost positive tetravalent to being almost positive trivalent by an increase of the Bi content. However, since the spectra differ in shape from the XANES spectra of SrMnO$_3$ and LaMnO$_3$, it is difficult to quantitatively estimate the valence by comparison with these spectra.

Figure 19B:
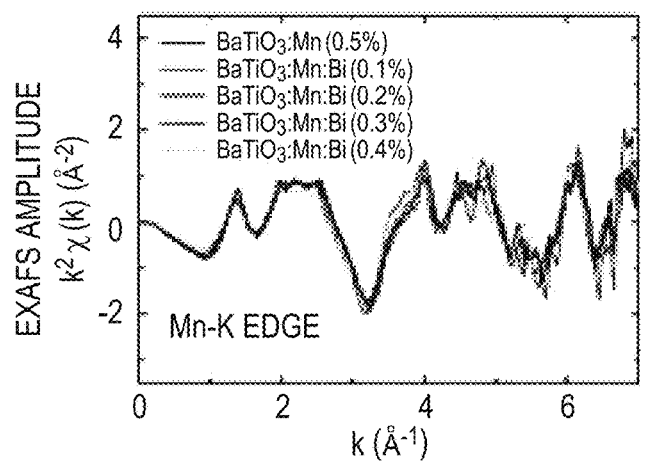
Figure 19C:
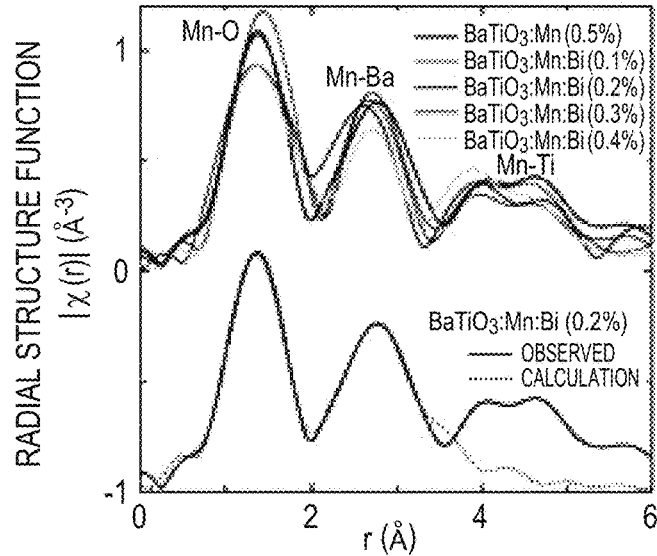

EXAFS spectra obtained by extracting the vibration structures of XAFS spectra above Mn—K absorption edge energy of BaTiO$_3$:Mn:Bi(0.1 to 0.4%) materials and the BaTiO$_3$:Mn(0.5%) material are illustrated in FIG. 19B. Radial structure functions obtained by Fourier-transforming these spectra are illustrated in FIG. 19C. When the Mn radial structure functions were analyzed by the fitting, good fitting results were obtained by assuming Mn—O to be 6-fold as illustrated as an example of BaTiO$_3$:Mn:Bi(0.2%) at a lower portion in FIG. 19C. In addition, the fitting was unable to be successfully performed by assuming Mn—O to be 12-fold. It was thereby confirmed that Mn is located in the B site of the perovskite-type structure.

Figure 20A:
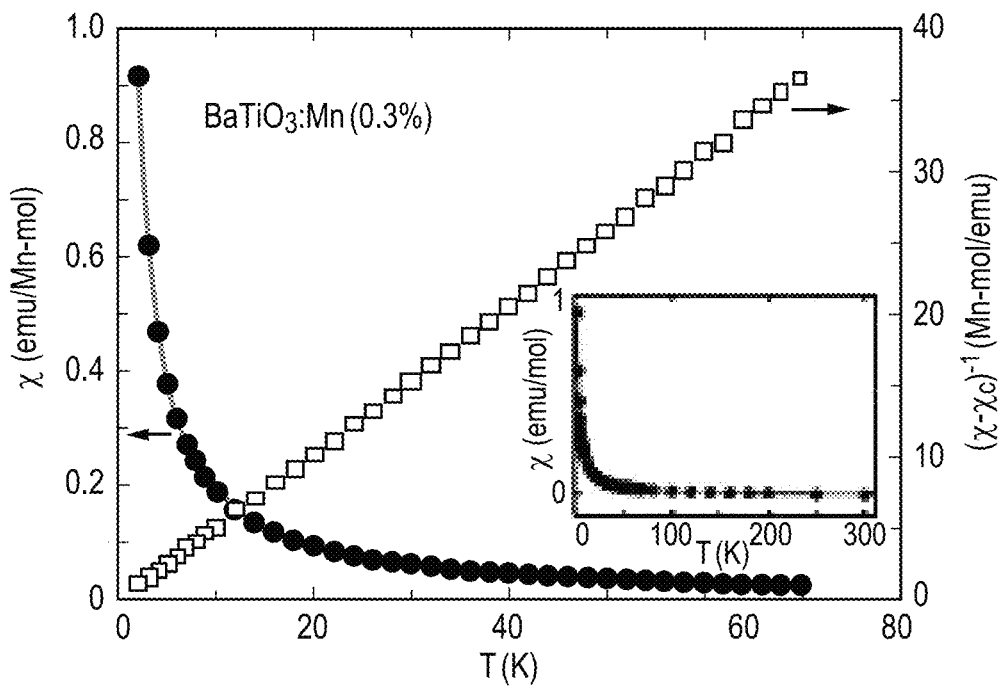
FIGS. 20A and 20B illustrate an example of temperature dependence of a magnetic susceptibility of a piezoelectric material according to the present invention (FIG. 20A) and Bi/Mn content ratio dependence of an Mn valence in the piezoelectric material which is estimated by the temperature dependence of the magnetic susceptibility (FIG. 20B).
Figure 20B:
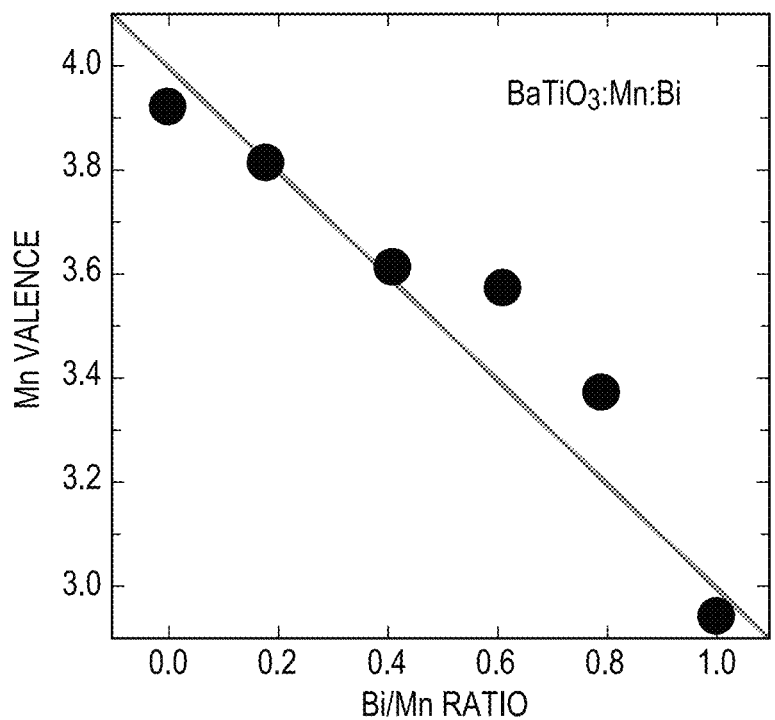

Estimation of Valence of Mn by Temperature Dependence of Magnetic Susceptibility:

In order to estimate the valence of Mn in the BaTiO$_3$:Mn material and the BaTiO$_3$:Mn:Bi materials, the measurement of temperature dependence of magnetic susceptibility of these materials was performed. BaTiO$_3$ and BaTiO$_3$:Bi are nonmagnetic (diamagnetic), and only Mn is an element exhibiting magnetism among BaTiO$_3$:Mn and the BaTiO$_3$: Mn:Bi materials. Moreover, since Mn is contained at a low concentration in the insulating materials in which a conduction electron is almost not present, a magnetic interaction between Mn atoms is weak, and so it is expected that temperature dependence of magnetic susceptibility which is attributable to Mn exhibits paramagnetism conforming to the Curie-Weiss law until low temperatures. Behavior of the temperature dependence of the magnetic susceptibility thereof is analyzed, whereby the valence of Mn can be estimated. The magnetic susceptibility $\chi$ of a material in which diamagnetism not depending on the temperature and paramagnetism conforming to the Curie-Weiss law coexist can be represented by $\chi=C/(T-\theta_p)+\chi_c$ as a Curie-Weiss law including a constant term (wherein C is a Curie constant, T is a temperature, $\theta_p$ is a paramagnetic Curie temperature, and $\chi_c$ is a diamagnetic susceptibility not depending on the temperature, i.e., a constant term). The temperature dependence of the magnetic susceptibility was measured in the temperature range of from 2 K to 300 K by using a superconducting quantum interference device (SQUID) magnetometer and applying a magnetic field of 1,000 Oe. A material to be measured was ground into powder, about 200 mg of the powder was filled into a gelatin capsule, and the capsule was set in the SQUID magnetometer to conduct the measurement. As an example of the measured results, the measured value of the temperature dependence of the magnetic susceptibility of the $BaTiO_3$:Mn(0.3%) material and a fitting curve thereof (left axis: 2 K to 70 K) are illustrated in FIG. 20A. Since the measured value is well fitted to the fitting curve, and an inverse susceptibility $(\chi-\chi_c)$ obtained by subtracting the constant term as shown on a right axis in the drawing is a straight line, it can be understood that the temperature dependence of the magnetic susceptibility conforms to the Curie-Weiss law. In addition, the inset in the drawing illustrates measured values of the temperature dependence of the magnetic susceptibility from 2 K to 300 K (room temperature) and a fitting curve thereof. It can be confirmed that the valence of Mn does not change from room temperature down to 2 K. The respective parameters (Curie constants C and valences of Mn respectively converted therefrom, diamagnetic susceptibilities $\chi_c$, paramagnetic Curie temperatures $\theta_p$, and reliability parameters $R^2$) found from the temperature dependence of the magnetic susceptibility of the respective materials are shown in Table 5. It is understood that the valence of Mn is close to being positive tetravalent in the material containing no Bi and approaches positive trivalence as the content of Bi is increased. Those obtained by arranging the changes in the Mn valence with the Bi/Mn ratio in the materials are illustrated in FIG. 20B. A straight line in the drawing indicates Bi/Mn ratio dependence of the Mn valence in such a model that a corresponding amount of positive tetravalent Mn located in the B site changes to positive trivalent Mn which is an acceptor for compensating the positive trivalent Bi donor replaced in the A site. Since the Mn valence estimated by the temperature dependence of the magnetic susceptibility behaves almost conformably to the straight line of the model, it was able to confirm that Mn changes its valence so as to satisfy the electric neutralization condition of the material in the case where Bi is added.

TABLE 1

| | Sample name | Abbr. | Mn content (mol %) | Bi content (mol %) | La content (mol %) |
|---|---|---|---|---|---|
| Comp. Ex. 1 | $BaTiO_3$ | BT | — | — | — |
| Comp. Ex. 2 | $BaTiO_3$:Bi(0.4%) | BTB | — | 0.37 | — |
| Comp. Ex. 3 | $BaTiO_3$:Mn(0.3%) | BTM03 | 0.33 | — | — |
| Comp. Ex. 4 | $BaTiO_3$:Mn(0.5%) | BTM05 | 0.47 | — | — |
| Ex. 1 | $BaTiO_3$:Mn:Bi(0.1%) | BTMB01 | 0.49 | 0.09 | — |
| Ex. 2 | $BaTiO_3$:Mn:Bi(0.2%) | BTMB02 | 0.46 | 0.19 | — |
| Ex. 3 | $BaTiO_3$:Mn:Bi(0.3%) | BTMB03 | 0.46 | 0.28 | — |
| Ex. 4 | $BaTiO_3$:Mn:Bi(0.4%) | BTMB04 | 0.47 | 0.37 | — |
| Ex. 5 | $BaTiO_3$:Mn:Bi(0.5%) | BTMB05 | 0.48 | 0.48 | — |
| Ex. 6 | $BaTiO_3$:Mn:(Bi,La) | BTMBL | 0.5 | 0.25 | 0.25 |
| Comp. Ex. 5 | $BaTiO_3$:Mn:La | BTML | 0.5 | — | 0.5 |

TABLE 2

| Sample name | (abbr.) | | BT | BTB | BTM03 | BTMB01 | BTMB02 |
|---|---|---|---|---|---|---|---|
| | | a (Å) | 3.99564(6) | 3.99743(3) | 3.99807(3) | 3.99779(5) | 3.99752(7) |
| | | c (Å) | 4.03279(7) | 4.03441(5) | 4.03199(6) | 4.03344(6) | 4.03515(8) |
| Ba: | | B (Å) | 0.237(7) | 0.313(7) | 0.254(7) | 0.269(7) | 0.301(9) |
| Ti: | | z | 0.0180(9) | 0.0151(14) | 0.0117(19) | 0.0155(10) | 0.013(2) |
| | | B (Å) | 0.25(2) | 0.32(2) | 0.31(2) | 0.25(14) | 0.29(2) |
| O(1): | | z | 0.470(2) | 0.467(3) | 0.462(3) | 0.468(2) | 0.465(3) |
| | | B (Å) | 0.14(11) | 0.24(15) | 0.4(2) | 0.14(11) | 0.16(14) |
| O(2): | | z | −0.005(5) | −0.008(7) | −0.010(6) | −0.009(5) | −0.007(8) |
| | | B (Å) | 0.42(5) | 0.35(7) | 0.19(8) | 0.38(6) | 0.43(8) |
| | | $R_{wp}$ | 5.024 | 5.473 | 6.026 | 5.136 | 5.131 |
| | | S | 1.0692 | 1.3155 | 1.3037 | 1.1629 | 1.1031 |
| | | Fraction | 0.6779 | 0.4378 | 0.5345 | 0.6556 | 0.446 |
| $BaTiO_3$: | | $R_B$ | 1.056 | 1.125 | 1.026 | 1.238 | 1.171 |
| | | $R_F$ | 0.685 | 1.008 | 0.723 | 0.843 | 0.809 |
| $CeO_2$: | | $R_B$ | 1.113 | 1.176 | 0.934 | 1.144 | 1.045 |
| | | $R_F$ | 0.925 | 1.142 | 0.896 | 0.999 | 0.976 |
| Sample name | (abbr.) | | BTMB03 | BTMB04 | BTMB05 | BTMBL | BTML |
| | | a (Å) | 3.99673(5) | 3.99708(5) | 3.99625(4) | 3.99738(4) | 3.99773(4) |
| | | c (Å) | 4.03555(6) | 4.03630(6) | 4.03716(5) | 4.03475(5) | 4.03233(4) |
| Ba: | | B (Å) | 0.285(7) | 0.301(8) | 0.331(6) | 0.300(6) | 0.304(5) |
| Ti: | | z | 0.0150(11) | 0.0152(12) | 0.0131(11) | 0.0134(10) | 0.0121(11) |
| | | B (Å) | 0.29(2) | 0.29(2) | 0.375(16) | 0.339(14) | 0.372(14) |
| O(1): | | z | 0.469(2) | 0.467(2) | 0.468(2) | 0.469(2) | 0.471(2) |
| | | B (Å) | 0.21(11) | 0.12(11) | 0.35(11) | 0.04(8) | 0.09(8) |
| O(2): | | z | −0.007(5) | −0.006(6) | −0.010(5) | −0.012(4) | −0.009(5) |
| | | B (Å) | 0.39(6) | 0.41(6) | 0.42(6) | 0.47(6) | 0.52(5) |
| | | $R_{wp}$ | 5.374 | 4.995 | 5.523 | 5.185 | 5.516 |

TABLE 2-continued

|  |  |  |  |  |  |  |
|---|---|---|---|---|---|---|
|  | S | 1.2795 | 1.1036 | 1.4319 | 1.3299 | 1.4901 |
|  | Fraction | 0.6362 | 0.5172 | 0.6644 | 0.7711 | 0.773 |
| $BaTiO_3$: | $R_B$ | 1.243 | 1.469 | 1.271 | 1.015 | 1.228 |
|  | $R_F$ | 0.833 | 0.999 | 0.854 | 0.59 | 0.906 |
| $CeO_2$: | $R_B$ | 1.287 | 1.265 | 1.264 | 0.824 | 1.101 |
|  | $R_F$ | 0.976 | 1.143 | 0.936 | 0.629 | 1.02 |

TABLE 3

| Sample name | (abbr.) | BT | BTB | BTM03 | BTMB01 | BTMB02 |
|---|---|---|---|---|---|---|
|  | a (Å) | 3.99564 | 3.99743 | 3.99807 | 3.99779 | 3.99752 |
|  | c (Å) | 4.03279 | 4.03441 | 4.03199 | 4.03344 | 4.03515 |
| Ba: | B (Å) | 0.253(6) | 0.289(4) | 0.262(5) | 0.288(5) | 0.279(4) |
| Ti: | z | 0.0169(9) | 0.0129(8) | 0.0151(9) | 0.0149(9) | 0.0142(8) |
|  | B (Å) | 0.31(2) | 0.374(11) | 0.308(14) | 0.323(14) | 0.337(12) |
| O(1): | z | 0.471(2) | 0.473(2) | 0.474(2) | 0.475(2) | 0.472(2) |
|  | B (Å) | 0.31(11) | 0.32(7) | 0.32(10) | 0.06(8) | 0.26(8) |
| O(2): | z | −0.010(4) | −0.010(3) | −0.010(4) | −0.009(4) | −0.010(3) |
|  | B (Å) | 0.36(6) | 0.40(4) | 0.38(5) | 0.59(6) | 0.40(4) |
|  | $R_{wp}$ | 7.16 | 5.756 | 6.336 | 6.506 | 5.51 |
|  | S | 1.8509 | 1.4001 | 1.9065 | 1.7736 | 1.5846 |
| $BaTiO_3$: | $R_B$ | 1.257 | 1.078 | 1.102 | 1.078 | 1.111 |
|  | $R_F$ | 0.515 | 0.497 | 0.462 | 0.401 | 0.6 |

| Sample name | (abbr.) | BTMB03 | BTMB04 | BTMB05 | BTMBL | BTML |
|---|---|---|---|---|---|---|
|  | a (Å) | 3.99673 | 3.99708 | 3.99625 | 3.99738 | 3.99773 |
|  | c (Å) | 4.03555 | 4.0363 | 4.03716 | 4.03475 | 4.03233 |
| Ba: | B (Å) | 0.316(5) | 0.295(4) | 0.324(4) | 0.307(4) | 0.301(4) |
| Ti: | z | 0.0127(9) | 0.0123(9) | 0.0133(8) | 0.0128(8) | 0.0128(8) |
|  | B (Å) | 0.392(12) | 0.373(11) | 0.384(11) | 0.381(11) | 0.370(11) |
| O(1): | z | 0.474(2) | 0.471(2) | 0.471(2) | 0.474(2) | 0.475(2) |
|  | B (Å) | 0.09(7) | 0.25(7) | 0.41(8) | 0.14(7) | 0.12(7) |
| O(2): | z | −0.007(5) | −0.008(4) | −0.011(3) | −0.010(3) | −0.009(4) |
|  | B (Å) | 0.58(5) | 0.45(4) | 0.36(4) | 0.53(4) | 0.55(4) |
|  | $R_{wp}$ | 6.302 | 5.911 | 5.813 | 5.708 | 5.766 |
|  | S | 1.7706 | 1.8146 | 1.5822 | 1.5633 | 1.6119 |
| $BaTiO_3$: | $R_B$ | 1.143 | 1.152 | 1.021 | 1.027 | 1.148 |
|  | $R_F$ | 0.575 | 0.583 | 0.601 | 0.477 | 0.463 |

Oblique letters (a, c) are fixed values.

TABLE 4

| Bond | Bi—O (Å) | Bi—Ti (Å) | Bi—Ba (Å) |
|---|---|---|---|
| Ex. 4 | ($L_1$—$L_4$) 4 × 2.254 | ($D_1$—$D_4$) 4 × 3.295 | 1 × 3.834 |
| $BaTiO_3$:Mn:Bi(0.4%) | ($L_5$—$L_8$) 4 × 2.738 | ($D_5$—$D_8$) 4 × 3.698 | 4 × 3.996 |
| (R = 0.00009) | ($L_9$—$L_{12}$) 4 × 3.045 |  | 1 × 4.499 |
| Comp. Ex. 2 | ($L_1$—$L_4$) 4 × 2.258 | ($D_1$—$D_4$) 4 × 3.298 | 1 × 3.776 |
| $BaTiO_3$:Bi(0.4%) | ($L_5$—$L_8$) 4 × 2.757 | ($D_5$—$D_8$) 4 × 3.704 | 4 × 3.978 |
| (R = 0.00009) | ($L_9$—$L_{12}$) 4 × 3.088 |  | 1 × 4.424 |

TABLE 5

|  |  | C (emuK/Mn-mol) | Mn valence | $\chi_c$ ($10^{-6}$ emu/mol) | $\theta_p$ (K) | $R^2$ |
|---|---|---|---|---|---|---|
| Comp. Ex. 3 | $BaTiO_3$:Mn(0.3%) | 1.963 | +3.92 | −7.79 | −0.14 | 0.99998 |
| Ex. 1 | $BaTiO_3$:Mn:Bi(0.1%) | 2.085 | +3.81 | −2.12 | −0.45 | 0.99996 |
| Ex. 2 | $BaTiO_3$:Mn:Bi(0.2%) | 2.317 | +3.61 | −2.30 | −0.4 | 0.99991 |
| Ex. 3 | $BaTiO_3$:Mn:Bi(0.3%) | 2.362 | +3.57 | −2.30 | −0.58 | 0.99975 |
| Ex. 4 | $BaTiO_3$:Mn:Bi(0.4%) | 2.584 | +3.37 | −2.35 | −0.73 | 0.9996 |
| Ex. 5 | $BaTiO_3$:Mn:Bi(0.5%) | 3.068 | +2.94 | +10.1 | −0.76 | 0.99983 |
| Comp. Ex. 1 | $BaTiO_3$[a] |  |  | −21.4[a] |  |  |
| Comp. Ex. 2 | $BaTiO_3$:Bi(0.4%)[a] |  |  | −18.7[a] |  |  |

[a]Regarding $BaTiO_3$ and $BaTiO_3$:Bi(0.4%), only the values of diamagnetic susceptibilities at 300K were shown.

Piezoelectric Property:

After both front and back surfaces of a part of each of the sintered bodies of these piezoelectric materials were polished, a gold electrode having a thickness of 400 nm was formed on both front and back surfaces by a DC sputtering method. Incidentally, a layer formed of titanium with a thickness of 30 nm was formed as an adhesion layer between the electrodes and the piezoelectric material. This piezoelectric material with electrodes was cut to prepare a strip element of 10 mm×2.5 mm×0.5 mm. This element was used to measure temperature dependence of permittivity and dielectric loss, and polarization-electric field (P-E) characteristics at room temperature.

Figure 21A:
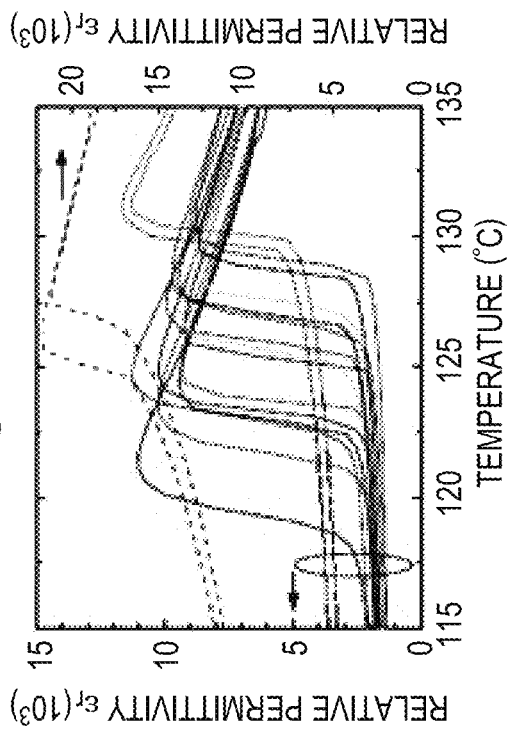
FIGS. 21A, 21B, 21C and 21D illustrate temperature dependence of relative permittivity and dielectric loss of piezoelectric materials of Examples 1 to 5 and Comparative Examples 1 to 4 of the present invention.
Figure 21B:
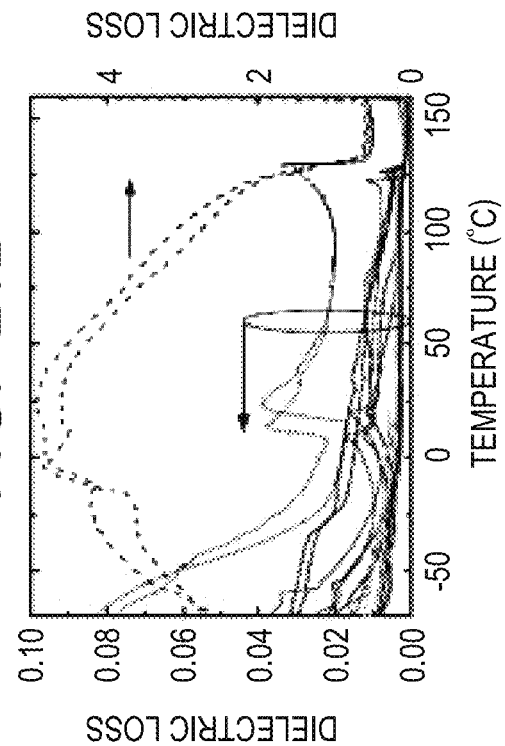
Figure 21C:
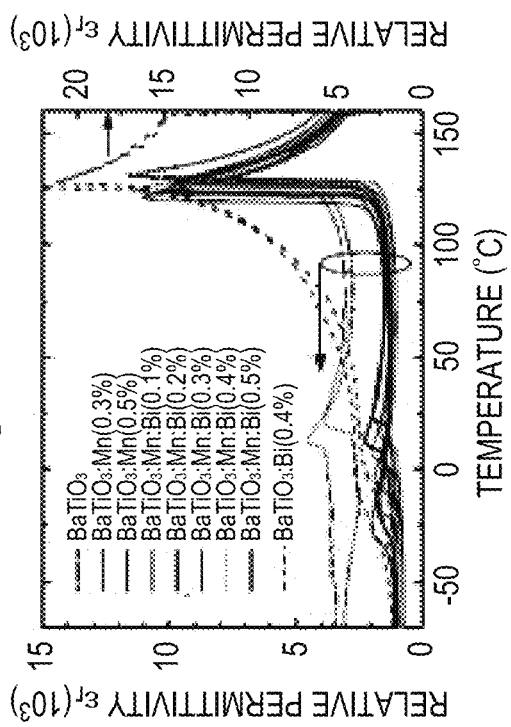
Figure 22A:
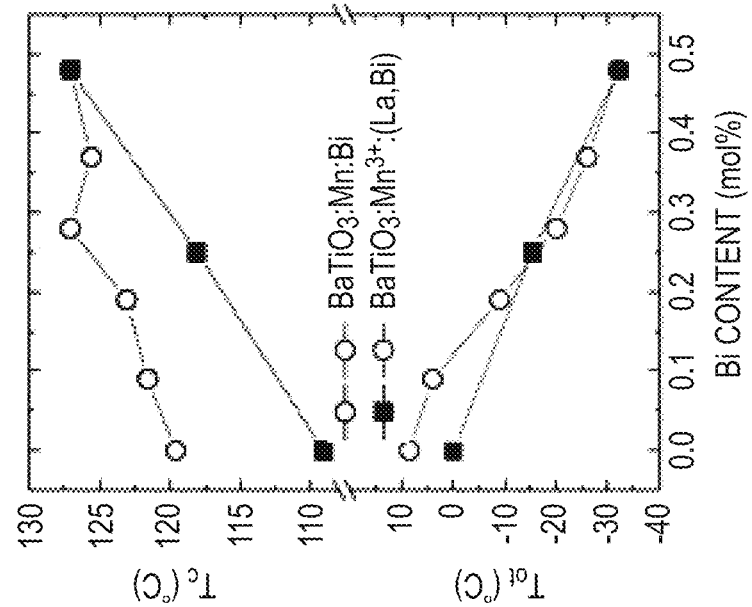
FIGS. 22A and 22B illustrate Curie temperatures $T_c$ and tetragonal-orthorhombic phase transition temperature $T_{ot}$ of piezoelectric materials of Examples 1 to 6 and Comparative Examples 1 to 5 of the present invention.
Figure 22B:
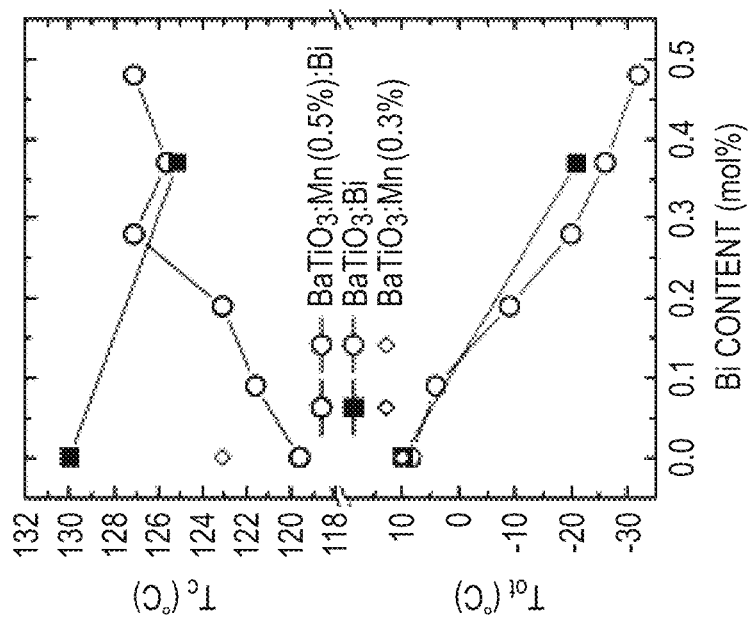

The temperature dependence of the measured permittivities in the range of from −70° C. to +160° C. was illustrated in FIG. 21A. In all the materials, a great anomaly of the permittivity corresponding to the Curie temperature $T_c$ was observed in the vicinity of from +120° C. to +130° C. In addition, a dielectric anomaly corresponding to $T_{ot}$ was seen in the vicinity of from −40° C. to +20° C. An enlarged view of the temperature dependence of the permittivity in the vicinity of $T_c$ and an enlarged view in the vicinity of $T_{ot}$ are illustrated in FIG. 21B and FIG. 21C, respectively. Those obtained by reading $T_c$ and $T_{ot}$ from these results in the cooling process and plotting them against each Bi content in the materials are illustrated in FIGS. 22A and 22B. It is understood that in the materials except BaTiO$_3$:Bi, $T_c$ is raised, and $T_{ot}$ is lowered as the Bi content is increased, that is, the temperature range of the tetragonal phase is widened. This can be recognized to be closely related to the increase of the tetragonal anisotropy due to the increase of Bi as illustrated in FIGS. 15A to 15D and to the bias of the Bi position in the c-axis direction and the generation of the local electric polarization around Bi which is attributable thereto as illustrated in FIGS. 17A to 17C.

Figure 21D:
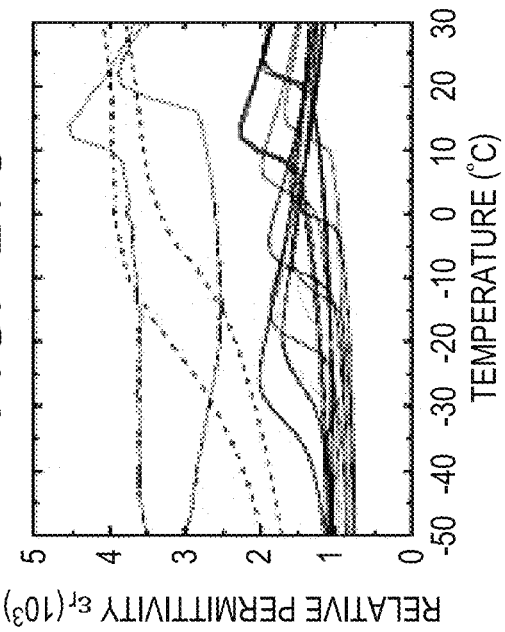

The temperature dependence of dielectric loss is illustrated in FIG. 21D. In BaTiO$_3$ into which neither Bi nor Mn is added, the value of the dielectric loss is approximately 0.02 or more, and a relatively high dielectric loss is exhibited. In BaTiO$_3$:Bi(0.4%) with only Bi added into BaTiO$_3$, the dielectric loss exceeds 1 at a temperature of $T_c$ or less, and it seems that the insulation property is greatly deteriorated by the addition of Bi. This is consistent with the above-described behavior that positive trivalent Bi replaces a part of positive divalent barium to generate a conduction electron as a donor. In BaTiO$_3$:Mn:Bi materials with both Bi and Mn added into BaTiO$_3$, rise in the dielectric loss is not observed, and it is found that the dielectric loss is rather lower than the additive-free BaTiO$_3$. It can be understood that this is because a part of Mn changes from being positive tetravalent to being positive trivalent as illustrated in FIG. 20B, thereby compensating the positive trivalent Bi donor to suppress the generation of the conduction electron.

Figure 23:
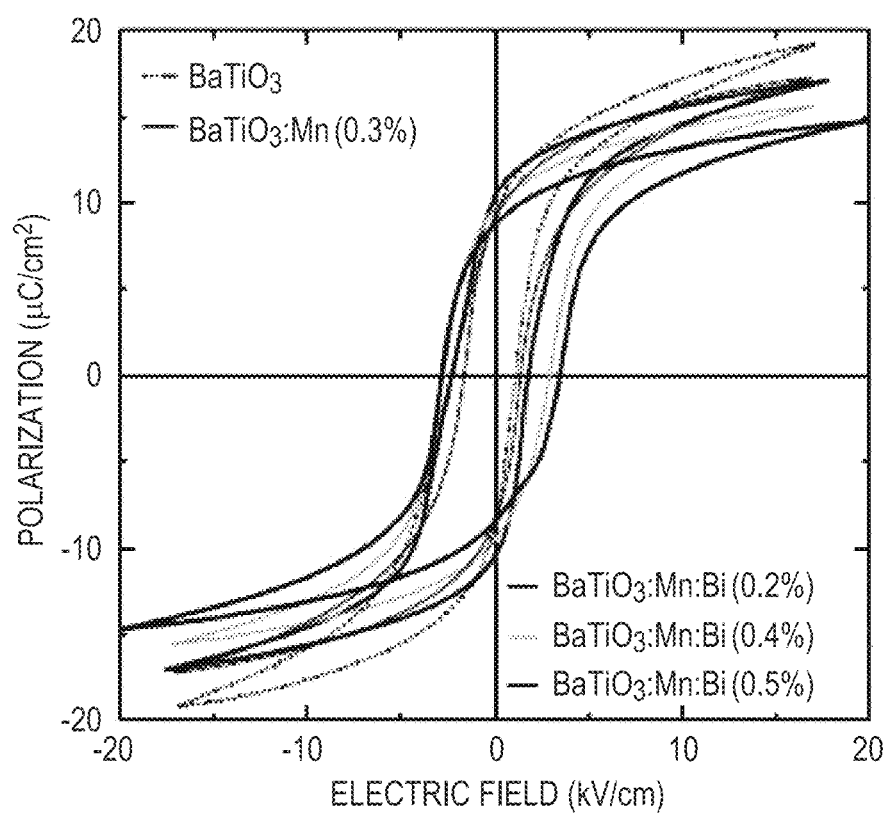
FIG. 23 illustrates polarization-electric field (P-E) characteristics of piezoelectric materials of Examples 2, 4 and 5 and Comparative Examples 1 and 3 of the present invention

The polarization-electric field (P-E) hysteresis curves of the BaTiO$_3$ material, the BaTiO$_3$:Mn(0.3%) material and BaTiO$_3$:Mn:Bi(0.2%, 0.4%, 0.5%) materials are illustrated in FIG. 23. In the BaTiO$_3$:Mn:Bi materials into which both Bi and Mn are added, the hysteresis widths thereof are wide compared with the materials into which Bi is not added, that is, coercive electric fields (polarization inversion electric fields) are large. In addition, it is found that among these, the coercive electric field is increased as the Bi content is increased. In other words, this suggests that the macroscopic polarization becomes hard to invert by the addition of Bi. Incidentally, the P-E characteristic measurement was attempted also on the BaTiO$_3$:Bi(0.4%) material into which Mn was not added. However, dielectric breakdown was caused by applying a voltage during the measurement to fail to conduct the measurement. This is consistent with the deterioration of the insulation property caused by the addition of only Bi as illustrated in FIG. 21D.

Preparation of Piezoelectric Element:

Similarly to the sample for dielectric property measurement, after both front and back surfaces of a part of each of the sintered bodies of the piezoelectric materials were polished, a gold electrode having a thickness of 400 nm was formed on both front and back surfaces by a DC sputtering method. Incidentally, a layer formed of titanium with a thickness of 30 nm was formed as an adhesion layer between the electrodes and the piezoelectric material. This piezoelectric material with electrodes was cut to prepare a strip element of 10 mm×2.5 mm×0.5 mm. This element was placed on a hot plate having a surface temperature of from 100° C. to 140° C., and an electric field of 1.0 kV/mm was applied for 30 minutes between both electrodes to conduct a polarization processing. Thus, such a piezoelectric element that the piezoelectric material portion held between the electrodes has a residual polarization perpendicularly to an electrode surface was obtained. Incidentally, the BaTiO$_3$:Bi (0.4%) material into which only Bi was added (Comparative Example 2) caused dielectric breakdown by applying a voltage upon the polarization processing to fail to conduct the polarization processing, whereby a piezoelectric element was not prepared.

Measurement of Piezoelectric Constant and Mechanical Quality Factor:

The piezoelectric constants $d_{31}$ at room temperature (25° C.) and the mechanical quality factors $Q_m$ at room temperature of the resultant piezoelectric elements were estimated. Among these, the results of Example 4, Comparative Example 2 (immeasurable because the polarization processing was unable to be conducted) and Comparative Examples 3 and 4 are shown in Table 6. The piezoelectric constant $d_{31}$ was found by the resonance-antiresonance method at room temperature (25° C.). The mechanical quality factor $Q_m$ was written as a value found at the same time as the piezoelectric constant by the resonance-antiresonance method.

The piezoelectric constants $d_{31}$ of Example 4, Examples 1 to 3 and Example 5 were all as large as 100 pm/V or more, and the mechanical quality factors $Q_m$ were all 2,000 or more which was a value suitable for practicability of a resonant piezoelectric device. This is thought to be because both amounts of Bi and Mn were proper amounts, and the raw material powder was sufficiently mixed, whereby Bi was evenly distributed, and consequently Bi was present at a position biased in the c-axis direction from the centrosymmetric position of the A site.

Examples 7 and 8, and Comparative Examples 6 and 7

Preparation Step:

Bi which was a first subcomponent and Mn which was a second subcomponent were added into a metal oxide represented by the general formula (1) (Ba$_{1-x}$M1$_x$) (Ti$_{1-y}$M2$_y$)O$_3$ of the composition of x=0 and y=0 in which the metal elements M1 and M2 were not added, that is, BaTiO$_3$, to prepare piezoelectric materials. A metal oxide piezoelectric material whose Bi and Mn contents were respectively 0.1 mol % and 0.3 mol % with respect to BaTiO$_3$ and a metal oxide piezoelectric material whose Bi and Mn contents were respectively 0.5 mol % and 1.5 mol % with respect to BaTiO$_3$ were prepared as Example 7 and Example 8, respectively. In addition, a metal oxide piezoelectric material whose Bi and Mn contents were respectively 1.0 mol % and 0.5 mol % with respect to BaTiO$_3$ and a metal oxide piezoelectric material whose Bi and Mn contents were respectively 1.0 mol % and 2.0 mol % were prepared as Comparative Example 6 and Comparative Example 7, respectively.

Barium titanate powder (average particle diameter: 100 nm, purity: 99.99% or more), bismuth oxide (Bi$_2$O$_3$) powder (average particle diameter: 1 μm, purity: 99.999% or more) and manganese dioxide (MnO$_2$) powder (average particle diameter: 1 μm, purity: 99.99% or more) were weighed in such a manner that the ratio of Ba, Ti, Mn and Bi is a desired value. These powders were put into a zirconia-made pot for a planetary ball mill, zirconia-made balls (almost equally mixed mixture of balls having a diameter of 1 mm and balls having a diameter of 3 mm) which had almost the same bulk (volume) as the weighed raw material powders and ethanol in such an amount that all the raw material powders and balls were immersed were further added into the pot, a resin-made packing was put between the pot and a lid, and the lid was closed. The pot was set in the planetary ball mill, the pot and the lid were tightly held down by a presser jig accompanying the mill so as to prevent the powders and ethanol from overflowing from a gap between the pot and the lid during operation, and rotation and revolution were conducted for 12 hours at a rate of 500 revolutions per minute to sufficiently mix the raw material powders while applying strong shearing stress thereto.

After the mixing by the planetary ball mill was completed, the contents in the pot were taken out, and the zirconia-made balls were removed therefrom, thereby obtaining mixed raw material powder dispersed in ethanol. PVB (polyvinyl butyral) as a binder was dissolved in ethanol and added into the mixed raw material powder dispersion in such a manner that the amount of PVB was 3 parts by weight with respect to the total weight, 100 parts by weight, of the mixed raw material powder. Ethanol was evaporated while stirring and mixing the resultant mixture, thereby causing the binder to adhere to the mixed raw material powder to prepare granulated powder. In this granulation step, even when PVA (polyvinyl alcohol) as a binder was caused to adhere to the surface of the mixed raw material powder by using a spray dryer in such a manner that the amount of PVA was 3 parts by weight with respect to the total weight, 100 parts by weight, of the mixed raw material powder, thereby granulating the powder, the results obtained were the same.

The thus-obtained granulated powder was then filled into a mold to prepare a disc-shaped molded article by applying a molding pressure of 200 MPa by means of a press molding machine. After the resultant molded article was put into an atmosphere-variable electric furnace and first heated and held at 600° C. under an air atmosphere, the temperature was further raised to 1,350° C. to hold the molded article for 4 hours. Cooling was conducted by radiational cooling. A disc-shaped sintered body (polycrystalline ceramic) was obtained by the above-described step. This sintered body was used as a piezoelectric material.

The Bi content and Mn content in the resultant material were estimated by an ICP atomic emission spectral analysis and an ICP mass spectrometry. The results thereof are as shown in Table 6, and a material having Bi and Mn contents almost as planed was obtained.

X-Ray Diffraction:

A part of the resultant material was ground into fine powder to subject the powder to an X-ray diffraction measurement. A bending magnet synchrotron radiation X-ray source was used to conduct the measurement at room temperature with an X-ray monochromatized to a wavelength of 0.39984 Å or 0.39987 Å at a 2θ angle step of 0.01° by the Debye-Scherrer method. The resultant X-ray diffraction chart was analyzed. As a result, regarding all the materials, highly reliable analyzed results were obtained by assuming a single tetragonal perovskite-type crystal structure. It was thus found that the main phase had a single tetragonal perovskite-type crystal structure. In addition, it was able to confirm that other phases than the main phase were present only in very small amounts.

XAFS:

A surface of a part of the thus-obtained sintered body of the piezoelectric material was polished to use it for a Bi-L$_3$ fluorescence XAFS measurement. The measurement was performed by using the same method as in Examples 1 to 4. An EXAFS vibration spectrum was extracted from the resultant Bi-L$_3$ XAFS spectrum, and this spectrum was Fourier-transformed to obtain a Bi radial structure function. This peak structure was analyzed by the fitting to obtain information of a coordination environment around Bi. Values of $(L_4-L_5)/L_5$, $(L_8-L_9)/L_9$ and $(L_1-L_{12})/L_{12}$ when the lengths of Bi—O bonds are set to be $L_1$ to $L_{12}$ in length order, and a value of $(D_4-D_5)/D_5$ when the lengths of Bi—Ti bonds are set to be $D_1$ to $D_8$ in length order are shown in Table 6.

In order to investigate a coordination environment around Ba which was a main component element of the resultant piezoelectric material, a Ba—K XAFS measurement was also performed. After a part of the sintered body of the piezoelectric material was ground into powder, the powder was mixed and diluted with boron nitride powder so as to give a concentration suitable for the measurement, and the diluted powder was molded into a tablet to prepare a sample, thereby conducting the XAFS measurement by a transmission method. An EXAFS vibration was extracted from the resultant spectrum, and a Ba radial structure function obtained by Fourier-transforming it was analyzed by the fitting. The resultant distribution of the Ba—O bond lengths is shown in Table 6.

Preparation of Piezoelectric Element:

After both front and back surfaces of a part of the sintered body were polished, a gold electrode having a thickness of 400 nm was formed on both front and back surfaces by a DC sputtering method. Incidentally, a layer formed of titanium with a thickness of 30 nm was formed as an adhesion layer between the electrodes and the piezoelectric material. This piezoelectric material with electrodes was cut to prepare a strip element of 10 mm×2.5 mm×0.5 mm. This element was placed on a hot plate having a surface temperature of from 100° C. to 140° C., and an electric field of 1.0 kV/mm was applied for 30 minutes between both electrodes to conduct a polarization processing. Thus, such a piezoelectric element that the piezoelectric material portion held between the electrodes has a residual polarization perpendicularly to an electrode surface was obtained.

Measurement of Piezoelectric Constant and Mechanical Quality Factor:

The piezoelectric constant $d_{31}$ at room temperature (25° C.) and the mechanical quality factor $Q_m$ at room temperature of the resultant piezoelectric element were estimated. The results thereof are shown in Table 6. The piezoelectric constant $d_{31}$ was found by the resonance-antiresonance method at room temperature (25° C.). The mechanical quality factor $Q_m$ was written as a value found at the same time as the piezoelectric constant by the resonance-antiresonance method.

The piezoelectric constants $d_{31}$ of Examples 7 and 8 were both as large as 100 pm/V or more, and the mechanical quality factors $Q_m$ thereof were both 2,000 or more which was a value suitable for practicability of a resonant piezoelectric device. This is thought to be because both amounts of Bi and Mn were proper amounts, and the raw material powder was sufficiently mixed, whereby Bi was evenly distributed, and consequently Bi was present at a position biased in the c-axis direction from the centrosymmetric position of the A site.

Comparative Example 8

Preparation Step:

0.4 mol % of Bi which was a first subcomponent and 0.5 mol % of Mn which was a second subcomponent were added into a metal oxide represented by the general formula (1) $(Ba_{1-x}M1_x)(Ti_{1-y}M2_y)O_3$ of the composition of x=0 and y=0 in which the metal elements M1 and M2 were not added, that is, $BaTiO_3$, to prepare a piezoelectric material by using a process different from that in Example 4.

Barium titanate powder (average particle diameter: 100 nm, purity: 99.99% or more), bismuth oxide ($Bi_2O_3$) powder (average particle diameter: 1 μm, purity: 99.999% or more) and manganese dioxide ($MnO_2$) powder (average particle diameter: 1 μm, purity: 99.99% or more) were weighed in such a manner that the ratio of Ba, Ti, Mn and Bi is a desired value. These powders were put into an agate mortar (mortar) having a diameter of 15 cm, and stirred and mixed for about 10 minutes by using a pestle of the agate mortar.

After the stirring and mixing were completed, PVB (polyvinyl butyral) as a binder was dissolved in ethanol and added into the mixed raw material powder in the agate mortar in such a manner that the amount of PVB was 3 parts by weight with respect to the total weight, 100 parts by weight, of the mixed raw material powder, and ethanol was evaporated while further stirring and mixing the resultant powder mixture by the pestle, thereby preparing granulated powder.

The thus-obtained granulated powder was then filled into a mold to prepare a disc-shaped molded article by applying a molding pressure of 200 MPa by means of a press molding machine. After the resultant molded article was put into an atmosphere-variable electric furnace and first heated and held at 600° C. under an air atmosphere, the temperature was further raised to 1,250° C. to hold the molded article for 8 hours. Cooling was conducted by radiational cooling. A disc-shaped sintered body (polycrystalline ceramic) was obtained by the above-described step. This sintered body was used as a piezoelectric material.

The Bi content and Mn content in the resultant material were estimated by an ICP atomic emission spectral analysis and an ICP mass spectrometry. The results thereof are as shown in Table 6, and a material having Bi and Mn contents almost as planed was obtained.

XAFS:

A surface of a part of the thus-obtained sintered body of the piezoelectric material was polished to use it for a Bi-$L_3$ fluorescence XAFS measurement. The measurement was performed by using the same method as in Examples 1 to 4. An EXAFS vibration spectrum was extracted from the resultant Bi-$L_3$ XAFS spectrum, and this spectrum was Fourier-transformed to obtain a Bi radial structure function. This peak structure was analyzed by the fitting to obtain information of a coordination environment around Bi. Values of $(L_4-L_5)/L_5$, $(L_8-L_9)/L_9$ and $(L_1-L_{12})/L_{12}$ when the lengths of Bi—O bonds are set to be $L_1$ to $L_{12}$ in length order and a value of $(D_4-D_5)/D_5$ when the lengths of Bi—Ti bonds are set to be $D_1$ to $D_8$ in length order are shown in Table 6. These results suggest that the Bi position is scarcely biased. This is presumed to be attributable to insufficient mixing of the Bi raw material in the preparation step.

In order to investigate a coordination environment around Ba which was a main component element of the resultant piezoelectric material, a Ba—K XAFS measurement was also performed. After a part of the sintered body of the piezoelectric material was ground into powder, the powder was mixed and diluted with boron nitride powder so as to give a concentration suitable for the measurement, and the diluted powder was molded into a tablet to prepare a sample, thereby conducting the XAFS measurement by a transmission method. An EXAFS vibration was extracted from the resultant spectrum, and a Ba radial structure function obtained by Fourier-transforming it was analyzed by the fitting. The resultant distribution of the Ba—O bond lengths is shown in Table 6.

Preparation of Piezoelectric Element:

After both front and back surfaces of a part of the sintered body were polished, a gold electrode having a thickness of 400 nm was formed on both front and back surfaces by a DC sputtering method. Incidentally, a layer formed of titanium with a thickness of 30 nm was formed as an adhesion layer between the electrodes and the piezoelectric material. This piezoelectric material with electrodes was cut to prepare a strip element of 10 mm×2.5 mm×0.5 mm. This element was placed on a hot plate having a surface temperature of from 100° C. to 140° C., and an electric field of 1.0 kV/mm was applied for 30 minutes between both electrodes to conduct a polarization processing. Thus, such a piezoelectric element that the piezoelectric material portion held between the electrodes has a residual polarization perpendicularly to an electrode surface was obtained.

Measurement of Piezoelectric Constant and Mechanical Quality Factor:

The piezoelectric constant $d_{31}$ at room temperature (25° C.) and the mechanical quality factor $Q_m$ at room temperature of the resultant piezoelectric element were estimated. The results thereof are shown in Table 6. The piezoelectric constant $d_{31}$ was found by the resonance-antiresonance method at room temperature (25° C.). The mechanical quality factor $Q_m$ was written as a value found at the same time as the piezoelectric constant by the resonance-antiresonance method.

The piezoelectric constant $d_{31}$ of Comparative Example 8 was as small as about 20 pm/V, and the mechanical quality factor $Q_m$ was only about 120. This is thought to be caused by undesirable resulting conditions: Mixing of the Bi raw material was insufficient though both amounts of Bi and Mn were proper amounts, and so Bi was not well melted into a crystal, failing to be present at a biased position in the A site of the perovskite-type structure.

Examples 9 to 12, and Comparative Example 9

Preparation Step:

Bi which was a first subcomponent and Mn which was a second subcomponent were added into in a metal oxide represented by the general formula (1) $(Ba_{1-x}M1_x)(Ti_{1-y}M2_y)O_3$ of the composition of x=0.2 and y=0.1 in which Ca or Sr and Zr, Hf or Sn were respectively added as the metal elements M1 and M2 to prepare piezoelectric materials. In Example 9, Cr and Zr were added as M1 and M2, respectively, and the composition was adjusted in such a manner that the Bi content and the Mn content are 0.5 mol % and 0.3 mol %, respectively, with respect to the metal oxide of the general formula (1). In Example 10, Ca and Hf were added as M1 and M2, respectively, and the composition was adjusted in such a manner that the Bi content and the Mn content are 0.4 mol % and 0.5 mol %, respectively, with respect to the metal oxide of the general formula (1). In Example 11, Sr and Zr were added as M1 and M2, respectively, and the composition was adjusted in such a manner that the Bi content and the Mn content are 0.4 mol % and 0.5 mol %, respectively, with respect to the metal oxide of the general formula (1). In Example 12, Sr and Sn were added as M1 and M2, respectively, and the composition was adjusted in such a manner that the Bi content and the Mn content are 0.1 mol % and 1.5 mol %, respectively, with respect to the metal oxide of the general formula (1). In Comparative Example 9, the composition was adjusted in such a manner that Ca is added as M1 in the metal oxide represented by the general formula (1), x is 0.1, M2 is not added (that is, y=0), Bi is not added, and only Mn is added in a content of 0.6 mol %. These metal oxide piezoelectric materials were prepared.

Barium titanate powder (average particle diameter: 100 nm, purity: 99.99% or more), calcium titanate powder (average particle diameter: 300 nm, purity: 99.99% or more), barium zirconate powder (average particle diameter: 300 nm, purity: 99.99% or more), barium hafnate powder (average particle diameter: 300 nm, purity: 99.99% or more), strontium titanate powder (average particle diameter: 300 nm, purity: 99.99% or more), barium stannate powder (average particle diameter: 300 nm, purity: 99.99% or more), bismuth oxide ($Bi_2O_3$) powder (average particle diameter: 1 μm, purity: 99.999% or more) and manganese dioxide ($MnO_2$) powder (average particle diameter: 1 μm, purity: 99.99% or more) were weighed in such a manner that the ratio of Ba, Ca, Sr, Ti, Zr, Hf, Sn, Mn and Bi is a desired value. These powders were put into a zirconia-made pot for a planetary ball mill, zirconia-made balls (almost equally mixed mixture of balls having a diameter of 1 mm and balls having a diameter of 3 mm) which had almost the same bulk (volume) as the weighed raw material powders and ethanol in such an amount that all the raw material powders and balls are immersed were further added into the pot, a resin-made packing was put between the pot and a lid, and the lid was closed. The pot was set in the planetary ball mill, the pot and the lid were tightly held down by a presser jig accompanying the mill so as to prevent the powders and ethanol from overflowing from a gap between the pot and the lid during operation, and rotation and revolution were conducted for 12 hours at a rate of 500 revolutions per minute to sufficiently mix the raw material powders while applying strong shearing stress thereto.

After the mixing by the planetary ball mill was completed, the contents in the pot were taken out, and the zirconia-made balls were removed therefrom, thereby obtaining mixed raw material powder dispersed in ethanol. PVB (polyvinyl butyral) as a binder was dissolved in ethanol and added into the mixed raw material powder dispersion in such a manner that the amount of PVB was 3 parts by weight with respect to the total weight, 100 parts by weight, of the mixed raw material powder. Ethanol was evaporated while stirring and mixing the resultant mixture, thereby causing the binder to adhere to the mixed raw material powder to prepare granulated powder. In this granulation step, even when PVA (polyvinyl alcohol) as a binder was caused to adhere to the surface of the mixed raw material powder by using a spray dryer in such a manner that the amount of PVA was 3 parts by weight with respect to the total weight, 100 parts by weight, of the mixed raw material powder, thereby granulating the powder, the results obtained were the same.

The thus-obtained granulated powder was then filled into a mold to prepare a disc-shaped molded article by applying a molding pressure of 200 MPa by means of a press molding machine. After the resultant molded article was put into an atmosphere-variable electric furnace and first heated and held at 600° C. under an air atmosphere, the temperature was further raised to 1,350° C. to hold the molded article for 4 hours. Cooling was conducted by radiational cooling. A disc-shaped sintered body (polycrystalline ceramic) was obtained by the above-described step. This sintered body was used as a piezoelectric material.

The Bi content and Mn content in the resultant material were estimated by an ICP atomic emission spectral analysis and an ICP mass spectrometry. The results thereof are as shown in Table 6, and a material having Bi and Mn contents almost as planed was obtained.

X-Ray Diffraction:

A part of the resultant material was ground into fine powder to subject the powder to an X-ray diffraction measurement. A bending magnet synchrotron radiation X-ray source was used to conduct the measurement at room temperature with an X-ray monochromatized to a wavelength of 0.39984 Å or 0.39987 Å at a 2θ angle step of 0.01° by the Debye-Scherrer method. The resultant X-ray diffraction chart was analyzed. As a result, regarding all the materials, highly reliable analyzed results were obtained by assuming a single tetragonal perovskite-type crystal structure. It was thus found that the main phase had a single tetragonal perovskite-type crystal structure. In addition, it was able to confirm that other phases than the main phase were present only in very small amounts.

XAFS:

A surface of a part of the thus-obtained sintered body of the piezoelectric material was polished to use it for a $Bi-L_3$ fluorescence XAFS measurement. The measurement was performed by using the same method as in Examples 1 to 4. An EXAFS vibration spectrum was extracted from the resultant $Bi-L_3$ XAFS spectrum, and this spectrum was Fourier-transformed to obtain a Bi radial structure function. This peak structure was analyzed by the fitting to obtain information of a coordination environment around Bi. Values of $(L_4-L_5)/L_5$, $(L_8-L_9)/L_9$ and $(L_1-L_{12})/L_{12}$ when the lengths of Bi—O bonds are set to be $L_1$ to $L_{12}$ in length order, and a value of $(D_4-D_5)/D_5$ when the lengths of Bi—Ti bonds are set to be $D_1$ to $D_8$ in length order are shown in Table 6.

In order to investigate a coordination environment around Ba which was a main component element of the resultant piezoelectric material, a Ba—K XAFS measurement was also performed. After a part of the sintered body of the piezoelectric material was ground into powder, the powder was mixed and diluted with boron nitride powder so as to give a concentration suitable for the measurement, and the diluted powder was molded into a tablet to prepare a sample, thereby conducting the XAFS measurement by a transmission method. An EXAFS vibration was extracted from the resultant spectrum, and a Ba radial structure function obtained by Fourier-transforming it was analyzed by the fitting. The resultant distribution of the Ba—O bond lengths is shown in Table 6.

Preparation of Piezoelectric Element:

After both front and back surfaces of a part of the sintered body were polished, a gold electrode having a thickness of 400 nm was formed on both front and back surfaces by a DC sputtering method. Incidentally, a layer formed of titanium with a thickness of 30 nm was formed as an adhesion layer between the electrodes and the piezoelectric material. This piezoelectric material with electrodes was cut to prepare a strip element of 10 mm×2.5 mm×0.5 mm. This element was placed on a hot plate having a surface temperature of from 100° C. to 140° C., and an electric field of 1.0 kV/mm was applied for 30 minutes between both electrodes to conduct a polarization processing. Thus, such a piezoelectric element that the piezoelectric material portion held between the electrodes has a residual polarization perpendicularly to an electrode surface was obtained.

Measurement of Piezoelectric Constant and Mechanical Quality Factor:

The piezoelectric constant $d_{31}$ at room temperature (25° C.) and the mechanical quality factor $Q_m$ at room temperature of the resultant piezoelectric element were estimated. The results thereof are shown in Table 6. The piezoelectric constant $d_{31}$ was found by the resonance-antiresonance method at room temperature (25° C.). The mechanical quality factor $Q_m$ was written as a value found at the same time as the piezoelectric constant by the resonance-antiresonance method.

The piezoelectric constants $d_{31}$ of Examples 9 to 12 were all as large as 100 pm/V or more, and the mechanical quality factors $Q_m$ were all 2,000 or more which was a value suitable for practicability of a resonant piezoelectric device. This is thought to be because M1 which is an A-site replaced element and M2 which is a B-site replaced element are accurately selected, both elements substitute in respective proper amounts, both amounts of Bi and Mn are proper amounts, the raw material powder is sufficiently mixed, whereby Bi is evenly distributed, and consequently Bi was present at a position biased in the c-axis direction from the centrosymmetric position of the A site.

Comparative Example 10

Preparation Step:

15 mol % of Bi which was a first subcomponent and 15 mol % of Fe instead of Mn which was a second subcomponent were added into a metal oxide represented by the general formula (1) $(Ba_{1-x}M1_x)(Ti_{1-y}M2_y)O_3$ of the composition of x=0 and y=0 in which the metal elements M1 and M2 were not added, that is, $BaTiO_3$, to prepare a piezoelectric material by using a process different from that in Example 4.

Barium titanate powder (average particle diameter: 100 nm, purity: 99.99% or more), bismuth oxide ($Bi_2O_3$) powder (average particle diameter: 1 µm, purity: 99.999% or more) and iron oxide ($Fe_2O_3$) powder (average particle diameter: 1 µm, purity: 99.99% or more) were weighed in such a manner that the ratio of Ba, Ti, Fe and Bi is a desired value. These powders were put into a zirconia-made pot for a planetary ball mill, zirconia-made balls (almost equally mixed mixture of balls having a diameter of 3 mm) which had almost the same bulk (volume) as the weighed raw material powders and ethanol in such an amount that all the raw material powders and balls are immersed were further added into the pot, a resin-made packing was put between the pot and a lid, and the lid was closed. The pot was set in the planetary ball mill, the pot and the lid were tightly held down by a presser jig accompanying the mill so as to prevent the powders and ethanol from overflowing from a gap between the pot and the lid during operation, and rotation and revolution were conducted for 12 hours at a rate of 500 revolutions per minute to sufficiently mix the raw material powders while applying strong shearing stress thereto.

After the mixing by the planetary ball mill was completed, the contents in the pot were taken out, and the zirconia-made balls were removed therefrom, thereby obtaining mixed raw material powder dispersed in ethanol. PVB (polyvinyl butyral) as a binder was dissolved in ethanol and added into the mixed raw material powder dispersion in such a manner that the amount of PVB is 3 parts by weight with respect to the total weight, 100 parts by weight, of the mixed raw material powder. Ethanol was evaporated while stirring and mixing the resultant mixture, thereby causing the binder to adhere to the mixed raw material powder to prepare granulated powder.

The thus-obtained granulated powder was then filled into a mold to prepare a disc-shaped molded article by applying a molding pressure of 200 MPa by means of a press molding machine. After the resultant molded article was put into an atmosphere-variable electric furnace and first heated and held at 600° C. under an air atmosphere, the temperature was further raised to 1,250° C. to hold the molded article for 8 hours. Cooling was conducted by radiational cooling. A disc-shaped sintered body (polycrystalline ceramic) was obtained by the above-described step. This sintered body was used as a piezoelectric material. The Bi content and Fe content in the resultant material were estimated by a fluorescent X-ray analysis. The results thereof are as shown in Table 6, and a material having Bi and Fe contents almost as planed was obtained.

XAFS:

A surface of a part of the thus-obtained sintered body of the piezoelectric material was polished to use it for a $Bi-L_3$ fluorescence XAFS measurement. The measurement was performed by using the same method as in Examples 1 to 4. An EXAFS vibration spectrum was extracted from the resultant $Bi-L_3$ XAFS spectrum, and this spectrum was Fourier-transformed to obtain a Bi radial structure function. This peak structure was analyzed by the fitting to obtain information of a coordination environment around Bi. Values of $(L_4-L_5)/L_5$, $(L_8-L_9)/L_9$ and $(L_1-L_{12})/L_{12}$ when the lengths of Bi—O bonds are set to be $L_1$ to $L_{12}$ in length order, and a value of $(D_4-D_5)/D_5$ when the lengths of Bi—Ti bonds are set to be $D_1$ to $D_8$ in length order are shown in Table 6.

In order to investigate a coordination environment around Ba which was a main component element of the resultant piezoelectric material, a Ba—K XAFS measurement was also performed. After a part of the sintered body of the piezoelectric material was ground into powder, the powder was mixed and diluted with boron nitride powder so as to give a concentration suitable for the measurement, and the diluted powder was molded into a tablet to prepare a sample, thereby conducting the XAFS measurement by a transmission method. An EXAFS vibration was extracted from the resultant spectrum, and a Ba radial structure function obtained by Fourier-transforming it was analyzed by the fitting. The resultant distribution of the Ba—O bond lengths is shown in Table 6.

Preparation of Piezoelectric Element:

After both front and back surfaces of a part of the sintered body were polished, a gold electrode having a thickness of 400 nm was formed on both front and back surfaces by a DC sputtering method. Incidentally, a layer formed of titanium with a thickness of 30 nm was formed as an adhesion layer between the electrodes and the piezoelectric material. This piezoelectric material with electrodes was cut to prepare a strip element of 10 mm×2.5 mm×0.5 mm. This element was placed on a hot plate having a surface temperature of from 100° C. to 140° C., and an electric field of 1.0 kV/mm was applied for 30 minutes between both electrodes to conduct a polarization processing. Thus, such a piezoelectric element that the piezoelectric material portion held between the electrodes has a residual polarization perpendicularly to an electrode surface was obtained.

Measurement of Piezoelectric Constant and Mechanical Quality Factor:

The piezoelectric constant $d_{31}$ at room temperature (25° C.) and the mechanical quality factor $Q_m$ at room temperature of the resultant piezoelectric element were estimated. The results thereof are shown in Table 6. The piezoelectric constant $d_{31}$ was found by the resonance-antiresonance method at room temperature (25° C.). The mechanical quality factor $Q_m$ was written as a value found at the same time as the piezoelectric constant by the resonance-antiresonance method.

The piezoelectric constant $d_{31}$ of Comparative Example 10 was as relatively large as about 100 pm/V, but the mechanical quality factor $Q_m$ thereof was only about 30. From the results of the Bi-$L_3$ EXAFS analysis, this is considered to be caused by undesirable results: An uneven structure is formed because the amounts of Bi and Fe are large even though the Bi atom is present at the biased position in the A site of the perovskite-type structure, and so the metal oxide exhibits a nature like a relaxor which is a ferroelectric material of a heterogeneous system.

Confirmation of Even Distribution of Bi and Mn:

In order to confirm the even distribution of Bi and Mn added, electron microscope observation, X-ray analysis, EXAFS analysis, and measurements of temperature dependence of permittivity and frequency dependence of impedance were performed on Examples 1 to 6 and Comparative Examples 1 to 5. A heterogeneous phase originated from precipitation of Bi and Mn was not confirmed from the electron microscope observation. Appearance of a specific diffraction peak by the addition of Bi and Mn is not observed from the X-ray analysis. In the EXAFS analysis, the radial structure function was able to be subjected to the fitting process with a single coordinate structure model. In the temperature dependence of the permittivity, it was confirmed that the Curie temperatures $T_c$ and the phase transition temperature $T_{ot}$ systematically change, and the steepness of change of permittivity upon the phase transition is not changed by the additive. It was able to confirm that in the frequency dependent spectra of the impedance, the imaginary part and the real part of the impedance only exhibit a simple positive correlation in the range of the measuring frequencies (from 100 Hz to 10 MHz) except Comparative Example 2, and both interior of the grain and grain boundary exhibit uniform capacitance and resistance components. Regarding Comparative Example 2, the imaginary part made a curve having two maximums to the real part of the impedance, and so a result suggesting a difference in component between the interior of the grain and the grain boundary was obtained. However, since only the resistance components differ, but the capacitance components are almost the same between the interior of the grain and the grain boundary, it was able to confirm that this is not due to the precipitation of the additives.

In addition, the measurement of temperature dependence of magnetic susceptibility was performed on Examples 1 to 6 and Comparative Examples 3 and 4. It was able to confirm that all the measured results conform to the Curie-Weiss law with high reliability.

From the above, it was able to confirm that Bi and Mn added are evenly distributed in each material without precipitating or forming a heterogeneous phase.

TABLE 6

| | M1 | x | M2 | y | Bi (mol %) | Mn (mol %) | $d_{31}$ (pm/V) | Qm | $(L_4 - L_5)/L_5$ | $(L_8 - L_9)/L_9$ | $(L_1 - L_{12})/L_{12}$ | $(D_4 - D_5)/D_5$ | Ba—O distribution |
|---|---|---|---|---|---|---|---|---|---|---|---|---|---|
| Ex. 4 | — | 0 | — | 0 | 0.4 | 0.5 | 115 | 2150 | 0.11 | 0.21 | 0.35 | 0.12 | ±2% |
| Comp. Ex. 2 | — | 0 | — | 0 | 0.4 | 0 | — | — | 0.12 | 0.22 | 0.37 | 0.12 | ±3% |
| Comp. Ex. 3 | — | 0 | — | 0 | 0 | 0.3 | 100 | 1850 | — | — | — | — | ±2% |
| Comp. Ex. 4 | — | 0 | — | 0 | 0 | 0.5 | 95 | 1860 | — | — | — | — | ±2% |
| Ex. 6 | — | 0 | — | 0 | 0.25 | 0.5 | 100 | 2000 | 0.10 | 0.20 | 0.33 | 0.12 | ±2% |
| Ex. 7 | — | 0 | — | 0 | 0.1 | 0.3 | 105 | 2100 | 0.05 | 0.06 | 0.25 | 0.06 | ±2% |
| Ex. 8 | — | 0 | — | 0 | 0.5 | 1.5 | 110 | 2050 | 0.12 | 0.22 | 0.36 | 0.12 | ±3% |
| Comp. Ex. 6 | — | 0 | — | 0 | 1.0 | 0.5 | 50 | 1050 | 0.13 | 0.23 | 0.38 | 0.13 | ±4% |
| Comp. Ex. 7 | — | 0 | — | 0 | 1.0 | 2.0 | 30 | 350 | 0.13 | 0.23 | 0.38 | 0.13 | ±4% |
| Comp. Ex. 8 (mixing by agate mortar) | — | 0 | — | 0 | 0.4 | 0.5 | 20 | 120 | 0.02 | 0.01 | 0.05 | 0.02 | ±2% |
| Ex. 9 | Ca | 0.2 | Zr | 0.1 | 0.5 | 0.3 | 105 | 2000 | 0.11 | 0.21 | 0.35 | 0.12 | ±4% |
| Ex. 10 | Ca | 0.2 | Hf | 0.1 | 0.4 | 0.5 | 110 | 2050 | 0.11 | 0.22 | 0.35 | 0.12 | ±4% |
| Ex. 11 | Sr | 0.2 | Zr | 0.1 | 0.4 | 0.5 | 110 | 2100 | 0.12 | 0.21 | 0.35 | 0.12 | ±3% |
| Ex. 12 | Sr | 0.2 | Sn | 0.1 | 0.1 | 1.5 | 105 | 2050 | 0.07 | 0.05 | 0.27 | 0.05 | ±3% |
| Comp. Ex. 9 | Ca | 0.1 | — | 0 | 0 | 0.6 | 25 | 530 | — | — | — | — | ±4% |
| Comp. Ex. 10 | — | 0 | — | 0 | 15 | Fe 15 | 100 | 30 | 0.13 | 0.13 | 0.38 | 0.13 | ±7% |

Preparation and Evaluation of Layered Piezoelectric Element:

A layered piezoelectric element according to the present invention was then prepared.

Example 13

Barium titanate powder (average particle diameter: 100 nm, purity: 99.99% or more), bismuth oxide ($Bi_2O_3$) powder (average particle diameter: 1 μm, purity: 99.999% or more) and manganese dioxide ($MnO_2$) powder (average particle diameter: 1 μm, purity: 99.99% or more) were weighed so as to give the composition described in Example 4 shown in Table 6.

These powders were put into a zirconia-made pot for a planetary ball mill, zirconia-made balls (almost equally mixed mixture of balls having a diameter of 1 mm and balls having a diameter of 3 mm) which had almost the same bulk (volume) as the weighed raw material powders and ethanol in such an amount that all the raw material powders and balls are immersed were further added into the pot, a resin-made packing was put between the pot and a lid, and the lid was closed. The pot was set in the planetary ball mill, the pot and the lid were tightly held down by a presser jig accompanying the mill so as to prevent the powders and ethanol from overflowing from a gap between the pot and the lid during operation, and rotation and revolution were conducted for 12 hours at a rate of 500 revolutions per minute to sufficiently mix the raw material powders while applying strong shearing stress thereto.

After PVB (polyvinyl butyral) was added into the resultant powder mixture, and the resultant mixture was mixed, a sheet was formed by a doctor blade method to obtain a green sheet having a thickness of 50 μm. Printing was conducted with conductive paste for an internal electrode on the resultant green sheet. An alloy paste composed of 60% of Ag and 40% of Pd was used as the conductive paste. Nine green sheets on which the conductive paste was applied were laminated, and the laminate was baked for 5 hours under a condition of 120° C. to obtain a sintered body.

After the sintered body was then cut into a size of 10 mm×2.5 mm, side surfaces thereof were polished to form a pair of external electrodes (first electrode and second electrode) for alternately short-circuiting the internal electrodes by Au sputtering, thereby preparing a layered piezoelectric element as illustrated in FIG. 3B. When the internal electrodes of the resultant layered piezoelectric element were observed, the layers of the Ag—Pd alloy which was an electrode material were formed alternately with the piezoelectric materials.

Further, a sample was subjected to a polarization processing prior to the evaluation of piezoelectric properties. Specifically, the sample was heated to 100° C. in an oil bath, an electric field of 1 kV/mm was applied for 30 minutes between the first electrode and the second electrode, and the sample was cooled to room temperature while applying the electric field.

The piezoelectric property of the resultant layered piezoelectric element was evaluated. As a result, it was found that the layered piezoelectric element has sufficient insulation property and good piezoelectric property equivalent to that of the piezoelectric material of Example 4. In addition, also in a layered piezoelectric element prepared by the same step except that Ni or Cu was used for the internal electrodes and the sintering was conducted in a hypoxic atmosphere, the same piezoelectric property was able to be obtained.

Example 14

A green sheet having a thickness of 50 μm was obtained by the same method as in Example 13. Printing was conducted with conductive paste for an internal electrode on the resultant green sheet. Ni paste was used as the conductive paste. Nine green sheets on which the conductive paste was applied were laminated, and that laminate was thermally press-bonded.

The thermally press-bonded laminate was baked in a tubular furnace. The baking was conducted in the air up to 300° C. to conduct debinding, the atmosphere was changed over to a reducing atmosphere ($H_2:N_2=2:98$, oxygen concentration: $2\times10^{-6}$ Pa) to hold the laminate for 5 hours at 1,200° C. In the cooling process, the oxygen concentration was changed over to 30 Pa from 1,000° C. or less to cool the laminate to room temperature.

After the thus-obtained sintered body was cut into a size of 10 mm×2.5 mm, side surfaces thereof were polished to form a pair of external electrodes (first electrode and second electrode) for alternately short-circuiting the internal electrodes by Au sputtering, thereby preparing a layered piezoelectric element as illustrated in FIG. 3B. When the internal electrodes of the resultant layered piezoelectric element were observed, the layers of Ni which was an electrode material were formed alternately with the piezoelectric material layers.

An electric field of 1 kV/mm was then applied for 30 minutes to the resultant layered piezoelectric element in an oil bath kept to 100° C. to conduct a polarization processing. The piezoelectric property of the resultant layered piezoelectric element was evaluated. As a result, the layered piezoelectric element had sufficient insulation property, and so good piezoelectric property comparable to that of the piezoelectric element of Example 4 was able to be attained.

Example 15

The piezoelectric element of Example 4 was used to prepare a liquid discharge head as illustrated in FIG. 4. Discharge of an ink which followed an input electric signal was confirmed.

Example 16

The liquid discharge head of Example 15 was used to prepare a liquid discharge apparatus as illustrated in FIG. 5. Discharge of an ink which followed an input electric signal was confirmed on a recording medium (recording paper).

Example 17

The piezoelectric element of Example 4 was used to prepare an ultrasonic wave motor as illustrated in FIG. 7A. Chipping of an outer peripheral portion upon machining was inhibited, and the rotation of the motor according to the application of an alternating voltage was confirmed.

Example 18

The ultrasonic wave motor of Example 17 was used to prepare an optical instrument as illustrated in FIG. 8. An autofocusing operation according to the application of an alternating voltage was confirmed.

Example 19

The piezoelectric element of Example 4 was used to prepare a dust removing apparatus including a vibrating body as illustrated in FIG. 9. When plastic beads were spread and an alternating voltage was applied, a good dust removal rate was confirmed.

Example 20

The dust removing apparatus of Example 19 was used to prepare an imaging apparatus as illustrated in FIG. 11. When the imaging apparatus was operated, dust on the surface of an imaging unit was well removed, and so an image free of a defect caused by the dust was obtained.

Example 21

The layered piezoelectric element of Example 13 was used to prepare a liquid discharge head as illustrated in FIG. 4. Discharge of an ink which followed an input electric signal was confirmed.

Example 22

The liquid discharge head of Example 21 was used to prepare a liquid discharge apparatus as illustrated in FIG. 5.

Discharge of an ink which followed an input electric signal was confirmed on a recording medium (recording paper).

Example 23

The layered piezoelectric element of Example 13 was used to prepare an ultrasonic wave motor as illustrated in FIG. 7B. The rotation of the motor according to the application of an alternating voltage was confirmed.

Example 24

The ultrasonic wave motor of Example 23 was used to prepare such an optical instrument as illustrated in FIG. 8. An autofocusing operation according to the application of an alternating voltage was confirmed.

Example 25

The layered piezoelectric element of Example 13 was used to prepare a dust removing apparatus including a vibrating body as illustrated in FIG. 9. When plastic beads were spread and an alternating voltage was applied, a good dust removal rate was confirmed.

Example 26

The dust removing apparatus of Example 25 was used to prepare an imaging apparatus as illustrated in FIG. 11. When the imaging apparatus was operated, dust on the surface of an imaging unit was well removed, and so an image free of a defect caused by the dust was obtained.

Example 27

The layered piezoelectric element of Example 13 was used to prepare an electronic device as illustrated in FIG. 13. A speaker operation according to the application of an alternating voltage was confirmed.

The piezoelectric material according to the present invention develops good piezoelectric properties even at a high environmental temperature. In addition, since the piezoelectric material according to the present invention does not contain lead, the burden on the environment is small. Accordingly, the piezoelectric material according to the present invention can be utilized also for instruments in which a large amount of piezoelectric materials is used, such as a liquid discharge head, a vibration wave motor and a dust removing apparatus, without causing any problem.

The present invention provides a piezoelectric material whose environmental burden is small because no lead is contained and which has both good piezoelectric property and good machinability (which suppressed occurrence of cracking and chipping upon machining). Accordingly, the piezoelectric material according to the present invention can be utilized also for instruments in which a large amount of piezoelectric materials is used, such as a liquid discharge head, a liquid discharge apparatus, a vibration wave motor and a dust removing apparatus, without causing any problem.

According to the present invention, there can be provided a piezoelectric material whose environmental burden is small because no lead is used and which attains both high piezoelectric constant and high mechanical quality factor in combination.

According to the present invention, there can also be provided a piezoelectric element, a liquid discharge head, a liquid discharge apparatus, a vibration wave motor, an optical instrument, a vibration apparatus, a dust removing apparatus, an imaging apparatus and an electronic device using the above-described piezoelectric material.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2016-127872, filed Jun. 28, 2016, and No. 2017-114336, filed Jun. 9, 2017, which are hereby incorporated by reference herein in their entirety.

What is claimed is:

1. A piezoelectric element comprising a first electrode, a second electrode, and a piezoelectric material portion,
   wherein the piezoelectric element has a layered structure in which the piezoelectric material portion and the electrode are alternately laminated,
   wherein a piezoelectric material constitutes the piezoelectric material portion, the piezoelectric material comprising:
   a perovskite-type metal oxide represented by general formula (1);
   Bi; and
   Mn,
   wherein a content of the Bi is 0.1 mol % to 0.5 mol % with respect to 1 mol of the metal oxide,
   wherein a content of the Mn is 0.3 mol % to 1.5 mol % with respect to 1 mol of the metal oxide, and
   wherein the piezoelectric material satisfies $(L_4-L_5)/L_5 \geq 0.05$ and $(L_8-L_9)/L_9 \geq 0.05$ when the lengths of twelve Bi—O bonds with Bi that is located at a 12-fold site with respect to O in a perovskite-type unit cell as a starting point are taken to be $L_1$ to $L_{12}$ in length order:

$$(Ba_{1-x}M1_x)(Ti_{1-y}M2_y)O_3 \qquad (1),$$

wherein $0 \leq x \leq 0.2$, $0 \leq y \leq 0.1$, and M1 and M2 are mutually different metal elements that have a total valence of +6 and are selected from elements other than Ba, Ti, Bi, and Mn.

2. A vibration wave motor comprising a vibrating body in which a piezoelectric element is arranged and a moving body, which is in contact with the vibrating body,
   wherein the piezoelectric element has a first electrode, a second electrode, and a piezoelectric material comprising:
   a perovskite-type metal oxide represented by general formula (1);
   Bi; and
   Mn,
   wherein a content of the Bi is 0.1 mol % to 0.5 mol % with respect to 1 mol of the metal oxide,
   wherein a content of the Mn is 0.3 mol % to 1.5 mol % with respect to 1 mol of the metal oxide, and
   wherein the piezoelectric material satisfies $(L_4-L_5)/L_5 \geq 0.05$ and $(L_8-L_9)/L_9 \geq 0.05$ when the lengths of twelve Bi—O bonds with Bi that is located at a 12-fold site with respect to O in a perovskite-type unit cell as a starting point are taken to be $L_1$ to $L_{12}$ in length order:

$$(Ba_{1-x}M1_x)(Ti_{1-y}M2_y)O_3 \qquad (1),$$

wherein $0 \leq x \leq 0.2$, $0 \leq y \leq 0.1$, and M1 and M2 are mutually different metal elements that have a total valence of +6 and are selected from elements other than Ba, Ti, Bi, and Mn.

3. An optical instrument comprising a driving portion, wherein the driving portion includes the vibration wave motor according to claim 2.

4. A vibration apparatus comprising a vibrating body including a vibrating plate in which a piezoelectric element is arranged,
wherein the piezoelectric element has a first electrode, a second electrode, and a piezoelectric material comprising:
a perovskite-type metal oxide represented by general formula (1);
Bi; and
Mn,
wherein a content of the Bi is 0.1 mol % to 0.5 mol % with respect to 1 mol of the metal oxide,
wherein a content of the Mn is 0.3 mol % to 1.5 mol % with respect to 1 mol of the metal oxide, and
wherein the piezoelectric material satisfies $(L_4-L_5)/L_5 \geq 0.05$ and $(L_8-L_9)/L_9 \geq 0.05$ when the lengths of twelve Bi—O bonds with Bi that is located at a 12-fold site with respect to O in a perovskite-type unit cell as a starting point are taken to be $L_1$ to $L_{12}$ in length order:

$$(Ba_{1-x}M1_x)(Ti_{1-y}M2_y)O_3 \qquad (1),$$

wherein $0 \leq x \leq 0.2$, $0 \leq y \leq 0.1$, and M1 and M2 are mutually different metal elements that have a total valence of +6 and are selected from elements other than Ba, Ti, Bi, and Mn.

5. A dust removing apparatus comprising a vibrating portion, wherein the vibrating portion includes the vibration apparatus according to claim 4.

6. An imaging apparatus comprising an imaging unit including the dust removing apparatus according to claim 5 and an imaging element unit for receiving light, herein a vibrating plate of the dust removing apparatus is arranged on the side of a light receiving surface of the imaging element unit.

7. The vibration apparatus according to claim 4, wherein the $L_1$ and the $L_{12}$ satisfy $(L_1-L_{12})/L_{12} \geq 0.25$.

8. The vibration apparatus according to claim 4, wherein a crystal structure of the piezoelectric material is tetragonal, and wherein the Bi which is located at the 12-fold site in the perovskite-type unit cell is shifted in a c-axis direction from a symmetric position of the unit cell.

9. The vibration apparatus according to claim 4, wherein the piezoelectric material satisfies $(D_4-D_5)/D_5 > 0.05$ when the lengths of eight Bi—Ti bonds with Bi that is located at an 8-fold site with respect to Ti in the perovskite-type unit cell as a starting point are taken to be $D_1$ to $D_8$ in length order.

10. The vibration apparatus according to claim 4, wherein a distribution of the lengths of Ba—O bonds with Ba that is located at a 12-fold site with respect to O in the perovskite-type unit cell as a starting point is within less than ±5%.

11. The vibration apparatus according to claim 4, wherein the M1 is at least one of Sr and Ca.

12. The vibration apparatus according to claim 4, wherein the M2 is at least one of Hf, Sn and Zr.

13. A liquid discharge head comprising a liquid chamber including a vibrating portion in which the vibration apparatus according to claim 4 is arranged and a discharge port communicating with the liquid chamber.

14. A liquid discharge apparatus comprising a setting portion on which a transferring member is set and the liquid discharge head according to claim 13.

15. A piezoelectric sound component comprising the vibration apparatus according to claim 4.

16. An electronic device comprising the vibration apparatus according to claim 4.

* * * * *